(12) United States Patent
Abe et al.

(10) Patent No.: US 8,158,981 B2
(45) Date of Patent: Apr. 17, 2012

(54) RADIATION-SENSITIVE COMPOSITION, METHOD OF FORMING SILICA-BASED COATING FILM, SILICA-BASED COATING FILM, APPARATUS AND MEMBER HAVING SILICA-BASED COATING FILM AND PHOTOSENSITIZING AGENT FOR INSULATING FILM

(75) Inventors: Kouichi Abe, Hitachi (JP); Kei Kasuya, Hitachi (JP); Tetsushi Maruyama, Hitachi (JP); Yousuke Aoki, Hitachi (JP); Kyouko Kojima, Kokubunji (JP); Daisuke Ryuzaki, Kokubunji (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 72 days.

(21) Appl. No.: 12/442,789

(22) PCT Filed: Sep. 19, 2007

(86) PCT No.: PCT/JP2007/068143
§ 371 (c)(1),
(2), (4) Date: Nov. 20, 2009

(87) PCT Pub. No.: WO2008/038550
PCT Pub. Date: Apr. 3, 2008

(65) Prior Publication Data
US 2010/0102321 A1    Apr. 29, 2010

(30) Foreign Application Priority Data

Sep. 25, 2006  (JP) .................... 2006-258670
Oct. 2, 2006   (JP) .................... 2006-270569
Jun. 25, 2007  (JP) .................... 2007-166791

(51) Int. Cl.
*H01L 33/00*   (2010.01)
*H01L 29/92*   (2006.01)
*G03C 1/00*    (2006.01)
*G03F 7/00*    (2006.01)
*B32B 3/10*    (2006.01)

(52) U.S. Cl. ............... 257/59; 430/270.1; 430/281.1; 430/326; 428/195.1; 534/885; 257/532; 257/E33.532; 257/E29.342

(58) Field of Classification Search ............ 257/59, 257/532, E33.53, E29.342; 430/270.1, 281.1, 430/326; 428/195.1; 534/885
See application file for complete search history.

(56) References Cited

U.S. PATENT DOCUMENTS

| | | | | |
|---|---|---|---|---|
| 3,647,443 A * | 3/1972 | Rauner et al. | ................ | 430/165 |
| 4,496,647 A * | 1/1985 | Kawabe et al. | ............... | 430/303 |
| 4,642,283 A * | 2/1987 | Takahashi et al. | ............ | 430/303 |
| 5,215,857 A * | 6/1993 | Hosaka et al. | ................ | 430/191 |
| 5,254,432 A * | 10/1993 | Aoai | ............................ | 430/192 |
| 5,633,111 A * | 5/1997 | Yoshimoto et al. | ........... | 430/165 |
| 5,672,459 A * | 9/1997 | Inomata et al. | ............... | 430/191 |
| 6,140,026 A * | 10/2000 | Blakeney et al. | ............. | 430/326 |
| 6,984,476 B2 * | 1/2006 | Kobayashi et al. | ................ | 430/7 |
| 7,297,464 B2 | 11/2007 | Sakurai et al. | | |
| 7,736,837 B2 * | 6/2010 | Abdallah et al. | ........... | 430/272.1 |
| 2001/0038967 A1 | 11/2001 | Mizutani et al. | | |
| 2003/0120018 A1 * | 6/2003 | Baldwin et al. | ................ | 528/39 |
| 2003/0193624 A1 * | 10/2003 | Kobayashi et al. | ............. | 349/42 |
| 2004/0143082 A1 | 7/2004 | Iwasawa et al. | | |
| 2004/0197699 A1 * | 10/2004 | Nakayama et al. | ........ | 430/270.1 |
| 2005/0239953 A1 | 10/2005 | Sakurai et al. | | |
| 2005/0277058 A1 * | 12/2005 | Iwabuchi et al. | .......... | 430/270.1 |
| 2005/0277756 A1 * | 12/2005 | Iwabuchi et al. | ............... | 528/38 |
| 2006/0115766 A1 | 6/2006 | Suwa et al. | | |
| 2006/0246377 A1 * | 11/2006 | Yamato et al. | ................ | 430/311 |
| 2009/0220897 A1 | 9/2009 | Sakurai et al. | | |

FOREIGN PATENT DOCUMENTS

| | | |
|---|---|---|
| CN | 1698017 A | 11/2005 |
| CN | 1782878 A | 6/2006 |
| EP | 1662322 | 5/2006 |
| JP | 2000-181069 | 6/2000 |
| JP | 2001-166485 | 6/2001 |
| JP | 2002-278073 | 9/2002 |
| JP | 2003-020335 | 1/2003 |
| JP | 2004-107562 | 4/2004 |
| JP | 2006-178436 | 7/2006 |
| WO | WO 03/029899 A1 | 4/2003 |
| WO | WO 2005/0036270 | 4/2005 |

OTHER PUBLICATIONS

International Preliminary Report on Patentability and Written Opinion; International Application No. PCT/JP2007/068143; International Filing Date: Sep. 19, 2007.
"Dictionary of Physics and Chemistry", Iwanami Shoten, p. 1262.
Chinese Official Action issued on May 25, 2011, for CN Application No. 200780035435.8.

* cited by examiner

*Primary Examiner* — Robert Loewe
(74) *Attorney, Agent, or Firm* — Antonelli, Terry, Stout & Kraus, LLP.

(57) ABSTRACT

The present invention provides a photosensitive resin composition comprising a component (a): a siloxane resin obtained by hydrolyzing and condensing a silane compound comprising a compound represented by the general formula (1) shown below, a component (b): a solvent dissolving the component (a) therein, and a component (c): a quinonediazide sulfonic acid ester.

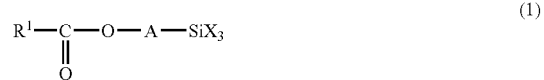

wherein $R^1$ represents an organic group; A represents a divalent organic group; and X represents a hydrolyzable group, wherein plural X groups in one molecule may be the same or different.

21 Claims, 16 Drawing Sheets

Fig.7

| | RAW MATERIAL ALCOHOL | RAW MATERIAL DNQ | SENSITIVITY (mJ/cm²) | SCUM | SOLVENT RESISTANCE (%) | HEAT RESISTANCE (%) | MINIMUM TRANSMITTANCE (%) | FLATNESS | HOLE FORMATION | RELATIVE PERMITTIVITY |
|---|---|---|---|---|---|---|---|---|---|---|
| (A1) | TEPG | 1DNQ5 | 30 | ABSENT | 101 | 0.5 | 97 | 0.1 | OPEN | 3.2 |
| (A2) | 2EP | 1DNQ5 | 100 | ABSENT | 102 | 0.6 | 98 | 0.2 | OPEN | 3.3 |
| (A3) | DEG | 1DNQ5 | 70 | ABSENT | 101 | 0.8 | 97 | 0.1 | OPEN | 3.2 |
| (A4) | TREG | 1DNQ5 | 60 | ABSENT | 101 | 0.7 | 96 | 0.1 | OPEN | 3.2 |
| (A5) | TEEG | 1DNQ5 | 60 | ABSENT | 101 | 0.7 | 96 | 0.1 | OPEN | 3.2 |
| (A6) | PEEG | 1DNQ5 | 60 | ABSENT | 101 | 0.8 | 96 | 0.1 | OPEN | 3.2 |
| (A7) | PEG400 | 1DNQ5 | 120 | ABSENT | 102 | 0.9 | 95 | 0.1 | OPEN | 3.3 |
| (A8) | DPG | 1DNQ5 | 30 | ABSENT | 101 | 0.5 | 98 | 0.1 | OPEN | 3.2 |
| (A3) | TRPG | 1DNQ5 | 30 | ABSENT | 101 | 0.4 | 98 | 0.1 | OPEN | 3.2 |
| (A9) | TEPG | 1DNQ5 | 30 | ABSENT | 101 | 0.4 | 98 | 0.1 | OPEN | 3.2 |
| (A10) | PPG425 | 1DNQ5 | 70 | ABSENT | 102 | 0.6 | 96 | 0.1 | OPEN | 3.2 |
| (A11) | PPG725 | 1DNQ5 | 100 | ABSENT | 103 | 0.7 | 96 | 0.2 | OPEN | 3.2 |
| (A12) | PPG1000 | 1DNQ5 | 100 | ABSENT | 102 | 0.8 | 95 | 0.2 | OPEN | 3.2 |
| (A13) | CyD | 1DNQ5 | 120 | ABSENT | 104 | 0.8 | 97 | 0.3 | OPEN | 3.3 |
| (A14) | PD | 1DNQ5 | 120 | ABSENT | 103 | 0.8 | 98 | 0.3 | OPEN | 3.3 |
| (A15) | NPG | 1DNQ5 | 50 | ABSENT | 101 | 0.5 | 98 | 0.1 | OPEN | 3.3 |
| (A16) | TMM | 1DNQ5 | 60 | ABSENT | 102 | 0.8 | 97 | 0.2 | OPEN | 3.3 |
| (A17) | TMP | 1DNQ5 | 60 | ABSENT | 102 | 0.8 | 97 | 0.2 | OPEN | 3.3 |

Fig.8

| | RAW MATERIAL ALCOHOL | RAW MATERIAL DNQ | SENSITIVITY (mJ/cm²) | SCUM | SOLVENT RESISTANCE (%) | HEAT RESISTANCE (%) | MINIMUM TRANSMITTANCE (%) | FLATNESS | HOLE FORMATION | RELATIVE PERMITTIVITY |
|---|---|---|---|---|---|---|---|---|---|---|
| (A18) | PET | 1DNQ5 | 30 | ABSENT | 101 | 0.5 | 97 | 0.1 | OPEN | 3.2 |
| (A19) | DPET | 1DNQ5 | 100 | ABSENT | 102 | 0.6 | 98 | 0.2 | OPEN | 3.3 |
| (A20) | EGG | 1DNQ5 | 70 | ABSENT | 101 | 0.8 | 97 | 0.1 | OPEN | 3.2 |
| (A21) | PGG | 1DNQ5 | 60 | ABSENT | 101 | 0.7 | 96 | 0.1 | OPEN | 3.2 |
| (A22) | CyDM | 1DNQ5 | 50 | ABSENT | 101 | 0.6 | 97 | 0.1 | OPEN | 3.2 |
| COMPARATIVE EXAMPLE (A25) | — | — | 170 | ABSENT | 104 | 12 | 60 | 0.1 | OPEN | 3.9 |
| (A31) | TEPG | 1DNQ4 | 150 | ABSENT | 102 | 0.6 | 95 | 0.1 | OPEN | 3.4 |
| (A32) | 2EP | 1DNQ4 | 130 | ABSENT | 102 | 0.6 | 95 | 0.1 | OPEN | 3.4 |
| (A33) | DEG | 1DNQ4 | 150 | ABSENT | 103 | 0.7 | 94 | 0.1 | OPEN | 3.5 |
| (A34) | TREG | 1DNQ4 | 160 | ABSENT | 104 | 0.7 | 93 | 0.2 | OPEN | 3.5 |
| (A35) | TEEG | 1DNQ4 | 150 | ABSENT | 103 | 0.8 | 95 | 0.2 | OPEN | 3.4 |
| (A36) | PEEG | 1DNQ4 | 150 | ABSENT | 106 | 0.8 | 95 | 0.3 | OPEN | 3.5 |
| (A37) | PEG400 | 1DNQ4 | 150 | ABSENT | 106 | 0.8 | 96 | 0.3 | OPEN | 3.5 |
| (A38) | DPG | 1DNQ4 | 100 | ABSENT | 103 | 0.5 | 96 | 0.1 | OPEN | 3.5 |
| (A39) | TRPG | 1DNQ4 | 100 | ABSENT | 103 | 0.8 | 96 | 0.2 | OPEN | 3.5 |
| (A40) | TEPG | 1DNQ4 | 100 | ABSENT | 103 | 0.8 | 96 | 0.2 | OPEN | 3.6 |

Fig.9

| | RAW MATERIAL ALCOHOL | RAW MATERIAL DNQ | SENSITIVITY (mJ/cm$^2$) | SCUM | SOLVENT RESISTANCE (%) | HEAT RESISTANCE (%) | MINIMUM TRANSMITTANCE (%) | FLATNESS | HOLE FORMATION | RELATIVE PERMITTIVITY |
|---|---|---|---|---|---|---|---|---|---|---|
| (A41) | THFA | 1DNQ5 | 90 | ABSENT | 102 | 0.7 | 97 | 0.1 | OPEN | 3.3 |
| (A42) | HD | 1DNQ5 | 110 | ABSENT | 102 | 0.7 | 96 | 0.2 | OPEN | 3.3 |
| (A43) | HpD | 1DNQ5 | 110 | ABSENT | 102 | 0.8 | 96 | 0.1 | OPEN | 3.2 |
| (A44) | OD | 1DNQ5 | 120 | ABSENT | 101 | 0.7 | 96 | 0.1 | OPEN | 3.2 |
| (A45) | ND | 1DNQ5 | 120 | ABSENT | 101 | 0.7 | 96 | 0.1 | OPEN | 3.2 |
| (A46) | XyD | 1DNQ5 | 100 | ABSENT | 102 | 0.8 | 95 | 0.1 | OPEN | 3.2 |
| (A47) | DMPD | 1DNQ5 | 120 | ABSENT | 102 | 0.9 | 95 | 0.1 | OPEN | 3.3 |
| (A48) | TMPD | 1DNQ5 | 110 | ABSENT | 101 | 0.5 | 96 | 0.1 | OPEN | 3.2 |
| (A43) | BDTU | 1DNQ5 | 90 | ABSENT | 101 | 0.5 | 97 | 0.1 | OPEN | 3.2 |
| (A49) | DIAPP | 1DNQ5 | 100 | ABSENT | 102 | 0.6 | 96 | 0.1 | OPEN | 3.2 |
| (A50) | DIBPP | 1DNQ5 | 100 | ABSENT | 102 | 0.6 | 96 | 0.1 | OPEN | 3.2 |
| (A51) | DOPP | 1DNQ5 | 100 | ABSENT | 103 | 0.7 | 96 | 0.2 | OPEN | 3.2 |
| (A52) | EMPP | 1DNQ5 | 110 | ABSENT | 103 | 0.8 | 96 | 0.2 | OPEN | 3.2 |
| (A53) | MPPD | 1DNQ5 | 120 | ABSENT | 103 | 0.8 | 96 | 0.3 | OPEN | 3.3 |

FT-IR SPECTRUM OF TEPG-Dm

FT-IR SPECTRUM OF TPG-Dm

FT-IR SPECTRUM OF DPG-Dm

¹H-NMR SPECTRUM OF TEPG-Dm $^1$H-NMR SPECTRUM OF TPG-Dm

1H-NMR SPECTRUM OF TPG

CHEMICAL SHIFT (ppm)

$^1$H-NMR SPECTRUM OF DPG-D

RADIATION-SENSITIVE COMPOSITION, METHOD OF FORMING SILICA-BASED COATING FILM, SILICA-BASED COATING FILM, APPARATUS AND MEMBER HAVING SILICA-BASED COATING FILM AND PHOTOSENSITIZING AGENT FOR INSULATING FILM

TECHNICAL FIELD

The present invention relates to: a radiation-sensitive composition; a method for forming a silica-based coating; a silica-based coating; a semiconductor device, an image display, a member for an electronic device, and a memory capacitor comprising a silica-based coating; and a photosensitizer for an insulating film.

BACKGROUND ART

Interlayer insulating films have been used in the production of image displays (e.g., liquid-crystal displays) or semiconductor devices. In general, interlayer insulating films have a pattern formed by etching, via a photoresist, a film formed by deposition from a vapor phase or by application. For forming a fine pattern, vapor phase etching has usually been used. However, the vapor phase etching presented the problems of high apparatus cost and slow performance.

Thus, photosensitive materials for interlayer insulating films have been developed for the purpose of cost reduction. Particularly, in liquid-crystal displays, interlayer insulating films used for insulation between pixel electrodes and gate/drain wiring and for device flattening require forming a contact hole therein. Therefore, photosensitive materials for interlayer insulating films have been demanded, which have positive-type photosensitive properties. The interlayer insulating films in liquid-crystal displays are further demanded to have transparency. Additionally, when a residual patterned film is used as an interlayer insulating film, the film is demanded to have small permittivity.

In response to these demands, methods disclosed in, for example, Patent Documents 1 and 2, have been proposed. Patent Document 1 discloses a method for forming an interlayer insulating film, comprising the steps of: forming an applied coating of a photosensitive polysilazane composition comprising polysilazane and a photoacid generator; irradiating the applied film with light according to a pattern; and removing, by dissolution, the irradiated portion in the applied film. Additionally, Patent Document 2 discloses an interlayer insulating film which is formed from a composition comprising: a siloxane resin; and a compound that generates an acid or base upon exposure to radiation.

Here, the terms "radiation sensitivity" and "photosensitivity" are defined. According to "Non-Patent Document 1", the term "radiation" is defined as "every electromagnetic wave and particle beam" in the broad sense and encompasses light. Thus, although both the terms "radiation sensitivity" and "photosensitivity" are described in the present specification, the former is used in the broader sense. When light is used as a source, these terms are synonymous with each other.

[Patent Document 1] Japanese Patent Laid-Open No. 2000-181069
[Patent Document 2] Japanese Patent Laid-Open No. 2004-107562
[Non-Patent Document 1] Dictionary of Physics and Chemistry (Rikagaku Jiten in Japanese) 3rd ed., Iwanami Shoten, Publishers, p. 1262

DISCLOSURE OF THE INVENTION

Problems to be Solved by the Invention

However, when a film described in Patent Document 1 is used as an interlayer insulating film, polysilazane must be hydrolyzed (hydrolyzed according to the reaction formula (53) shown below) such that the polysilazane structure is converted to a polysiloxane structure. In this case, the film presented the problem that the hydrolysis fails to fully proceed when the film has an insufficient water content. Furthermore, the film presented problems such as corrosion of production apparatuses because the polysilazane hydrolysis generates highly volatile ammonia, as can be seen from the reaction formula (53) shown below.

[Chemical Formula 1]

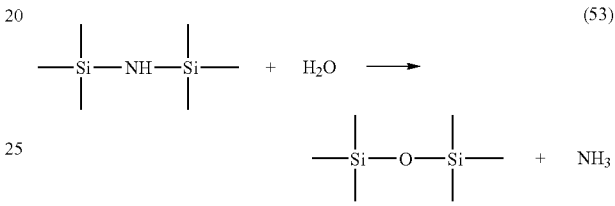

Additionally, an interlayer insulating film described in Patent Document 2 which is formed from a composition comprising: a siloxane resin; and a compound that generates an acid or base upon exposure to radiation presented the problems of insufficient heat resistance and resolution.

Thus, an object of the present invention is to provide: a radiation-sensitive composition which permits relatively easy formation of a silica-based coating that can be used as an interlayer insulating film and allows the silica-based coating formed therefrom to be excellent in heat resistance and resolution; and a method for forming a silica-based coating using the radiation-sensitive composition. A further object of the present invention is to provide: a silica-based coating formed by the method; and a semiconductor device, an image display, and a member for an electronic device comprising the silica-based coating.

Means for Solving the Problems

The present invention provides a radiation-sensitive composition comprising a component (a): a siloxane resin obtained by hydrolyzing and condensing a silane compound comprising a compound represented by the general formula (1) shown below, a component (b): a solvent dissolving the component (a) therein, and a component (c): a quinonediazide sulfonic acid ester;

[Chemical Formula 2]

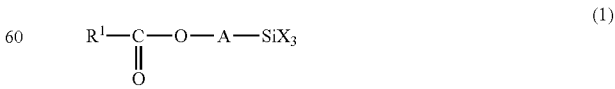

wherein $R^1$ represents an organic group; A represents a divalent organic group; and X represents a hydrolyzable group, wherein plural X groups in one molecule may be the same or different.

This radiation-sensitive composition employs a siloxane resin and can thus omit the step of converting a polysilazane structure to a polysiloxane structure, which is essential for the method described in Patent Document 1. Therefore, a silica-based coating can be formed therefrom relatively easily.

Furthermore, the silica-based coating formed from this radiation-sensitive composition is excellent in heat resistance and resolution. The reason why the silica-based coating formed from the radiation-sensitive composition of the present invention can offer such effects is not necessarily certain. However, the present inventors have concluded as follows.

Specifically, the radiation-sensitive composition of the present invention employs a siloxane resin which is excellent in heat resistance. Therefore, the silica-based coating formed therefrom is probably also excellent in heat resistance. Furthermore, the compound represented by the general formula (1) has an acyloxy group which is highly soluble in aqueous alkali solutions. Therefore, a siloxane resin obtained by hydrolyzing the compound is also highly soluble in aqueous alkali solutions. Accordingly, in silica-based coating formation, a light-exposed portion is easily dissolved in an aqueous alkali solution during development after light exposure. Therefore, solubility in aqueous alkali solutions largely differ between the unexposed and light-exposed portions, probably leading to improved resolution.

In the radiation-sensitive composition of the present invention, it is preferred that the silane compound should further comprise a compound represented by the general formula (2) shown below. As a result, a silica-based coating formed from this radiation-sensitive composition is further improved in heat resistance;

[Chemical Formula 3]

$$R^2SiX_3 \qquad (2)$$

wherein $R^2$ represents an organic group; and X represents a hydrolyzable group, wherein plural X groups in one molecule may be the same or different.

In the radiation-sensitive composition of the present invention, it is preferred that the radiation-sensitive composition should further comprise a component (d): a siloxane resin obtained by hydrolyzing and condensing a compound represented by the general formula (3) shown below. As a result, a silica-based coating formed from this radiation-sensitive composition is improved in strength;

[Chemical Formula 4]

$$R^3{}_nSiX_{4-n} \qquad (3)$$

wherein $R^3$ represents a group comprising an atom bonded to the Si atom bonded to X, an H atom, an F atom, or an organic group having 1 to 20 carbon atoms, the atom bonded to the Si atom being selected from the group consisting of B, N, Al, P, Si, Ge, and Ti atoms; X represents a hydrolyzable group; and n represents an integer of 0 to 2, wherein plural X groups in one molecule may be the same or different, and plural $R^3$ moieties in one molecule may be the same or different when n is 2. In this context, the group selected as $R^3$ is bonded to the Si atom without being easily dissociated during the hydrolytic condensation reaction.

It is preferred that the component (b) should comprise at least one solvent selected from the group consisting of ether acetate solvent, ether solvent, ester solvent, alcohol solvent, and ketone solvent. As a result, when this radiation-sensitive composition is applied onto a substrate, uneven application or repellency to the composition can be reduced.

It is preferred that the component (c) should be an ester of quinonediazide sulfonic acid and a monohydric or polyhydric alcohol. It is preferred that the polyhydric alcohol should be an alcohol selected from the group consisting of ethylene glycol, propylene glycol, and polymers thereof having a degree of polymerization of 2 to 10. As a result, a silica-based coating formed from this radiation-sensitive composition is improved in transparency.

It is also preferred that the component (c) should be 1,2-naphthoquinonediazide sulfonic acid ester or should be a sulfonic acid ester of a functional group and a monohydric or polyhydric alcohol having 3 to 20 carbon atoms, the functional group being selected from among radiation-sensitive functional groups represented by the general formula (51) shown below. As a result, a silica-based coating formed from this radiation-sensitive composition is further improved in resolution.

[Chemical Formula 5]

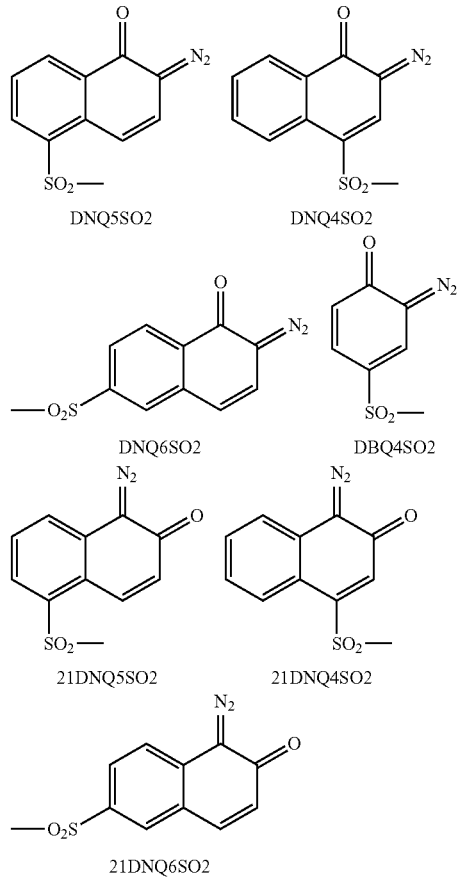

General Formula (51)

It is preferred that the monohydric or polyhydric alcohol should be a glycol compound having 3 to 20 carbon atoms or should be a compound selected from among compounds represented by the general formula (52) shown below. Alternatively, the monohydric or polyhydric alcohol may be an alcohol selected from the group consisting of ethylene glycol, propylene glycol, and polymers thereof having a degree of polymerization of 2 to 10. As a result, a silica-based coating formed from this radiation-sensitive composition is further improved in resolution.

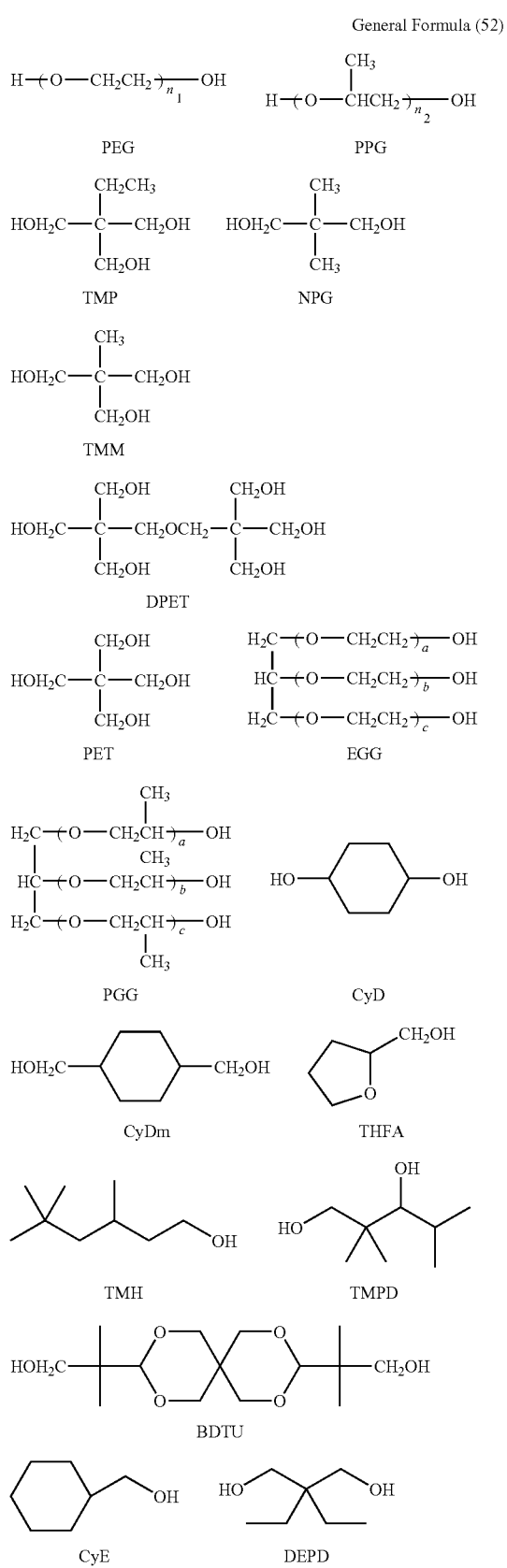

Moreover, the present invention provides the following radiation-sensitive compositions of [12] to [16].

[12] A radiation-sensitive composition comprising a quinonediazide sulfonic acid ester compound, a siloxane compound, and a solvent, wherein the quinonediazide sulfonic acid ester compound is a sulfonic acid ester of a functional group and a monohydric or polyhydric alcohol having 3 to 20 carbon atoms, the functional group being selected from among radiation-sensitive functional groups represented by the general formula (51), and the content of the siloxane compound is 50% by mass or higher with respect to the total amount of the components except for the solvent.

[13] The radiation-sensitive composition according to [12], wherein the monohydric or polyhydric alcohol is a glycol compound having 3 to 20 carbon atoms.

[14] The radiation-sensitive composition according to [12], wherein the monohydric or polyhydric alcohol is a compound selected from among compounds represented by the general formula (52).

[15] The radiation-sensitive composition according to [12], wherein the polyhydric alcohol is an alcohol selected from the group consisting of ethylene glycol, propylene glycol, and polymers thereof having a degree of polymerization of 2 to 10.

[16] The radiation-sensitive composition according to [12], wherein the siloxane compound comprises at least one selected from the group consisting of a silane compound represented by the general formula (21) shown below and hydrolytic condensates thereof

$$(R^5)_x Si(Y)_{4-x} \quad (21)$$

wherein $R^5$ represents a nonhydrolyzable organic group having 1 to 10 carbon atoms; Y represents a hydrolyzable group; and x represents an integer of 1 to 4.

The present invention provides a method for forming a silica-based coating, comprising: an application step in which the radiation-sensitive composition is applied onto a substrate and dried to obtain an applied coating; a first light exposure step in which a predetermined portion in the applied film is exposed to light; a removal step in which the light-exposed predetermined portion in the applied film is removed; and a heating step in which the applied film from which the predetermined portion has been removed is heated. Such a formation method employs the radiation-sensitive composition and can therefore give a silica-based coating excellent in heat resistance and resolution.

Moreover, the present invention provides a method for forming a silica-based coating, comprising: an application step in which the radiation-sensitive composition is applied onto a substrate and dried to obtain an applied coating; a first light exposure step in which a predetermined portion in the applied film is exposed to light; a removal step in which the light-exposed predetermined portion in the applied film is removed; a second light exposure step in which the applied film from which the predetermined portion has been removed is exposed to light; and a heating step in which the applied film from which the predetermined portion has been removed is heated. Such a formation method employs the radiation-sensitive composition and can therefore give a silica-based coating excellent in heat resistance and resolution. Furthermore, the component (c) which has optical absorption in the visible region is decomposed in the second light exposure step to form a compound having sufficiently small optical absorption in the visible region. Accordingly, the obtained silica-based coating is improved in transparency.

A silica-based coating of the present invention is obtained by the method for forming a silica-based coating. This silica-based coating employs the radiation-sensitive composition and is therefore excellent in heat resistance and resolution.

The present invention provides a semiconductor device, an image display, and a member for an electronic device comprising: a substrate; and a silica-based coating formed on the substrate by the formation method. The semiconductor device, the image display, and the member for an electronic device comprise, as an interlayer insulating film, a silica-based coating formed from the radiation-sensitive composition and therefore exhibit excellent effects.

Moreover, the present invention provides the following image displays of [23] to [31], semiconductor devices of [32] and [33], memory capacitors of [34] to [36], and photosensitizers for an insulating film of [37] and [38].

[23] An image display comprising: TFT having a gate insulating film; an interlayer insulating film; and a passivation film, wherein at least one of the gate insulating film, the interlayer insulating film, and the passivation film is a silica-based coating (organic insulating film) which is obtained by: forming a coating by the application of a radiation-sensitive composition comprising a quinonediazide sulfonic acid ester compound, a siloxane compound, and a solvent; exposing the coating to light via a pattern mask and developing it; removing the coating in the light-exposed portion; and then heat-treating the remaining coating, wherein the quinonediazide sulfonic acid ester compound is a sulfonic acid ester of a functional group and a monohydric or polyhydric alcohol having 3 to 20 carbon atoms, the functional group being selected from among radiation-sensitive functional groups represented by the general formula (51), and the content of the siloxane compound is 50% by mass or higher with respect to the total amount of the components except for the solvent.

[24] The image display according to [23], wherein the interlayer insulating film is the silica-based coating.

[25] The image display according to [23], wherein the passivation film is the organic insulating film.

[26] The image display according to [23], wherein the image display is a liquid-crystal display.

[27] The image display according to [23], wherein the image display is an organic EL display.

[28] An image display comprising: TFT having a gate insulating film; an interlayer insulating film; and a passivation film, wherein at least one of the gate insulating film, the interlayer insulating film, and the passivation film is a silica-based coating comprising a silicon element of 35% or higher in terms of a weight ratio and 28% or higher in terms of a molar ratio and a sulfur element.

[29] The image display according to [28], wherein the silica-based coating comprises 100 ppm or higher sulfur element.

[30] The image display according to [29], wherein the image display is a liquid-crystal display.

[31] The image display according to [29], wherein the image display is an organic EL display.

[32] A semiconductor device comprising a silicon substrate and a silica-based coating formed on the silicon substrate, wherein the silica-based coating is a silica-based coating which is obtained by: forming a coating by the application of a radiation-sensitive composition comprising a quinonediazide sulfonic acid ester compound, a siloxane compound, and a solvent; exposing the coating to light via a pattern mask and developing it; removing the coating in the light-exposed portion; and then heat-treating the remaining coating, wherein the quinonediazide sulfonic acid ester compound is a sulfonic acid ester of a functional group and a monohydric or polyhydric alcohol having 3 to 20 carbon atoms, the functional group being selected from among radiation-sensitive functional groups represented by the general formula (51), and the content of the siloxane compound is 50% by mass or higher with respect to the total amount of the components except for the solvent.

[33] A semiconductor device comprising a silicon substrate and a silica-based coating formed on the silicon substrate, wherein the silica-based coating comprises a silicon element of 35% or higher in terms of a weight ratio and 28% or higher in terms of a molar ratio and a sulfur element.

[34] A memory capacitor comprising: a silicon substrate having a diffusion region constituting a portion of a memory capacitor cell; an opposite electrode disposed on the diffusion region side of the silicon substrate; and first and second interlayer insulating films between the opposite electrode and the silicon substrate, the first and second interlayer insulating films being layered in this order from the silicon substrate side, wherein the first or second interlayer insulating film is a silica-based coating which is obtained by: forming a coating by the application of a radiation-sensitive composition comprising a quinonediazide sulfonic acid ester compound, a siloxane compound, and a solvent; exposing the coating to light via a pattern mask and developing it; removing the coating in the light-exposed portion; and then heat-treating the remaining coating, wherein the quinonediazide sulfonic acid ester compound is a sulfonic acid ester of a functional group and a monohydric or polyhydric alcohol having 3 to 20 carbon atoms, the functional group being selected from among radiation-sensitive functional groups represented by the general formula (51), and the content of the siloxane compound is 50% by mass or higher with respect to the total amount of the components except for the solvent.

[35] A memory capacitor comprising: a silicon substrate having a diffusion region constituting a portion of a memory capacitor cell; an opposite electrode disposed on the diffusion region side of the silicon substrate; and first and second interlayer insulating films between the opposite electrode and the silicon substrate, the first and second interlayer insulating films being layered in this order from the silicon substrate side, wherein the first or second interlayer insulating film is a silica-based coating comprising a silicon element of 35% or higher in terms of a weight ratio and 28% or higher in terms of a molar ratio and a sulfur element.

[36] The memory capacitor according to [35], wherein the silica-based coating comprises 100 ppm or higher sulfur element.

[37] A photosensitizer for an insulating film represented by the general formula (59) shown below;

[Chemical Formula 7]

$$Z—(O-D)_y \quad (59)$$

wherein Z represents a linear or branched alkyl group having 3 to 20 carbon atoms which may have a substituent; y represents an integer of 1 to 10; and D represents any of functional groups represented by the general formula (51).

[38] A photosensitizer for an insulating film represented by the general formula (60) shown below;

[Chemical Formula 8]

$$D^1—(O—CHCH_2)_n—OD^2 \quad (60)$$
$$\qquad\quad |$$
$$\qquad\quad CH_3$$

wherein $D^1$ represents any of functional groups represented by the general formula (51), and $D^2$ represents any of functional groups represented by the general formula (51), a hydrogen atom, and a linear or branched alkyl group having 1 to 20 carbon atoms which may have a substituent; and n represents an integer of 1 to 6.

Effect of the Invention

The present invention provides: a radiation-sensitive composition which permits relatively easy formation of a silica-based coating that can be used as an interlayer insulating film and allows the silica-based coating formed therefrom to be excellent in heat resistance, crack resistance, resolution, insulating properties, low dielectricity, and, optionally, transparency; and a method for forming a silica-based coating using the radiation-sensitive composition. The present invention further provides: a silica-based coating formed by the method; a semiconductor device, an image display (flat-panel display), a member for an electronic device, and a memory capacitor comprising the silica-based coating; and a photosensitizer for an insulating film.

BRIEF DESCRIPTION OF THE DRAWINGS

FIG. 7 is a table showing the composition of radiation-sensitive compositions (A1) to (A17) and evaluation results thereof;

FIG. 8 is a table showing the composition of radiation-sensitive compositions (A18) to (A40) and evaluation results thereof;

FIG. 9 is a table showing the composition of radiation-sensitive compositions (A41) to (A53) and evaluation results thereof;

DESCRIPTION OF SYMBOLS

Figure 1:
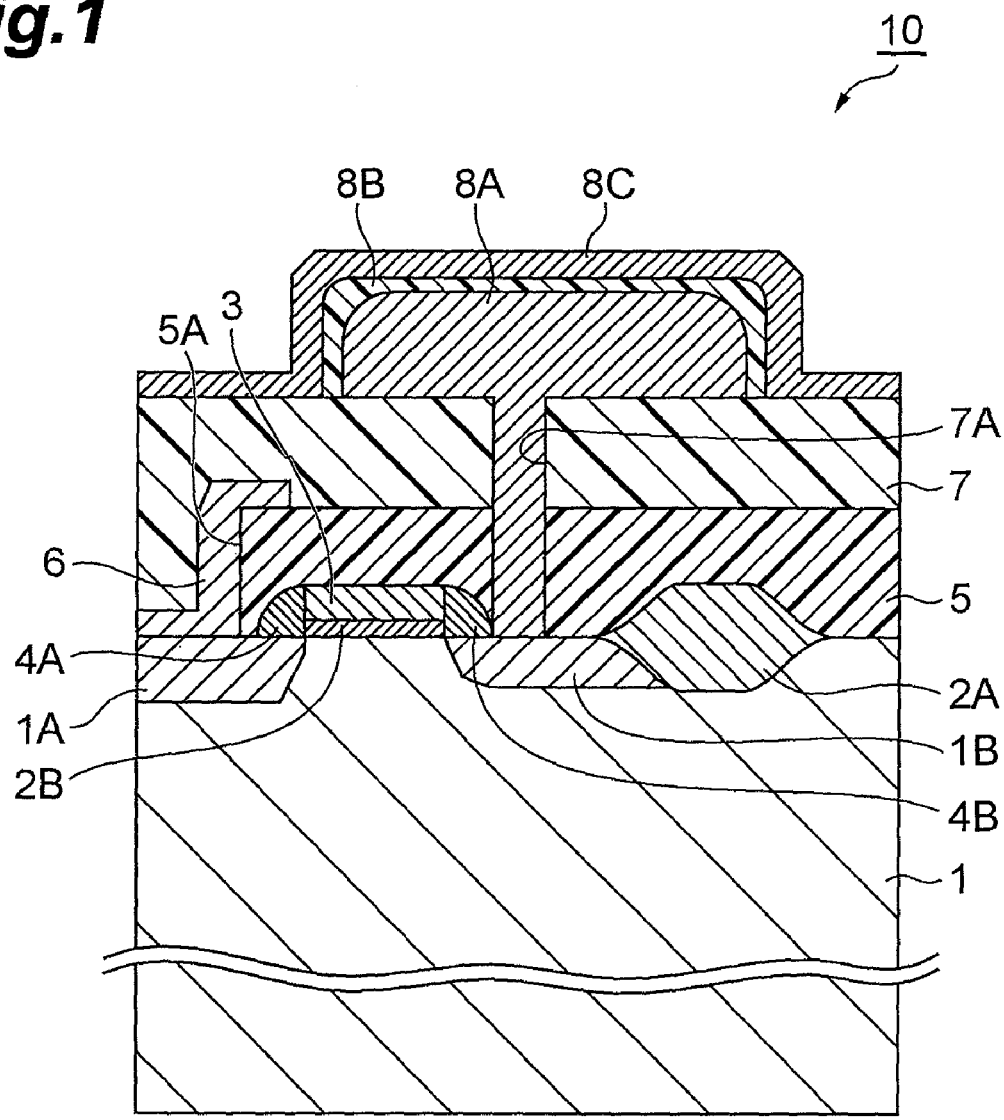
FIG. 1 is a schematic sectional view showing one embodiment of an electronic component.

1 . . . silicon wafer; 1A and 1B . . . diffusion regions; 2A . . . field oxide film; 2B . . . gate insulating film; 3 . . . gate electrode; 4A and 4B . . . sidewall oxide films; 5 . . . first interlayer insulating film; 7 . . . second interlayer insulating film; 5A and 7A . . . contact hole; 6 . . . bit line; 8A . . . storage electrode; 8B . . . capacitor insulating film; 8C . . . opposite electrode; 10 . . . memory cell capacitor; 21 . . . pixel electrode; 22 . . . gate wiring; 23 . . . source wiring; 24 and 50 . . . TFT; 25 . . . connection electrode; 26 . . . contact hole; 31 . . . transparent insulating substrate; 32 . . . gate electrode; 36a . . . source electrode; 36b . . . drain electrode; 37a and 37b . . . transparent conductive film; 38a and 38b . . . metal layer; and 39 . . . interlayer insulating film.

BEST MODES FOR CARRYING OUT THE INVENTION

Hereinafter, preferred embodiments of the present invention will be described in detail. However, the present invention is not intended to be limited to the embodiments below. In the present specification, weight-average molecular weights are measured by gel permeation chromatography (hereinafter, referred to as "GPC") and calculated based on a calibration curve prepared using polystyrene standards.

Weight-average molecular weights (Mw) can be measured using GPC, for example, under conditions shown below.
(Conditions)
Sample: 10 μL
Polystyrene standards: polystyrene standards manufactured by TOSOH CORP. (molecular weight: 190000, 17900, 9100, 2980, 578, 474, 370, and 266)
Detector: RI monitor, trade name "L-3000", manufactured by Hitachi, Ltd.
Integrator: GPC integrator, trade name "D-2200", manufactured by Hitachi, Ltd.
Pump: trade name "L-6000", manufactured by Hitachi, Ltd.

Degasser: trade name "Shodex DEGAS", manufactured by SHOWA DENKO K.K.

Column: trade names "GL-R440", "GL-R430", and "GL-R420" (all manufactured by Hitachi Chemical Co., Ltd.) connected in this order for use Eluent: tetrahydrofuran (THF)
Measurement temperature: 23° C.
Flow rate: 1.75 mL/min.
Measurement time: 45 min.

(Radiation-Sensitive Composition)

A radiation-sensitive composition of the present invention comprises a component (a), a component (b), and a component (c). Moreover, the radiation-sensitive composition may optionally comprise a component (d). Hereinafter, each component will be described. In this context, the components (a) and (c) can take both solid and liquid forms in itself. In the description below, these components, even when taking a liquid form in itself, are referred to as solid contents.

<Component (a)>

The component (a) is a siloxane resin obtained by hydrolyzing and condensing a silane compound comprising a compound represented by the general formula (1) shown below;

[Chemical Formula 9]

(1)

wherein $R^1$ represents an organic group; A represents a divalent organic group; and X represents a hydrolyzable group, wherein the X groups may be the same or different.

Examples of the organic group represented by $R^1$ include aliphatic hydrocarbon groups and aromatic hydrocarbon groups. Among them, linear, branched, or cyclic aliphatic hydrocarbon groups having 1 to 20 carbon atoms are preferable. Specific examples of the linear aliphatic hydrocarbon groups having 1 to 20 carbon atoms include groups such as methyl, ethyl, n-propyl, n-butyl, and n-pentyl groups. Specific examples of the branched aliphatic hydrocarbon groups include groups such as isopropyl and isobutyl groups. Additionally, specific examples of the cyclic aliphatic hydrocarbon groups include groups such as cyclopentyl, cyclohexyl, cycloheptylene, norbornyl, and adamantyl groups. Among them, linear hydrocarbon groups having 1 to 5 carbon atoms such as methyl, ethyl, and propyl groups are more preferable. A methyl group is particularly preferable from the viewpoint of easy availability of the raw material.

Examples of the divalent organic group represented by A include divalent aromatic hydrocarbon groups and divalent aliphatic hydrocarbon groups. Among them, linear, branched, or cyclic divalent hydrocarbon groups having 1 to 20 carbon atoms are preferable from the viewpoint of easy availability of the raw material, etc.

Preferable specific examples of the linear divalent hydrocarbon groups having 1 to 20 carbon atoms include groups such as methylene, ethylene, propylene, butylene, and pentylene groups. Preferable specific examples of the branched divalent hydrocarbon groups having 1 to 20 carbon atoms include groups such as isopropylene and isobutylene groups. Preferable specific examples of the cyclic divalent hydrocarbon groups having 1 to 20 carbon atoms include groups such as a cyclopentylene group, a cyclohexylene group, a cycloheptylene group, groups having a norbornane skeleton, and groups having an adamantane skeleton. Among them, linear divalent hydrocarbon groups having 1 to 7 carbon atoms such as methylene, ethylene, and propylene groups, cyclic divalent hydrocarbon groups having 3 to 7 carbon atoms such as cyclopentylene and cyclohexylene groups, and cyclic divalent hydrocarbon groups having a norbornane skeleton are particularly preferable.

Examples of the hydrolyzable group represented by X include alkoxy groups, halogen atoms, acetoxy groups, isocyanate groups, and hydroxyl groups. Among them, alkoxy groups are preferable from the viewpoint of solution stability or application properties of the radiation-sensitive composition itself, etc. In this context, specific examples of a hydrolyzable group represented by X in compounds respectively represented by the general formulas (2) and (3) described later also include the same groups as those represented by X in the compound represented by the general formula (1).

Moreover, it is preferred that the silane compound should further comprise a compound represented by the general formula (2) shown below. As a result, a silica-based coating obtained therefrom is further improved in heat resistance;

[Chemical Formula 10]

$$R^2SiX_3 \quad (2)$$

wherein $R^2$ represents an organic group; and X represents a hydrolyzable group, wherein the X groups may be the same or different.

Examples of the organic group represented by $R^2$ include aliphatic hydrocarbon groups and aromatic hydrocarbon groups. Linear, branched, or cyclic aliphatic hydrocarbon groups having 1 to 20 carbon atoms are preferable as the aliphatic hydrocarbon groups. Specific examples of the linear aliphatic hydrocarbon groups having 1 to 20 carbon atoms include groups such as methyl, ethyl, n-propyl, n-butyl, and n-pentyl groups. Specific examples of the branched aliphatic hydrocarbon groups include groups such as isopropyl and isobutyl groups. Additionally, specific examples of the cyclic aliphatic hydrocarbon groups include groups such as cyclopentyl, cyclohexyl, cycloheptylene, norbornyl, and adamantyl groups. Among them, methyl, ethyl, propyl, norbornyl, and adamantyl groups are more preferable from the viewpoint of thermal stability and easy availability of the raw material.

Moreover, it is preferred that the aromatic hydrocarbon groups should have 6 to 20 carbon atoms. Specific examples thereof include groups such as phenyl, naphthyl, anthracenyl, phenanthrenyl, and pyrenyl groups. Among them, phenyl and naphthyl groups are more preferable from the viewpoint of thermal stability and easy availability of the raw material.

In this context, when the silane compound comprises the compound represented by the general formula (2), the content thereof is preferably 10 to 90% by mass, more preferably 30 to 80% by mass, with respect to the amount of the whole silane compound.

Furthermore, the silane compound may comprise a silane compound other than the compounds respectively represented by the general formulas (1) and (2). Examples of such a silane compound include a compound represented by the general formula (3) described later wherein n is 0 or 2. In this context, the content of the silane compound other than the compounds respectively represented by the general formulas (1) and (2) can be, for example, 0 to 50% by mass, with respect to the amount of the whole silane compound.

For hydrolyzing and condensing the silane compound, the compounds represented by the general formula (1) may be used alone or in combination of two or more thereof. Likewise, the compounds represented by the general formula (2) may be used alone or in combination of two or more thereof.

The structure of a siloxane resin (silsesquioxane) obtained by hydrolyzing and condensing the silane compound comprising the compound represented by the general formula (1) and the compound represented by the general formula (2) is specifically exemplified by the general formula (4) shown below. In this context, this specific example is the structure of a siloxane resin obtained by hydrolyzing and condensing one compound represented by the general formula (1) (wherein $R^1$ is a methyl group) and two compounds represented by the general formula (2) (wherein $R^2$ is phenyl and methyl groups, respectively). Moreover, for simplification, the structure is shown in a plane view. However, those skilled in the art will understand that the siloxane resin actually has a three-dimensional network structure. Furthermore, the numerical subscript "3/2" denotes that 3/2 O atoms are bonded to one Si atom.

[Chemical Formula 11]

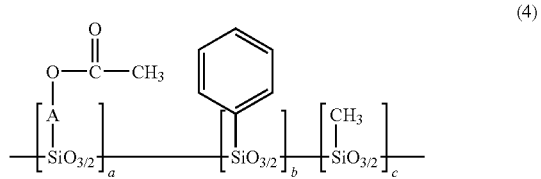

(4)

In the formula (4), A represents a divalent organic group; and a, b, and c represent molar ratios (% by mole) of raw materials corresponding to their respective sites, wherein a is 1 to 99, b is 1 to 99, and c is 1 to 99. However, the total sum of a, b, and c is 100.

The hydrolytic condensation of the silane compound can be performed, for example, under the following conditions.

First, the amount of water used in the hydrolytic condensation is preferably 0.01 to 1000 moles, more preferably 0.05 to 100 moles, per mol of the compound represented by the general formula (1). When this amount of water is smaller than 0.01 moles, it does not tend to allow the hydrolytic condensation reaction to fully proceed. When the amount of water exceeds 1000 moles, it tends to form a gel during hydrolysis or during condensation.

Moreover, a catalyst may be used in the hydrolytic condensation. For example, an acid catalyst, alkaline catalyst, or metal chelate compound can be used as the catalyst. Among them, an acid catalyst is preferable from the viewpoint of preventing the hydrolysis of an acyloxy group in the compound represented by the general formula (1).

Examples of the acid catalyst include organic acids and inorganic acids. Examples of the organic acids include formic acid, maleic acid, fumaric acid, phthalic acid, malonic acid, succinic acid, tartaric acid, malic acid, lactic acid, citric acid, acetic acid, propionic acid, butanoic acid, pentanoic acid, hexanoic acid, heptanoic acid, octanoic acid, nonanoic acid, decanoic acid, oxalic acid, adipic acid, sebacic acid, butyric acid, oleic acid, stearic acid, linoleic acid, linolenic acid, salicylic acid, benzenesulfonic acid, benzoic acid, p-aminobenzoic acid, p-toluenesulfonic acid, methanesulfonic acid, trifluoromethanesulfonic acid, and trifluoroethanesulfonic acid. Examples of the inorganic acids include hydrochloric acid, phosphoric acid, nitric acid, boric acid, sulfuric acid, and hydrofluoric acid. These catalysts are used alone or in combination of two or more thereof.

The amount of such a catalyst used is preferably in the range of 0.0001 to 1 mole per mol of the compound represented by the general formula (1). When this amount of the catalyst used is smaller than 0.0001 moles, it does not substantially tend to allow the reaction to proceed. When the amount of the catalyst used exceeds 1 mole, it tends to promote gelling during hydrolytic condensation.

In this context, when the catalyst is used in the hydrolytic condensation, the catalyst involved therein might deteriorate the stability of the obtained radiation-sensitive composition or might have an influence such as corrosion on other materials. Such bad influences can be resolved, for example, by removing the catalyst from the radiation-sensitive composition after hydrolytic condensation or by inactivating catalyst functions through the reaction of the catalyst with other compounds. Methods previously known in the art can be used as methods for performing these procedures. Examples of the methods for removing the catalyst include a distillation method and ion-exchange column chromatography. Additionally, examples of the methods for inactivating catalyst functions through the reaction of the catalyst with other compounds include a method in which the catalyst is neutralized through acid-base reaction by the addition of a base when it is an acid catalyst.

Moreover, alcohol is secondarily produced in the hydrolytic condensation. This alcohol, which is a protic solvent, might have bad influences on the physical properties of the radiation-sensitive composition. Therefore, it is preferred that the alcohol should be removed using an evaporator or the like.

The siloxane resin thus obtained has a weight-average molecular weight of preferably 500 to 1000000, more preferably 500 to 500000, even more preferably 500 to 100000, particularly preferably 500 to 50000, from the viewpoint of solvent solubility, moldability, etc. When this weight-average molecular weight is lower than 500, it tends to deteriorate the film formability of a silica-based coating. When this weight-average molecular weight exceeds 1000000, it tends to reduce solvent compatibility.

The proportion of the component (a) formulated is preferably 5 to 50% by mass, more preferably 7 to 40% by mass, even more preferably 10 to 40% by mass, particularly preferably 15 to 35% by mass, with respect to the total solid content of the radiation-sensitive composition from the viewpoint of solvent solubility, film thickness, moldability, solution stability, etc. When this proportion of the component (a) formulated is smaller than 5% by mass, it tends to deteriorate the film formability of a silica-based coating. When the proportion of the component (a) formulated exceeds 50% by mass, it tends to reduce solution stability.

Since the radiation-sensitive composition of the present invention comprises the component (a), a silica-based coating formed therefrom is excellent in heat resistance and resolution. Furthermore, the component (a) in this radiation-sensitive composition is excellent in flexibility. Therefore, the formed silica-based coating is prevented from being cracked during heat treatment and is therefore excellent in crack resistance. Furthermore, since the formed silica-based coating is excellent in crack resistance, a thicker film of the silica-based coating can be formed using the radiation-sensitive composition of the present invention.

<Component (b)>

The component (b) is a solvent dissolving the component (a) therein and is preferably a solvent that favorably dissolves therein both the components (a) and (b) and permits formation of an evenly and flatly applied film. Moreover, a solvent is desirable, which does not change the photosensitive properties or physical properties of the radiation-sensitive composition over time during storage, avoids the precipitation of solid contents, and has excellent storage stability. Specific examples thereof include nonprotic solvents and protic solvents. These solvents may be used alone or in combination of two or more thereof.

Examples of the nonprotic solvents include: ketone solvents such as acetone, methyl ethyl ketone, methyl-n-propyl ketone, methyl-isopropyl ketone, methyl-n-butyl ketone, methyl-isobutyl ketone, methyl-n-pentyl ketone, methyl-n-hexyl ketone, diethyl ketone, dipropyl ketone, diisobutyl ketone, trimethyl nonanone, cyclohexanone, cyclopentanone, methyl cyclohexanone, 2,4-pentanedione, acetonylacetone, γ-butyrolactone, and γ-valerolactone; ether solvents such as diethyl ether, methyl ethyl ether, methyl di-n-propyl ether, diisopropyl ether, tetrahydrofuran, methyltetrahydrofuran, dioxane, dimethyldioxane, ethylene glycol dimethyl ether, ethylene glycol diethyl ether, ethylene glycol di-n-propyl ether, ethylene glycol dibutyl ether, diethylene glycol dimethyl ether, diethylene glycol diethyl ether, diethylene glycol methyl ethyl ether, diethylene glycol methyl mono-n-propyl ether, diethylene glycol methyl mono-n-butyl ether, diethylene glycol di-n-propyl ether, diethylene glycol di-n-butyl ether, diethylene glycol methyl mono-n-hexyl ether, triethylene glycol dimethyl ether, triethylene glycol diethyl ether, triethylene glycol methyl ethyl ether, triethylene glycol methyl mono-n-butyl ether, triethylene glycol di-n-butyl ether, triethylene glycol methyl mono-n-hexyl ether, tetraethylene glycol dimethyl ether, tetraethylene glycol diethyl ether, tetradiethylene glycol methyl ethyl ether, tetraethylene glycol methyl mono-n-butyl ether, diethylene glycol di-n-butyl ether, tetraethylene glycol methyl mono-n-hexyl ether, tetraethylene glycol di-n-butyl ether, propylene glycol dimethyl ether, propylene glycol diethyl ether, propylene glycol di-n-propyl ether, propylene glycol dibutyl ether, dipropylene glycol dimethyl ether, dipropylene glycol diethyl ether, dipropylene glycol methyl ethyl ether, dipropylene glycol methyl mono-n-butyl ether, dipropylene glycol di-n-propyl ether, dipropylene glycol di-n-butyl ether, dipropylene glycol methyl mono-n-hexyl ether, tripropylene glycol dimethyl ether, tripropylene glycol diethyl ether, tripropylene glycol methyl ethyl ether, tripropylene glycol methyl mono-n-butyl ether, tripropylene glycol di-n-butyl ether, tripropylene glycol methyl mono-n-hexyl ether, tetrapropylene glycol dimethyl ether, tetrapropylene glycol diethyl ether, tetradipropylene glycol methyl ethyl ether, tetrapropylene glycol methyl mono-n-butyl ether, dipropylene glycol di-n-butyl ether, tetrapropylene glycol methyl mono-n-hexyl ether, and tetrapropylene glycol di-n-butyl ether; ester solvents such as methyl acetate, ethyl acetate, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, nonyl acetate, methyl acetoacetate, ethyl acetoacetate, diethylene glycol monomethyl ether acetate, diethylene glycol monoethyl ether acetate, diethylene glycol mono-n-butyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, and di-n-butyl oxalate; ether acetate solvents such as ethylene glycol methyl ether propionate, ethylene glycol ethyl ether propionate, ethylene glycol methyl ether acetate, ethylene glycol ethyl ether acetate, diethylene glycol methyl ether acetate, diethylene glycol ethyl ether acetate, diethylene glycol n-butyl ether acetate, propylene glycol methyl ether acetate, propylene glycol ethyl ether acetate, propylene glycol propyl ether acetate, dipropylene glycol methyl ether acetate, and dipropylene glycol ethyl ether acetate; and acetonitrile, N-methylpyrrolidinone, N-ethylpyrrolidinone, N-propylpyrrolidinone, N-butylpyrrolidinone, N-hexylpyrrolidinone, N-cyclohexylpyrrolidinone, N,N-dimethylformamide, N,N-dimethylacetamide, N,N-dimethyl sulfoxide, toluene, and xylene. Among them, ether solvents, ether acetate solvents, and ketone solvents are preferable from the viewpoint of achieving a thicker film of a silica-based coating formed therefrom and improving the solution stability of the radiation-sensitive composition. Among them, ether acetate solvents are most preferable, followed by ether solvents, and ketone solvents, from the viewpoint of reducing uneven application or repellency to the composition. These solvents may be used alone or in combination of two or more thereof.

Examples of the protic solvents include: alcohol solvents such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, n-hexanol, 2-methylpentanol, sec-hexanol, 2-ethylbutanol, sec-heptanol, n-octanol, 2-ethylhexanol, sec-octanol, n-nonyl alcohol, n-decanol, sec-undecyl alcohol, trimethylnonyl alcohol, sec-tetradecyl alcohol, sec-heptadecyl alcohol, phenol, cyclohexanol, methylcyclohexanol, benzyl alcohol, ethylene glycol, 1,2-propylene glycol, 1,3-butylene glycol, diethylene glycol, dipropylene glycol, triethylene glycol, and tripropylene glycol; ether solvents such as ethylene glycol methyl ether, ethylene glycol ethyl ether, ethylene glycol monophenyl ether, diethylene glycol monomethyl ether, diethylene glycol monoethyl ether, diethylene glycol mono-n-butyl ether, diethylene glycol mono-n-hexyl ether, ethoxytriglycol, tetraethylene glycol mono-n-butyl ether, propylene glycol monomethyl ether, dipropylene glycol monomethyl ether, dipropylene glycol monoethyl ether, and tripropylene glycol monomethyl ether; and ester solvents such as methyl lactate, ethyl lactate, n-butyl lactate, and n-amyl lactate. Among them, alcohol solvents are preferable from the viewpoint of storage stability. Furthermore, ethanol, isopropyl alcohol, and propylene glycol propyl ether are preferable from the viewpoint of reducing uneven application or repellency to the composition. These solvents may be used alone or in combination of two or more thereof.

Additionally, organic solvents can be used, which are optionally supplemented with high-boiling solvents such as benzyl ethyl ether, dihexyl ether, diethylene glycol monobutyl ether, acetonylacetone, isophorone, caproic acid, caprylic acid, tert-butanol, 1-butanol, 1-pentanol, 1-hexanol, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and carbitol acetate, in addition to the nonprotic solvents and the protic solvents.

The type of the component (b) can be selected appropriately according to the types of the components (a) and (c), etc. For example, an aromatic hydrocarbon solvent such as toluene can be selected appropriately when the component (c) described later is an ester of quinonediazide sulfonic acid and phenols and is low soluble in aliphatic hydrocarbon solvents.

The amount of such a component (b) formulated can be adjusted appropriately according to the types of the components (a) and (c), etc. For example, it can be used in an amount of 0.1 to 90% by mass with respect to the total solid content of the radiation-sensitive composition.

Methods previously known in the art can be used as methods for adding the component (b) into the radiation-sensitive composition. Specific examples thereof include: a method in which the component (b) is used as a solvent for preparing the component (a); a method in which the component (b) is added after the preparation of the component (a); a method in which solvent exchange is carried out; and a method in which the component (b) is added after the recovery of the component (a) by solvent evaporation or the like.

<Component (c)>

The component (c) is a quinonediazide sulfonic acid ester. This component works to impart positive-type photosensitivity to the radiation-sensitive composition. The positive-type photosensitivity is exhibited, for example, as follows.

Specifically, a naphthoquinonediazide group contained in the quinonediazide sulfonic acid ester, for example, 1,2-naphthoquinonediazide sulfonic acid ester, originally exhibits no solubility in alkaline developers and further inhibits the dissolution of siloxane resins in alkaline developers. However, as shown in the reaction formula (58) shown below, naphthoquinonediazide is converted, by irradiation with UV or visible light, to an indenecarboxylic acid structure, which in turn exhibits high solubility in alkaline developers. Accordingly, by virtue of the component (c) formulated therein, the light-exposed portion is removed with an alkaline developer such that the positive-type photosensitivity is exhibited.

[Chemical Formula 12]

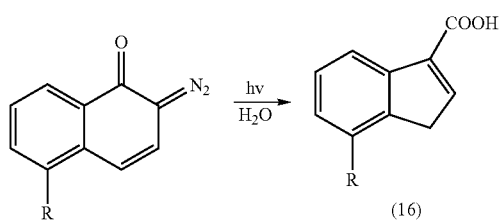

(58)

(16)

Examples of the quinonediazide sulfonic acid ester include esters of quinonediazide sulfonic acid and phenols or alcohols. Among them, esters of quinonediazide sulfonic acid and monohydric or polyhydric alcohols are preferable from the viewpoint of compatibility with the component (a) and the transparency of a silica-based coating formed therefrom. Examples of the quinonediazide sulfonic acid include 1,2-naphthoquinonediazide sulfonic acid, particularly, 1,2-naphthoquinonediazide-5-sulfonic acid and 1,2-naphthoquinone-4-sulfonic acid, and derivatives thereof.

It is preferred that the monohydric or polyhydric alcohols should have 3 to 20 carbon atoms. When the number of carbon atoms in the monohydric or polyhydric alcohols is 1 or 2, it tends to precipitate the obtained quinonediazide sulfonic acid ester in the radiation-sensitive composition or reduce its compatibility with the component (a). Additionally, when the number of carbon atoms in the monohydric or polyhydric alcohols exceeds 20, it tends to reduce photosensitive properties because the quinonediazide site occupies only a small proportion of the quinonediazide sulfonic acid ester molecule.

Specific examples of the monohydric alcohols having 3 to 20 carbon atoms include 1-propanol, 2-propanol, 1-butanol, 2-butanol, 1-pentanol, 2-pentanol, 1-hexanol, 2-hexanol, 1-heptanol, 1-octanol, 1-decanol, 1-dodecanol, benzyl alcohol, cyclohexyl alcohol, cyclohexanemethanol, cyclohexaneethanol, 2-ethylbutanol, 2-ethylhexanol, 3,5,5-trimethyl-1-hexanol, 1-adamantanol, 2-adamantanol, adamantanemethanol, norbornane-2-methanol, tetrafurfuryl alcohol, 2-methoxyethanol, ethylene glycol monomethyl ether, ethylene glycol monoethyl ether, ethylene glycol monoethyl ether, propylene glycol monomethyl ether, propylene glycol monoethyl ether, polyethylene glycol monomethyl ether having a degree of polymerization of 2 to 10, polyethylene glycol monoethyl ether having a degree of polymerization of 2 to 10, polypropylene glycol monomethyl ether having a degree of polymerization of 1 to 10, polypropylene glycol monoethyl ether having a degree of polymerization of 1 to 10, and polypropylene glycol monoalkyl ether having a degree of polymerization of 1 to 10 wherein the alkyl group is, for example, propyl, isopropyl, butyl, isobutyl, tert-butyl, isoamyl, hexyl, or cyclohexyl.

Specific examples of the dihydric alcohols having 3 to 20 carbon atoms include 1,4-cyclohexanediol, 1,4-butanediol, 1,5-pentanediol, 1,6-hexanediol, 1,7-heptanediol, 1,8-octanediol, 1,9-nonanediol, neopentyl glycol, p-xylylene glycol, 2,2-dimethyl-1,3-propanediol, 2,2,4-trimethyl-1,3-pentanediol, 3,9-bis(1,1-dimethyl-2-hydroxyethyl)-2,4,8,10-tetraoxaspiro[5.5]undecane, 2,2-diisoamyl-1,3-propanediol, 2,2-diisobutyl-1,3-propanediol, 2,2-di-n-octyl-1,3-propanediol, 2-ethyl-2-methyl-1,3-propanediol, and 2-methyl-2-propyl-1,3-propanediol.

Specific examples of the trihydric or higher-hydric alcohols having 3 to 20 carbon atoms include glycerol, trimethylolethane, trimethylolpropane, pentaerythritol, 3-methylpentane-1,3,5-triol, sugars, and ethylene glycol, propylene glycol, polyethylene glycol, or polypropylene glycol adducts of these polyhydric alcohols.

The quinonediazide sulfonic acid ester can be obtained by methods previously known in the art. For example, it can be obtained by reacting a quinonediazide sulfonic acid chloride with an alcohol in the presence of a base.

Examples of the base used in this reaction include: tertiary alkylamine such as trimethylamine, triethylamine, tripropylamine, tributylamine, trihexylamine, and trioctylamine; and pyridine, 2,6-lutidine, sodium hydroxide, potassium hydroxide, sodium hydride, potassium-tert-butoxide, sodium methoxide, sodium carbonate, and potassium carbonate.

Moreover, examples of reaction solvents include: aromatic solvents such as toluene and xylene; halogen solvents such as chloroform and carbon tetrachloride; ether solvents such as THF, 1,4-dioxane, and diethyl ether; ester solvents such as ethyl acetate and butyl acetate; ether acetate solvents such as propylene glycol monomethyl ether acetate; ketone solvents such as acetone and isobutyl ketone; and hexane and dimethyl sulfoxide.

The component (c) may be a sulfonic acid ester of a functional group and a monohydric or polyhydric alcohol having 3 to 20 carbon atoms, the functional group being selected from among radiation-sensitive functional groups represented by the general formula (51) shown below. Specifically, the component (c) may be a compound represented by the general formula (59) shown below. This component (c) can be used particularly preferably as a photosensitizer for an insulating film.

[Chemical Formula 13]

Z—(O-D)$_y$ (59)

[Chemical Formula 14]

General Formula (51)

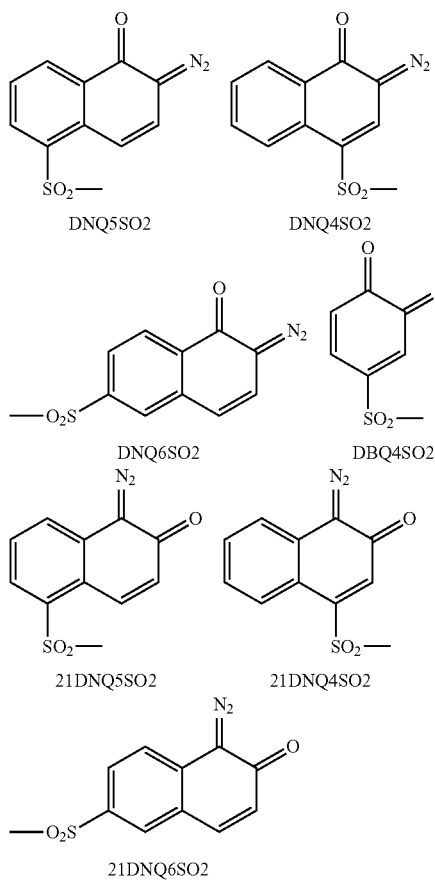

In the formula (59), D represents a functional group selected from among radiation-sensitive functional groups represented by the general formula (51); Z represents a linear or branched alkyl group having 3 to 20 carbon atoms which may have a substituent; and y represents an integer of 1 to 10 and is preferably an integer of 1 to 4.

Of the radiation-sensitive functional groups represented by the general formula (51), those having a naphthoquinone skeleton are called diazonaphtoquinone (abbreviation: DNQ). They are also called naphthoquinonediazide (abbreviation: NQD).

For DNQ, several kinds of structural isomers are known due to the presence of its structural isomerism and structural isomerism that differs in position to which a sulfonamide group is bonded (4-, 5-, and 6-). Functional groups selected from among those represented by the general formula (51) are typically used. Among these compounds, DNQ5SO2 and DNQ4SO2 which are chemically stable and are excellent in photosensitive properties are often used.

A monohydric or polyhydric alcohol having 3 to 20 carbon atoms is used as the alcohol that forms a sulfonic acid ester with naphthoquinonediazide sulfonic acid (hereinafter, also referred to as "DNQ sulfonic acid"). The alcohol used here is represented by the general formula (55) shown below. In the formula (55), Z represents a linear or branched alkyl group having 3 to 20 carbon atoms which may have a substituent; and y represents an integer of 1 to 10 and is preferably an integer of 1 to 4.

[Chemical Formula 15]

Z—(O—H)$_y$ (55)

Examples of the monohydric or polyhydric alcohol used for forming the sulfonic acid ester include, but not limited to, those shown below. Additionally, alcohols having a substituent can also be used.

(Monohydric Alcohol)

1-propanol, 2-propanol, 1-butanol, 2-butanol, 1-pentanol, 2-pentanol, 1-hexanol, 2-hexanol, 1-heptanol, 1-octanol, 1-decanol, 1-dodecanol, benzyl alcohol, cyclohexyl alcohol, cyclohexanemethanol, cyclohexaneethanol, 2-ethylbutanol, 2-ethylhexanol, 3,5,5-trimethyl-1-hexanol, or the like can be used. Alicyclic alcohols such as 1-adamantanol, 2-adamantanol, adamantanemethanol, norbornane-2-methanol, and tetrafurfuryl alcohol can also be used.

Of partial protection products (etherification or esterification products) of polyhydric alcohols described later, compounds having one residual hydroxyl group are classified here into monohydric alcohols. For example, 2-methoxyethanol (ethylene glycol monomethyl ether), ethylene glycol monoethyl ether, ethylene glycol monoethyl ether, propylene glycol monomethyl ether, propylene glycol monoethyl ether, polyethylene glycol monomethyl ether having a degree of polymerization of 2 to 10, polyethylene glycol monoethyl ether having a degree of polymerization of 2 to 10, polypropylene glycol monomethyl ether having a degree of polymerization of 1 to 10, and polypropylene glycol monoethyl ether having a degree of polymerization of 1 to 10 can be used. Ethers of alkyl other than methyl and ethyl, for example, propyl, isopropyl, butyl, isobutyl, t-butyl, isoamyl, hexyl, or cyclohexyl, can also be used.

(Dihydric Alcohol)

A dihydric alcohol is also called diol or glycol. Specific examples thereof can include compounds represented by the general formula (56). In the formula (56), $n_1$ is an integer of 2 to 10; and $n_2$ is an integer of 1 to 10.

[Chemical Formula 16]

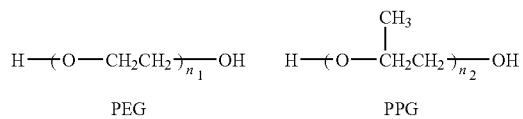

(56)

Other dihydric alcohols such as 1,4-cyclohexanediol, 1,4-butanediol, 1,5-pentanediol, 1,6-hexanediol, 1,7-heptanediol, 1,8-octanediol, 1,9-nonanediol, neopentyl glycol, p-xylylene glycol, 2,2-dimethyl-1,3-propanediol, 2,2,4-trimethyl-1,3-pentanediol, 3,9-bis(1,1-dimethyl-2-hydroxyethyl)-2,4,8,10-tetraoxaspiro[5.5]undecane, 2,2-diisoamyl-1,3-propanediol, 2,2-diisobutyl-1,3-propanediol, 2,2-di-n-octyl-1,3-propanediol, 2-ethyl-2-methyl-1,3-propanediol, and 2-methyl-2-propyl-1,3-propanediol can also be used.

(Trihydric or Higher Polyhydric Alcohol)

Examples thereof include glycerol, trimethylolethane, trimethylolpropane, pentaerythritol, 3-methylpentane-1,3,5-triol, and sugars. Moreover, ethylene glycol, propylene glycol, polyethylene glycol, or polypropylene glycol adducts of these polyhydric alcohols can also be used.

Alcohols excellent in two functions, (i) affinity for or compatibility with the siloxane compound and the solvent used in combination therewith in the radiation-sensitive composition of the present invention and (ii) photosensitive properties of the radiation-sensitive composition of the present invention, are preferably used as the alcohol used here.

Regarding the function (i), when the number of carbon atoms is 1 or 2, examples of the corresponding sulfonic acid ester can include DNQ sulfonic acid methyl ester and DNQ sulfonic acid ethyl ester. However, these compounds are easily precipitated in a composition solution due to their small alkyl group moieties and high crystallinity. Moreover, they have poor affinity for or compatibility with the siloxane compound and cannot be mixed therewith at a sufficient concentration. Therefore, they are not usually used. The alcohol having 3 to 20 carbon atoms moderately offers affinity for or compatibility with the siloxane compound and solvent solubility by adjusting the number of carbon atoms in the alcohol main chain, the linear/branched structure, and the combination of substituents. More preferably, alcohols having 3 to 10 carbon atoms are used.

Regarding the function (ii), the dihydric or higher polyhydric alcohol is more desirably used than the monohydric alcohol because the increased proportion of the photosensitizer DNQ per mol contributes more largely to photosensitive properties. When the number of carbon atoms in the alcohol is 20 or larger, photosensitive properties are deteriorated because the proportion of DNQ to the whole molecule of the DNQ sulfonic acid ester compound is decreased in terms of molecular size.

The DNQ sulfonic acid ester is usually obtained by reacting a DNQ sulfonic acid chloride with an alcohol in the presence of a base. Examples of the base used in the reaction include: tertiary alkylamine such as trimethylamine, triethylamine, tripropylamine, tributylamine, trihexylamine, and trioctylamine; and pyridine, 2,6-lutidine, sodium hydroxide, potassium hydroxide, sodium hydride, potassium-tert-butoxide, sodium methoxide, sodium carbonate, and potassium carbonate. When the alcohol is, for example, 1-propanol, which takes a liquid form around room temperature, it can be used as a solvent for the reaction. In other cases, unreactive solvents (toluene, chloroform, THF, 1,4-dioxane, diethyl ether, ethyl acetate, hexane, dimethyl sulfoxide, acetone, etc.) are used.

The proportion of the component (c) formulated is preferably 3 to 30% by mass, more preferably 5 to 25% by mass, even more preferably 5 to 20% by mass, with respect to the total solid content (the total amount of the components except for the solvent) of the radiation-sensitive composition from the viewpoint of photosensitive properties, etc. When the proportion of the component (c) formulated is smaller than 5% by mass, it tends to reduce inhibitory effect on dissolution in alkaline developers and reduce photosensitivity. Additionally, when the proportion of the component (c) formulated exceeds 30% by mass, it tends to precipitate the component (c) during applied film formation, resulting in an unevenly applied film. Furthermore, in such a case, light absorption takes place only in proximity to the surface of the formed applied film due to a high concentration of the component (c) as a photosensitizer. Thus, exposure light fails to reach the lower part of the applied film, resulting in reduced photosensitive properties.

<Component (d)>

The component (d) is a siloxane resin obtained by hydrolyzing and condensing a compound represented by the general formula (3) shown below. It is preferred that this component (d) should be used in combination with the component (a). As a result, a silica-based coating formed from the radiation-sensitive composition can be improved in strength;

[Chemical Formula 17]

$$R^3_n SiX_{4-n} \quad (3)$$

wherein $R^3$ represents a group comprising an atom bonded to the Si atom bonded to X, an H atom, an F atom, or an organic group having 1 to 20 carbon atoms, the atom bonded to the Si atom being selected from the group consisting of B, N, Al, P, Si, Ge, and Ti atoms; X represents a hydrolyzable group; and n represents an integer of 0 to 2, wherein the X groups may be the same or different, and the $R^3$ moieties may be the same or different when n is 2.

Examples of the organic group having 1 to 20 carbon atoms, which is represented by $R^3$, include aliphatic hydrocarbon groups which may have a substituent and aromatic hydrocarbon groups which may have a substituent. Among them, linear or branched aliphatic hydrocarbon groups having 1 to 6 carbon atoms and partially F-substituted groups thereof, and a phenyl group are preferable.

Examples of the compound represented by the general formula (3) wherein X is an alkoxy group (alkoxysilane) include tetraalkoxysilane, trialkoxysilane, and diorganodialkoxysilane. Examples of the tetraalkoxysilane include tetramethoxysilane, tetraethoxysilane, tetra-n-propoxysilane, tetraisopropoxysilane, tetra-n-butoxysilane, tetra-sec-butoxysilane, tetra-tert-butoxysilane, and tetraphenoxysilane.

Examples of the trialkoxysilane include trimethoxysilane, triethoxysilane, tripropoxysilane, fluorotrimethoxysilane, fluorotriethoxysilane, methyltrimethoxysilane, methyltriethoxysilane, methyltri-n-propoxysilane, methyltriisopropoxysilane, methyltri-n-butoxysilane, methyltriisobutoxysilane, methyltri-tert-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltriisobutoxysilane, ethyltri-tert-butoxysilane, ethyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltriisobutoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltriisobutoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltriisobutoxysilane, n-butyltri-tert-butoxysilane, n-butyltriphenoxysilane, sec-butyltrimethoxysilane, sec-butyltriethoxysilane, sec-butyltri-n-propoxysilane, sec-butyltriisopropoxysilane, sec-butyltri-n-butoxysilane, sec-butyltriisobutoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltriisobutoxysilane, tert-butyltri-tert-butoxysilane, tert-butyltriphenoxysilane, phenyltrimethoxysilane, phenyltriethoxysilane, phenyltri-n-propoxysilane, phenyltriisopropoxysilane, phenyltri-n-butoxysilane, phenyltriisobutoxysilane, phenyltri-tert-butoxysilane, phenyltriphenoxysilane, trifluoromethyltrimethoxysilane, pentafluoroethyltrimethoxysilane, 3,3,3-trifluoropropyltrimethoxysilane, and 3,3,3-trifluoropropyltriethoxysilane.

Examples of the diorganodialkoxysilane include dimethyldimethoxysilane, dimethyldiethoxysilane, dimethyldi-n-propoxysilane, dimethyldiisopropoxysilane, dimethyldi-n- butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, bis(3,3,3-trifluoropropyl)dimethoxysilane, and methyl(3,3,3-trifluoropropyl)dimethoxysilane.

Additionally, examples of the compound represented by the general formula (3) wherein X is an alkoxy group and $R^3$ is an organic group having 1 to 20 carbon atoms include, in addition to those described above, bissilylalkane or bissilylbenzene such as bis(trimethoxysilyl)methane, bis(triethoxysilyl)methane, bis(tri-n-propoxysilyl)methane, bis(triisopropoxysilyl)methane, bis(trimethoxysilyl)ethane, bis(triethoxysilyl)ethane, bis(tri-n-propoxysilyl)ethane, bis(triisopropoxysilyl)ethane, bis(trimethoxysilyl)propane, bis(triethoxysilyl)propane, bis(tri-n-propoxysilyl)propane, bis(triisopropoxysilyl)propane, bis(trimethoxysilyl)benzene, bis(triethoxysilyl)benzene, bis(tri-n-propoxysilyl)benzene, and bis(triisopropoxysilyl)benzene.

Additionally, examples of the compound represented by the general formula (3) wherein X is an alkoxy group and $R^3$ is a group comprising an Si atom bonded to the Si atom bonded to X include: hexaalkoxydisilanes such as hexamethoxydisilane, hexaethoxydisilane, hexa-n-propoxydisilane, and hexaisopropoxydisilane; and dialkyltetraalkoxydisilanes such as 1,2-dimethyltetramethoxydisilane, 1,2-dimethyltetraethoxydisilane, and 1,2-dimethyltetrapropoxydisilane.

These compounds represented by the general formula (3) may be used alone or in combination of two or more thereof in the hydrolytic condensation.

The hydrolytic condensation of the compound represented by the general formula (3) can be performed, for example, under the following conditions.

First, the amount of water used in the hydrolytic condensation is preferably 0.1 to 1000 moles, more preferably 0.5 to 100 moles, per mol of the compound represented by the general formula (3). When this amount of water is smaller than 0.1 moles, it does not tend to allow the hydrolytic condensation reaction to fully proceed. When the amount of water exceeds 1000 moles, it tends to form a gel during hydrolysis or during condensation.

Moreover, a catalyst may be used in the hydrolytic condensation. The same catalyst as those used in the hydrolytic condensation of the silane compound can be used. Furthermore, the catalyst after hydrolytic condensation may be removed or inactivated in the same way as above.

The siloxane resin thus obtained has a weight-average molecular weight of preferably 500 to 1000000, more preferably 500 to 500000, even more preferably 500 to 100000, particularly preferably 500 to 10000, exceedingly preferably 500 to 5000, from the viewpoint of solvent solubility, mechanical properties, moldability, etc. When this weight-average molecular weight is smaller than 500, it tends to deteriorate the film formability of a silica-based coating. When this weight-average molecular weight exceeds 1000000, it tends to reduce solvent compatibility.

The proportion of the component (d) formulated in the radiation-sensitive composition is preferably 20 to 80% by mass, more preferably 10 to 90% by mass, with respect to the total solid content of the radiation-sensitive composition from the viewpoint of solvent solubility, film thickness, moldability, solution stability, etc. When this proportion of the component (d) formulated is smaller than 10% by mass, it tends to result in insufficient improving effect on the strength of a silica-based coating. When the proportion of the component (d) formulated exceeds 90% by mass, it tends to reduce solution stability.

Instead of using the siloxane resin comprising the component (a) and, optionally, the component (d), a siloxane compound (siloxane resin) can also be used, which comprises at least one selected from the group consisting of a silane compound represented by the general formula (21) shown below and hydrolytic condensates thereof Such a siloxane compound is used particularly preferably, when a sulfonic acid ester having the radiation-sensitive functional group represented by the general formula (51) is used as the component (b).

$$(R^5)_xSi(Y)_{4-x} \quad (21)$$

wherein $R^5$ represents a nonhydrolyzable organic group having 1 to 10 carbon atoms; Y represents a hydrolyzable group; and x represents an integer of 1 to 4.

The hydrolyzable group represented by Y is usually a group that can be hydrolyzed by heating within the temperature range of room temperature (25° C.) to 100° C. without a catalyst in the presence of an excess of water to produce a silanol group or a group that can further be condensed to form a siloxane bond. Examples thereof specifically include a hydrogen atom, halogen atoms, alkoxyl groups having 1 to 12 carbon atoms, amino groups, and acyloxyl groups having 2 to 12 carbon atoms.

Examples of the nonhydrolyzable organic group having 1 to 12 carbon atoms, which is represented by $R^5$, include alkyl groups having 1 to 12 carbon atoms, aryl groups having 6 to 12 carbon atoms, and aralkyl groups having 7 to 12 carbon atoms. These groups can take a linear, branched, or cyclic form and may be combined when plural $R^5$ groups are present in one molecule. The $R^5$ group may contain a structural unit having a heteroatom. Examples of such a structural unit include ether, ester, and sulfide. In this context, the nonhydrolyzability required for the $R^5$ group means a property that allows the group to be stably present without being decomposed under conditions in which the hydrolyzable group Y is hydrolyzed. The x is an integer of 1 to 4.

Specific examples of the silane compound represented by the formula (21) can include:

silane compounds substituted by four hydrolyzable groups, such as tetrachlorosilane, tetraaminosilane, tetraacetoxysilane, tetramethoxysilane, tetraethoxysilane, tetrabutoxysilane, tetraphenoxysilane, tetrabenzyloxysilane, and tetrapropoxysilane; silane compounds substituted by one nonhydrolyzable group and three hydrolyzable groups, such as methyltrichlorosilane, methyltrimethoxysilane, methyltriethoxysilane, methyltriisopropoxysilane, methyltributoxysilane, ethyltrimethoxysilane, ethyltriethoxysilane, ethyltriisopropoxysilane, ethyltributoxysilane, butyltrimethoxysilane, pentafluorophenyltrimethoxysilane, phenyltrimethoxysilane, phenyltriethoxysilane, d3-methyltrimethoxysilane, nonafluorobutylethyltrimethoxysilane, and trifluoromethyltrimethoxysilane; silane compounds substituted by two nonhydrolyzable groups and two hydrolyzable groups, such as dimethyldichlorosilane, dimethyldiaminosilane, dimethyldiacetoxysilane, dimethyldimethoxysilane, diphenyldimethoxysilane, and dibutyldimethoxysilane; and silane compounds substituted by three nonhydrolyzable groups and one hydrolyzable group, such as trimethylchlorosilane, hexamethyldisilazane, trimethylsilane, tributylsilane, trimethylmethoxysilane, and tributylethoxysilane.

Of them, silane compounds substituted by one nonhydrolyzable group and three hydrolyzable groups can be used preferably. Particularly, methyltrimethoxysilane, methyltriethoxysilane, methyltriisopropoxysilane, methyltributoxysilane, phenyltrimethoxysilane, ethyltrimethoxysilane, ethyltriethoxysilane, ethyltriisopropoxysilane, ethyltributoxysilane, and butyltrimethoxysilane are preferable. Such silane compounds may be used alone or in combination of two or more thereof.

Conditions for hydrolyzing and condensing the silane compound are not particularly limited. As an example, the hydrolytic condensation can be performed according to steps shown below. The silane compound and predetermined amounts of water and an appropriate solvent are placed in a container equipped with a stirrer and stirred at 0° C. to a temperature equal to or lower than the boiling point of the solvent or the silane compound for approximately 1 to 24 hours in an air atmosphere. In this context, the reaction mixture can also be condensed by distillation or additionally supplemented with a solvent, if necessary, during the stirring.

The solvent that can be used here is not particularly limited. The same solvent as those used in the preparation of the radiation-sensitive composition described later can usually be used. When the solvent is used, the amount of the solvent used is usually an amount equal to or smaller than 1000 parts by weight with respect to 100 parts by weight of the silane compound.

A catalyst can also be used in the hydrolytic condensation of the silane compound. Examples of such a catalyst can include metal chelate compounds, organic acids, inorganic acids, organic bases, and inorganic bases.

The siloxane compound (siloxane resin) obtained by hydrolyzing and condensing the silane compound represented by the general formula (21) has a weight-average molecular weight of preferably 10000 or smaller, more preferably 500 to 10000, even more preferably 1000 to 5000. When the weight-average molecular weight falls within this range, a radiation-sensitive composition excellent in the balance between film formability and radiation sensitivity can be obtained.

When the siloxane compound which comprises at least one selected from the group consisting of a silane compound represented by the general formula (21) and a siloxane resin obtained by hydrolyzing and condensing the silane compound is used, the proportion of the siloxane compound formulated is preferably 50% or higher, more preferably 70% or higher, with respect to the total solid content of the radiation-sensitive composition. When this proportion of the siloxane compound formulated falls within the range, it can lower the permittivity of a silica-based coating formed from the radiation-sensitive composition. Moreover, when the composition is used in an interlayer insulating film for liquid-crystal displays, etc., by utilizing transparency characteristic of the siloxane compound, it is desirable that the content of the siloxane compound should be increased.

<Other Components>

The radiation-sensitive composition of the present invention can contain a surfactant, for example, for improving applicability (e.g., reducing the formation of striation) or improving the developability, i.e., alkali solubility, of a radiation-exposed portion after the formation of a dried applied film. Examples of the surfactant include: polyoxyethylene alkyl ethers such as polyoxyethylene lauryl ether, polyoxyethylene stearyl ether, and polyoxyethylene oleyl ether; polyoxyethylene aryl ethers such as polyoxyethylene octylphenyl ether and polyoxyethylene nonylphenyl ether; polyethylene glycol dialkyl esters such as polyethylene glycol dilaurate and polyethylene glycol distearate; other nonionic surfactants; fluorine-based surfactants such as F-Top EF301, EF303, and EF352 (all manufactured by Shin-Akita Kasei Co., Ltd.), MEGAFAC F171, F172, and F173 (all manufactured by Dainippon Ink and Chemicals, Inc.), Fluorad FC430 and FC431 (all manufactured by Sumitomo 3M Ltd.), and Asahi Guard AG710 and Surflon S-382, SC-101, SC-102, SC-103, SC-104, SC-105, and SC-106 (all manufactured by Asahi Glass Co., Ltd.); and acrylic or methacrylic acid-based (co)polymers such as POLYFLOW No. 57 and 95 (all manufactured by Kyoeisha Chemical Co., Ltd.). The proportion of these surfactants used is usually preferably 0.4 parts by weight or smaller, more preferably 0.2 parts by weight or smaller, with respect to 100 parts by weight in total of the solid contents of the composition.

The radiation-sensitive composition of the present invention can contain an adhesion promoter as an additive for improving a tight contact (adhesion) with a substrate. Furthermore, the radiation-sensitive composition of the present invention can optionally contain an anti-static agent, a storage stabilizer, an antifoaming agent, etc.

In this context, when the radiation-sensitive composition is used in an electronic component or the like, it is desirable that the composition should be free from alkali metals or alkaline-earth metals. These metals, if any, in the composition have a metal ion concentration of preferably 1000 ppm or smaller, more preferably 1 ppm or smaller. When the metal ion concentration exceeds 1000 ppm, it easily causes an influx of the metal ions into an electronic component having a silica-based coating obtained from the composition. These metal ions might have bad influences on electric performance itself. Thus, it is effective to remove, as required, the alkali metals or alkaline-earth metals from the composition, for example, using an ion-exchange filter or the like. However, when the composition is used in an optical waveguide or other usages, etc., this procedure does not have to be performed unless the purpose is impaired.

Moreover, the radiation-sensitive composition may optionally contain water. It is preferred that the composition should contain water within a range that does not impair the properties of interest.

(Method for Forming Silica-Based Coating)

A method for forming a silica-based coating according to the present invention comprises: an application step in which the radiation-sensitive composition is applied onto a substrate and dried to obtain an applied coating; a first light exposure step in which a predetermined portion in the applied film is exposed to light; a removal step in which the light-exposed predetermined portion in the applied film is removed; and a heating step in which the applied film from which the predetermined portion has been removed is heated. Additionally, the method for forming a silica-based coating according to the present invention may comprise: an application step in which the radiation-sensitive composition is applied onto a substrate and dried to obtain an applied coating; a first light exposure step in which a predetermined portion in the applied film is exposed to light; a removal step in which the light-exposed predetermined portion in the applied film is removed; a second light exposure step in which the applied film from which the predetermined portion has been removed is exposed to light; and a heating step in which the applied film from which the predetermined portion has been removed is heated. Hereinafter, each step will be described.

<Application Step>

First, a substrate for applying the radiation-sensitive composition thereon is prepared. The substrate may be those having a flat surface or those having surface irregularities attributed to electrodes or the like formed thereon. Examples of materials for these substrates include organic polymers such as polyethylene terephthalate, polyethylene naphthalate, polyamide, polycarbonate, polyacrylics, nylon, polyethersulfone, polyvinyl chloride, polypropylene, and triacetyl cellulose. Additionally, these organic polymers can also be prepared in a film form and used as a substrate.

The radiation-sensitive composition can be applied onto such a substrate by methods previously known in the art. Specific examples of the application methods include spin coating, spraying, roll coating, rotation, and slit coating methods. Among them, a spin coating method which is excellent in film formability and film uniformity is generally preferable for applying the radiation-sensitive composition onto the substrate.

When the spin coating method is used, the substrate is spin-coated with the radiation-sensitive composition at a speed of preferably 300 to 3000 rpm, more preferably 400 to 2000 rpm, to form an applied coating. When this number of revolutions is lower than 300 rpm, it tends to deteriorate film uniformity. When the number of revolutions exceeds 3000 rpm, it might reduce film formability.

The film thickness of the applied film thus formed can be adjusted, for example, as follows. First, the film thickness of the applied film can be adjusted by adjusting the number of revolutions and the number of applications in the spin coating. Specifically, the film thickness of the applied film can be increased by decreasing the number of revolutions or the number of applications in the spin coating. Additionally, the film thickness of the applied film can be decreased by increasing the number of revolutions or decreasing the number of applications in the spin coating.

Furthermore, the film thickness of the applied film can also be adjusted by adjusting the concentration of the component (a) in the radiation-sensitive composition. For example, the film thickness of the applied film can be increased by increasing the concentration of the component (a). Additionally, the film thickness of the applied film can be decreased by decreasing the concentration of the component (a).

In this way, the film thickness of the applied film is adjusted. As a result, the film thickness of a silica-based coating obtained as a final product can be adjusted. The suitable film thickness of the silica-based coating differs depending on usage. For example, the film thickness of the silica-based coating is preferably 0.01 to 2 μm for use in an interlayer insulating film for LSI or the like; 2 to 40 μm for use in a passivation layer; 0.1 to 20 μm for use in liquid-crystal usage; 0.1 to 2 μm for use in a photoresist; or 1 to 50 μm for use in an optical waveguide. In general, the film thickness of this silica-based coating is preferably 0.01 to 10 μm, more preferably 0.01 to 5 μm, even more preferably 0.01 to 3 μm, particularly preferably 0.05 to 3 μm, exceedingly preferably 0.1 to 3 μm. The radiation-sensitive composition of the present invention can be used preferably in a silica-based coating having a film thickness of 0.5 to 3.0 μm, more preferably in a silica-based coating having a film thickness of 0.5 to 2.5 μm, particularly preferably in a silica-based coating having a film thickness of 1.0 to 2.5 μm.

The applied film thus formed on the substrate is then dried (prebaked) to remove the organic solvents in the applied film. Methods previously known in the art can be used in the drying. For example, the drying can be performed using a hot plate. The drying temperature is preferably 50 to 200° C., more preferably 80 to 180° C. When this drying temperature is lower than 50° C., it tends to result in insufficient removal of the organic solvents. Additionally, when the drying temperature exceeds 200° C., it promotes the curing of the applied film and therefore tends to bring about reduction in sensitivity to exposure light and in resolution due to reduced solubility in developers. Actually, it is preferred that this drying should be performed, for example, at a temperature of 70 to 130° C. for approximately 1 to 10 minutes, according to the type of each component and the proportion of each component formulated, etc.

<First Light Exposure Step>

Next, a predetermined portion in the obtained applied film is exposed to light. Methods previously known in the art can be used as methods for exposing a predetermined portion in the applied film to light. For example, the predetermined portion can be exposed to light by exposing the applied film to radiation via a mask with a predetermined pattern. Examples of the radiation used here include: UV light such as g rays (wavelength: 436 nm) and i rays (wavelength: 365 nm); far-ultraviolet light such as KrF excimer laser; X-rays such as synchrotron radiation; and charged particle beams such as electron beams. Among them, g and i rays are preferable. The dose of light exposure is usually 10 to 2000 mJ/cm$^2$, preferably 20 to 200 mJ/cm$^2$.

<Removal Step>

Subsequently, the light-exposed predetermined portion (hereinafter, also referred to as the "light-exposed portion") in the applied film is removed to obtain an applied coating having the predetermined pattern. Methods previously known in the art can be used as methods for removing the light-exposed portion in the applied film. For example, the light-exposed portion can be removed by development treatment using a developer to obtain an applied coating having the predetermined pattern. For example, aqueous alkali solutions containing inorganic alkalis (e.g., sodium hydroxide, potassium hydroxide, sodium carbonate, sodium silicate, and ammonia water), primary amines (e.g., ethylamine and n-propylamine), secondary amines (e.g., diethylamine and di-n-propylamine), tertiary amines (e.g., triethylamine and methyldiethylamine), alcohol amines (e.g., dimethylethanolamine and triethanolamine), quaternary ammonium salts (e.g., tetramethylammonium hydroxide, tetraethylammonium hydroxide, and choline), or cyclic amines (e.g., pyrrole, piperidine, 1,8-diazabicyclo-(5.4.0)-7-undecene, and 1,5-diazabicyclo-(4.3.0)-5-nonane) dissolved in water are preferably used as the developer used here. Additionally, the developer can also be supplemented, for use, with appropriate amounts of water-soluble organic solvents, for example, alcohols (e.g., methanol and ethanol), or surfactants. Furthermore, various types of organic solvents that dissolve therein the composition of the present invention can also be used as the developer.

Appropriate methods such as paddling, dipping, agitation dipping, and showering methods can be used as development methods. The development time is usually 30 to 180 seconds. After the development treatment, the patterned film may be subjected to rinse treatment using, for example, washing in running water.

<Second Light Exposure Step>

Furthermore, the whole surface of the applied film remaining after the removal step is optionally exposed to light. As a result, the component (c) which has optical absorption in the visible region is decomposed to form a compound having sufficiently small optical absorption in the visible region. Accordingly, a silica-based coating obtained as a final product is improved in transparency. Thus, the silica-based coating produced by the production method comprising the second light exposure step can be used preferably in an interlayer insulating film for a liquid-crystal display, etc., which requires transparency. The same radiation as in the first light exposure step can be used in the light exposure. The dose of light exposure is usually 100 to 3000 mJ/cm$^2$, preferably 200 to 2000 mJ/cm$^2$, because the component (c) must be decomposed completely.

<Heating Step>

Finally, the applied film remaining after the removal step is heated (postbaked) for final curing. By this heating step, a silica-based coating is obtained as a final product. The heating temperature is, for example, preferably 250 to 500° C., more preferably 250 to 400° C. When this heating temperature is lower than 250° C., it tends to result in insufficient curing of the applied film. When the heating temperature exceeds 500° C., it might deteriorate metal wires due to an increased heat input in the presence of a metal wiring layer.

In this context, it is preferred that the heating step should be performed in an inactive atmosphere such as a nitrogen, argon, or helium atmosphere. In this case, the atmosphere has an oxygen concentration of preferably 1000 ppm or smaller. Moreover, the heating time is preferably 2 to 60 minutes, more preferably 2 to 30 minutes. When this heating time is shorter than 2 minutes, it tends to result in insufficient curing of the applied film. When the heating time exceeds 60 minutes, it might deteriorate metal wires due to an excessively increased heat input.

Furthermore, a quartz tube furnace or other furnaces, hot plate, rapid thermal anneal (RTA) heat treatment apparatus, or heat treatment apparatus also using EB or UV is preferably used as an apparatus for heating.

The silica-based coating formed through the steps has sufficiently high heat resistance and high transparency even when it undergoes heat treatment, for example, at 350° C. In addition, the silica-based coating is excellent in solvent resistance. In this context, a coating formed from a previously known composition comprising a phenol-based resin (e.g., novolac resin) and a quinonediazide-based photosensitizer or comprising an acrylic resin and a quinonediazide-based photosensitizer material generally has an upper limit of heat resistance on the order of 230° C. This coating, when heat-treated at a temperature exceeding the upper limit, is stained yellow or brown, resulting in significantly reduced transparency.

The silica-based coating formed through the steps can be used preferably as an interlayer insulating film for an image display such as a liquid-crystal display, plasma display, organic EL display, or field emission display.

Moreover, this silica-based coating can also be used preferably as an interlayer insulating film for a semiconductor element, multilayer wiring board, etc. Examples of the semiconductor include: discrete semiconductor elements such as diodes, transistors, compound semiconductors, thermistors, varistors, and thyristors; memory elements such as DRAM (dynamic random access memory), SRAM (static random access memory), EPROM (erasable programmable read-only memory), mask ROM (mask read-only memory), EEPROM (electrical erasable programmable read-only memory), and flash memory; logic circuit elements such as microprocessors, DSP, and ASIC; integrated circuit elements for compound semiconductors typified by MMIC (monolithic microwave integrated circuit); hybrid integrated circuits (hybrid IC); and photoelectric conversion elements such as light-emitting diodes and charge-coupled elements. Additionally, examples of the multilayer wiring board include high-density wiring boards such as MCM.

Specifically, the silica-based coating can be used as a surface protective film, buffer coating film, interlayer insulating film, etc., in the semiconductor element. On the other hand, the silica-based coating can be used as an interlayer insulating film in the multilayer wiring board. In general, polyimide is often used as an insulating material in semiconductor or electronic devices. The silica-based coating of the present invention is characterized in that it can be baked at a lower temperature than that for polyimide and can be used in usage that requires transparency.

Furthermore, the silica-based coating can also be used preferably as a member for an electronic device, such as wafer coating materials (surface protective films, bump protective films, MCM (multi-chip module) interlayer protective films, and junction coats) and packaging materials (sealing materials and die bonding materials) for semiconductor elements.

Since the radiation-sensitive composition of the present invention employs the quinonediazide sulfonic acid ester, a silica-based coating obtained from this radiation-sensitive composition is characterized in that a sulfur element derived from the sulfonic acid ester is detected therein. For example, conventional methods using polysilazane do not employ such a component containing a sulfur element. Therefore, no sulfur element is detected from a film obtained from polysilazane. Moreover, an insulating film obtained from a photosensitive acrylic resin has a much lower silicon element content than that of the silica-based coating. For example, the silica-based coating formed from the radiation-sensitive composition of the present invention comprises a silicon element of 35% or higher in terms of a weight ratio and 28% or higher in terms of a molar ratio and 100 ppm or higher sulfur element.

Specific examples of the electronic component of the present invention comprising the silica-based coating include a memory cell capacitor shown in FIG. 1. Specific examples of the image display (flat-panel display) of the present invention comprising the silica-based coating include an image display comprising an active matrix substrate shown in FIGS. 2 and 3, a liquid-crystal display shown in FIGS. 4 and 5, and an organic EL display shown in FIG. 6.

FIG. 1 is a schematic sectional view showing a memory capacitor as one embodiment of the electronic component of the present invention. A memory capacitor 10 shown in FIG. 1 has: a silicon wafer (silicon substrate) 1 comprising diffusion regions 1A and 1B formed on its surface; a gate insulating film 2B disposed at the position between the diffusion regions 1A and 1B on the silicon wafer 1; a gate electrode 3 disposed on the gate insulating film 2B; an opposite electrode 8C disposed above the gate electrode 3; and a first interlayer insulating film 5 and a second interlayer insulating film 7 (insulating coatings) between the gate electrode 3 and the opposite electrode 8C, the first and second interlayer insulating films being layered in this order from the silicon wafer 1 side.

A sidewall oxide film 4A in contact with the sidewalls of the gate insulating film 2B and the gate electrode 3 is formed on the diffusion region 1A. A sidewall oxide film 4B in contact with the sidewalls of the gate insulating film 2B and the gate electrode 3 is formed on the diffusion region 1B. A field oxide film 2A for element isolation is disposed, on the diffusion region 1B, on the side opposite to the gate insulating film 2B and formed between the silicon wafer 1 and the first interlayer insulating film 5.

The first interlayer insulating film 5 is formed over the gate electrode 3, the silicon wafer 1, and the field oxide film 2A. The first interlayer insulating film 5 has a flattened surface on the side opposite to the silicon wafer 1. The first interlayer insulating film 5 has a sidewall positioned on the diffusion region 1A. A bit line 6 is formed to extend over this sidewall and the diffusion region 1A and over a portion of the surface, on the side opposite to the silicon wafer 1, of the first interlayer insulating film 5. The second interlayer insulating film 7 disposed on the first interlayer insulating film 5 is formed to extend over the bit line 6. The first interlayer insulating film 5 and the second interlayer insulating film 7 together form a contact hole 5A in which the bit line 6 is embedded.

The second interlayer insulating film 7 also has a flattened surface on the side opposite to the silicon wafer 1. A contact hole 7A is formed at the position on the diffusion region 1B to penetrate the first interlayer insulating film 5 and the second interlayer insulating film 7. A storage electrode 7A is embedded in the contact hole 7A. This storage electrode 7A further extends over a portion around the contact hole 7A in the surface, on the side opposite to the silicon wafer 1, of the second interlayer insulating film 7. The opposite electrode 8C is formed over the storage electrode 8A and the interlayer insulating film 7. A capacitor insulating film 8B is interposed between the opposite electrode 8C and the storage electrode 8A.

The first interlayer insulating film 5 and the second interlayer insulating film 7 are silica-based coatings formed from the radiation-sensitive composition. The first interlayer insulating film 5 and the second interlayer insulating film 7 are formed, for example, through a step in which the radiation-sensitive composition is applied by a spin coating method. The first interlayer insulating film 5 and the second interlayer insulating film 7 may have the same composition or may have different composition.

Figure 2:
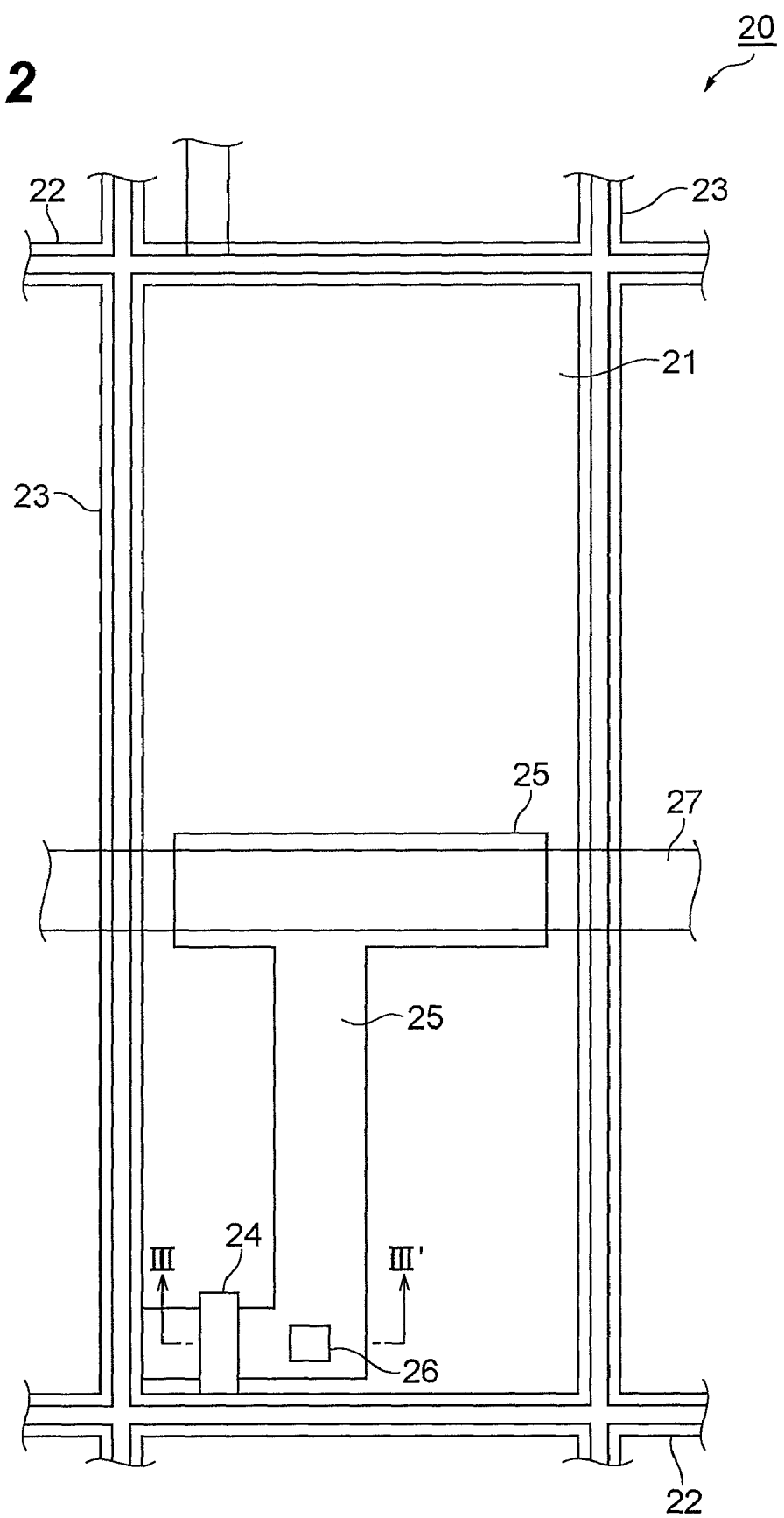
FIG. 2 is a plane view showing one embodiment of an active matrix substrate comprised in an image display.

FIG. 2 is a plane view showing one embodiment of an active matrix substrate comprised in the image display (flat-panel display) of the present invention. FIG. 2 shows the constitution of one pixel portion of the active matrix substrate. In an active matrix substrate 20 shown in FIG. 2, plural pixel electrodes 21 are disposed in a matrix form. Each gate wiring 22 for supplying scanning signals and each source wiring 23 for supplying display signals are disposed such that the gate wiring 22 and the source wiring 23 run around the pixel electrode 21 and intersect each other. The gate wiring 22 and the source wiring 23 partially overlap with the outer region of the pixel electrode 21. Moreover, a TFT 24 as a switching element connected to the pixel electrode 21 is disposed at a site where the gate wiring 22 and the source wiring 23 intersect each other. This TFT 24 has a gate electrode 32 connected to the gate wiring 22, and the drive of the TFT 24 is controlled by signals input into the gate electrode 32. Moreover, the TFT 24 has a source electrode connected to the source wiring 23, and data signals are input into the source electrode of the TFT 24. Furthermore, the TFT 24 has a drain electrode connected to the pixel electrode 21 via a connection electrode 25 and a contact hole 26, and this drain electrode is connected via the connection electrode 25 to an additional capacity electrode (not shown) serving as one electrode for additional capacity. An additional capacity opposite electrode 27 serving as the other electrode for this additional capacity is connected to a common wiring.

Figure 3:
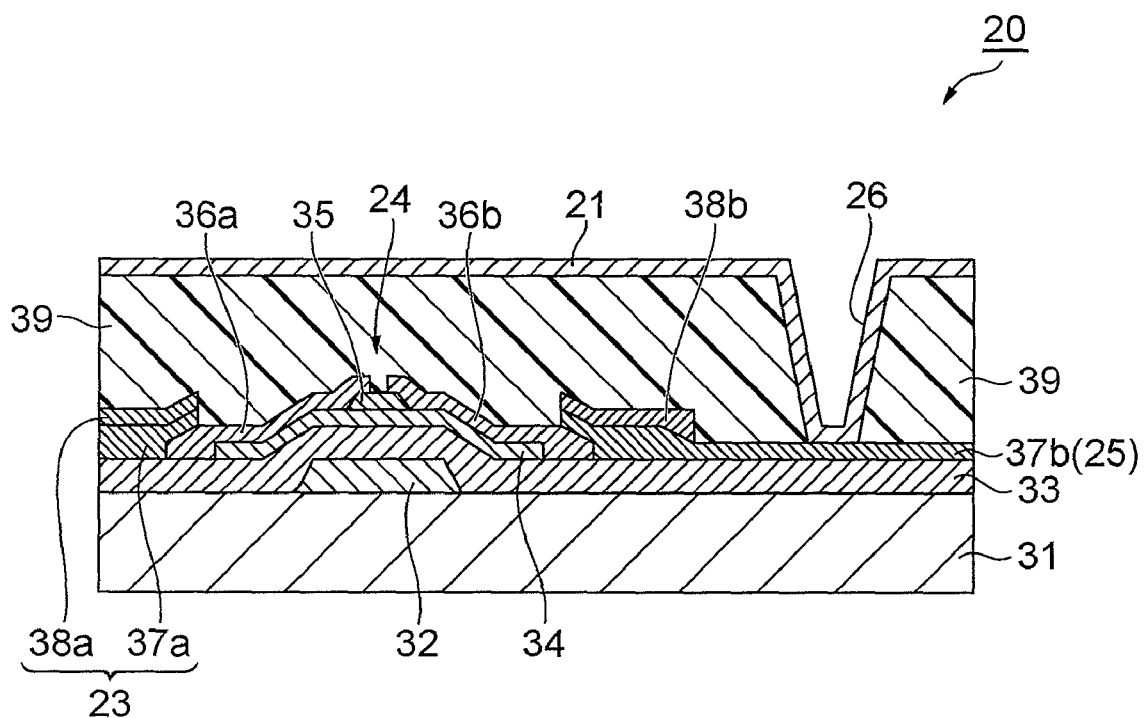
FIG. 3 is a sectional view taken along the III-III' line in the active matrix substrate of FIG. 2.

FIG. 3 is a sectional view taken along the III-III' line in the active matrix substrate of FIG. 2. As shown in FIG. 3, the gate electrode 32 connected to the gate wiring 22 is disposed on a transparent insulating substrate 31. A gate insulating film 33 is disposed thereover. A semiconductor layer 34 is further disposed thereon such that the semiconductor layer 34 is superimposed on the gate electrode 32. A channel protective layer 35 is disposed on a central portion of the semiconductor layer 34. An n+Si layer constituting a source electrode 36a and a drain electrode 36b is disposed over both ends of the channel protective layer 35 and a portion of the semiconductor layer 34 such that the n+Si layer is divided, into the electrodes 36a and 36b, at the position on the channel protective layer 35. The source wiring 23 which has a two-layer structure comprising a transparent conductive film 37a and a metal layer 38a is formed on the end of the source electrode 36a composed of one of the n+Si layers. Moreover, a transparent conductive film 37b and a metal layer 38b are disposed on the end of the drain electrode 36b composed of the other n+Si layer. The transparent conductive film 37b extends to connect the drain electrode 36b and the pixel electrode 21 and forms the connection electrode 25 connected to the additional capacity electrode (not shown) serving as one electrode for additional capacity. The TFT 24 mainly comprises: the gate electrode 32; the semiconductor layer 34; the source electrode 36a and the drain electrode 36b; and the gate insulating film 33 interposed between the gate electrode 32 and the semiconductor 34. Furthermore, an interlayer insulating film 39 is disposed over the TFT 24, the gate wiring 22, the source wiring 23, and the connection electrode 25. On this interlayer insulating film 39, a transparent conductive film serving as the pixel electrode 21 is disposed and connected to the drain electrode 36b of the TFT 24 by the connection electrode 25 via the contact hole 26 that penetrates the interlayer insulating film 39.

The active matrix substrate of the present embodiment is constituted in this way. This active matrix substrate can be produced, for example, as follows.

First, the gate electrode 32, the gate insulating film 33, the semiconductor layer 34, the channel protective layer 35, and the n+Si layers serving as the source electrode 36a and the drain electrode 36b are sequentially formed as films on the transparent insulating substrate 31 (e.g., glass substrate). This preparation process can be performed in the same way as in a method for producing a conventional active matrix substrate.

Next, the transparent conductive films 37a and 37b and the metal layers 38a and 38b constituting the source wiring 23 and the connection electrode 25 are sequentially formed as films by a sputtering method and patterned into a predetermined form.

Furthermore, the radiation-sensitive composition for forming the interlayer insulating film 39 is applied thereonto at a film thickness of, for example, 2 μm, by a spin coating method to form an applied coating. The formed applied film is exposed to light via a mask and subjected to development treatment using an alkaline solution to form the interlayer insulating film 39. In this procedure, only the light-exposed portion is etched by the alkaline solution to form the contact hole 26 that penetrates the interlayer insulating film 39.

Then, the transparent conductive film constituting the pixel electrode 21 is formed by a sputtering method and patterned. As a result, the pixel electrode 21 is connected, via the contact hole 26 that penetrates the interlayer insulating film 39, to the transparent conductive film 37*b* connected to the drain electrode 36*b* of the TFT 24. In this way, the active matrix substrate can be produced.

The active matrix substrate thus obtained has the interlayer insulating film 39 formed at a large film thickness between the gate wiring 22/source wiring 23/TFT 24 and the pixel electrode 21. Therefore, this active matrix substrate can allow the pixel electrode 21 to overlap with the wirings 22 and 23 and the TFT 24 and can have a flattened surface. Thus, for example, in a liquid-crystal display comprising: the active matrix substrate; an opposite substrate disposed to face this active matrix substrate; and an liquid-crystal layer interposed between the active matrix substrate and the opposite substrate, its aperture ratio can be improved. In addition, an electric field attributed to the wiring 22 or 23 can be shielded by the pixel electrode 21 to reduce disclination.

The interlayer insulating film 39 formed from the radiation-sensitive composition has a relative permittivity value of 3.0 to 3.8, which is lower than that of an inorganic film (relative permittivity of silicon nitride: 8). Moreover, the interlayer insulating film 39 also has high transparency and has a film thickness that can be increased easily by a spin coating method. Therefore, the capacity between the gate wiring 22 and the pixel electrode 21 and the capacity between the source wiring 23 and the pixel electrode 21 can be decreased, resulting in a small time constant. As a result, the influence (e.g., crosstalk), on display, of the capacity component between the wiring 22 or 23 and the pixel electrode 21 can be reduced to offer favorable bright display. Moreover, the patterning using light exposure and alkali development can achieve a favorable taper shape of the contact hole 26. Therefore, the pixel electrode 21 and the connection electrode 37*b* can have a good connection therebetween. Furthermore, the use of the radiation-sensitive composition can permit formation of a thin film using a spin coating method. Therefore, a film having a film thickness as thin as a few μm can be formed easily. Furthermore, the use of the radiation-sensitive composition eliminates the need of a photoresist step for patterning and is thus advantageous in terms of productivity. In this context, the radiation-sensitive composition used for forming the interlayer insulating film 39 generally has color before application and however, can be made more transparent through whole-surface light exposure treatment after patterning Thus, the treatment to make the resin transparent can be performed not only optically but also chemically.

The light exposure of the radiation-sensitive composition generally employs light beams of a mercury lamp including emission lines of i rays (wavelength: 365 nm), h rays (wavelength: 405 nm), and g rays (wavelength: 436 nm) It is preferred that a radiation-sensitive composition that has radiation sensitivity (absorption peak) to i rays having the highest energy (the shortest wavelength) among these emission lines should be used as the radiation-sensitive composition. As a result, processing accuracy for the contact hole can be enhanced. In addition, stain attributed to the photosensitizer can be minimized. Additionally, short-wavelength UV light from excimer laser may be used.

In this way, the transmittance of a liquid-crystal display can be enhanced by using the interlayer insulating film formed from the radiation-sensitive composition. Thus, higher brightness of a liquid-crystal display and lower power consumption resulting from a reduced light quantity from a backlight can be achieved.

Moreover, when the interlayer insulating film 39 is formed at a larger film thickness (i.e., a few μm) than that of a conventional interlayer insulating film, it is preferred that the interlayer insulating film should have as high transmittance as possible. The film thickness of the interlayer insulating film 39 is, for example, but not limited to, 3 μm and can be set appropriately in consideration of light transmittance or permittivity. In this context, the film thickness of the interlayer insulating film 39 is preferably approximately 1 μm or larger, more preferably approximately 1.5 μm or larger, for making the capacity sufficiently small.

Furthermore, the formation of the transparent conductive film 37*b* as the connection electrode 25 that connects the drain electrode 36*b* of the TFT 24 to the pixel electrode 21 offers the following advantages. Specifically, in a conventional active matrix substrate, this connection electrode was formed with a metal layer and therefore caused reduction in aperture ratio when existing in an opening For preventing this, a method has conventionally been used, in which the connection electrode is formed on a drain electrode of TFT, and a contact hole of an interlayer insulating film is formed thereon to connect the drain electrode of TFT to a pixel electrode. However, in this conventional method, the contact hole could not be disposed completely on the TFT, particularly when the TFT was reduced in size for improving an aperture ratio. This was responsible for a reduced aperture ratio. Moreover, when the interlayer insulating film was formed at a film thickness as thick as a few μm, the contact hole had to be formed in a taper shape for bringing the pixel electrode into contact with the connection electrode disposed in the lower layer. Furthermore, the connection electrode region on the TFT had to be large. For example, when the contact hole has a diameter of 5 μm, the connection electrode must have a size of approximately 14 μm in consideration of the taper region of the contact hole and alignment accuracy. Thus, in the conventional active matrix substrate, the formation of TFT having a smaller size than this size was responsible for a reduced aperture ratio attributed to the connection electrode. By contrast, the active matrix substrate of the present embodiment is free from reduction in aperture ratio, because the connection electrode 25 is formed by the transparent conductive film 37*b*. Moreover, this connection electrode 25 extends such that it also plays a role in connecting the drain electrode 36*b* of the TFT to the additional capacity electrode serving as one electrode for additional capacity formed by the transparent conductive film 37*b*. The active matrix substrate is also free from reduction in aperture ratio attributed to this interconnection, because the extension portion is also formed by the transparent conductive film 37*b*.

Moreover, according to the same process as in the present embodiment, a low-temperature poly-silicon-type liquid-crystal display element, plasma display, organic EL display, or field emission display can also be produced using the radiation-sensitive composition.

Furthermore, the radiation-sensitive composition is also applicable to an insulating material as a member for an electronic device such as a micromachine, MEMS, or sensor.

Figure 4:
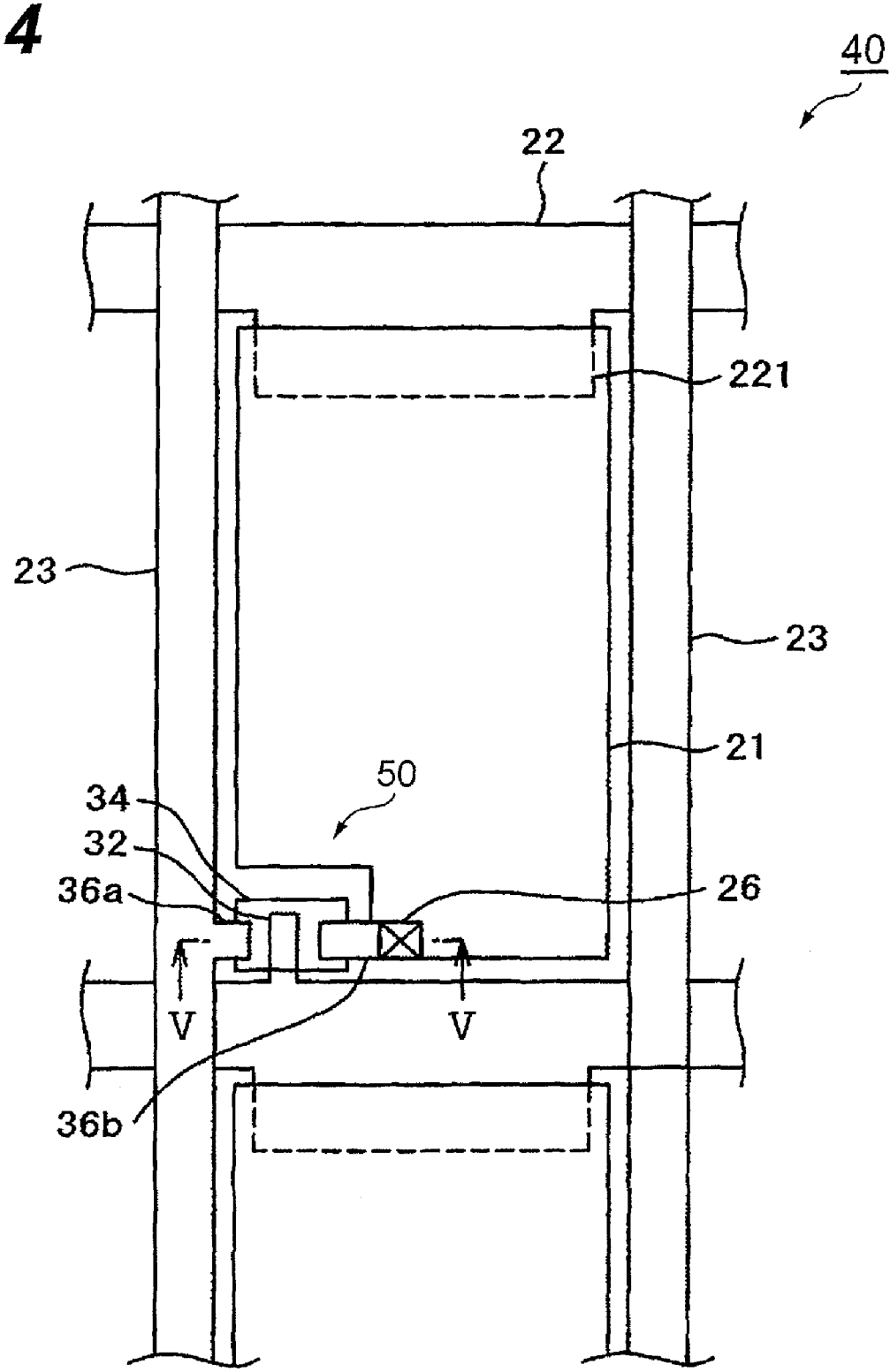
FIG. 4 is a plane view showing the constitution of one pixel portion in a liquid-crystal display according to one embodiment.

FIG. 4 is a plane view showing the constitution of one pixel portion in a liquid-crystal display according to one embodiment of the present invention. A liquid-crystal display 40 shown in FIG. 4 comprises: two gate wirings 22 arranged in the lengthwise direction; and two source wirings 23 arranged in the crosswise direction. Pixel regions each surrounded by these wirings are arranged in a matrix form. In the pixel region, a pixel electrode 21 made of ITO is formed. The pixel electrode 21 occupies the most part of the pixel region. A TFT 50 that controls signals to the pixel electrode is formed in the lower left of the pixel region. The gate wiring 22 has a protrusion 221 that protrudes on the pixel electrode 21 side and forms additional capacity between the protrusion 221 and the pixel electrode 21.

Figure 5:
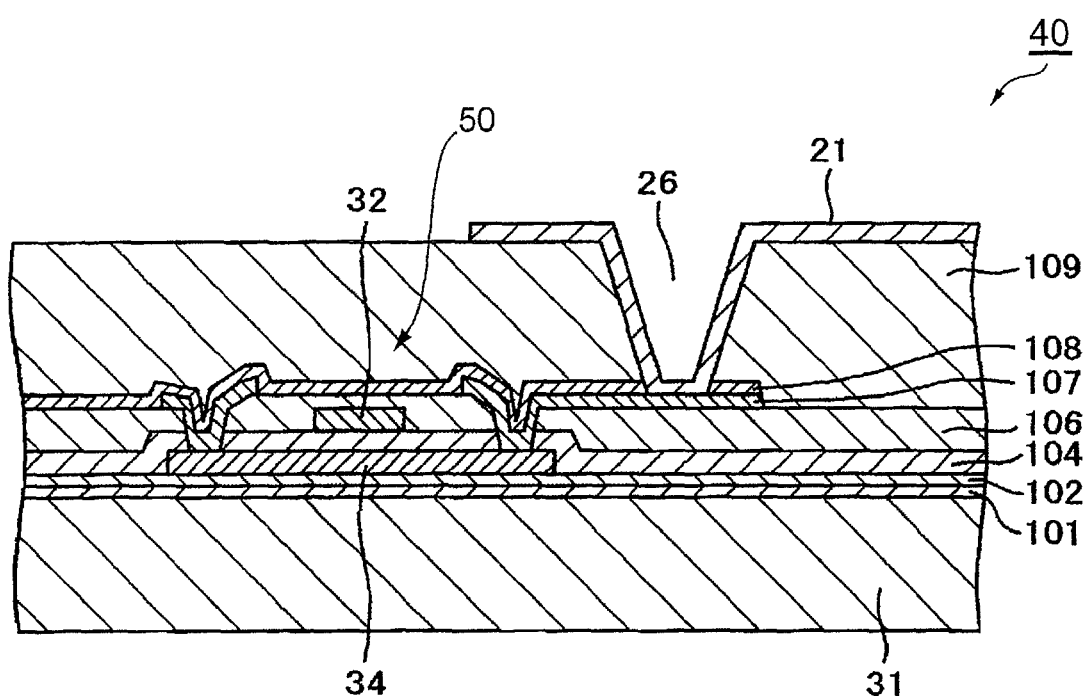
FIG. 5 is a sectional view taken along the V-V' line in the liquid-crystal display of FIG. 4.

FIG. 5 is a sectional view taken along the V-V' line in the liquid-crystal display of FIG. 4. The TFT 50 that is disposed on a glass substrate 31 is a so-called top-gate-type TFT mainly comprising: a semiconductor layer 34; a gate electrode 32; a gate insulating film 104 interposed therebetween; and a source/drain electrode 107. Two-layer films, an SiN film 101 and an $SiO_2$ film 102, are formed as a base coat on the glass substrate 31. Both the films are formed for preventing the semiconductor layer from being contaminated with impurities from the glass substrate 31. An a-Si film is formed as the semiconductor layer 34 on the base coat. The a-Si film may be converted to, for example, a poly-silicon film, using excimer laser. The gate insulating film 104 is made of $SiO_2$ or SiN or the like and formed over the semiconductor layer 34 and the $SiO_2$ film 102. The gate electrode 32 which has a smaller surface area than that of the semiconductor layer 34 is made of MoW or the like and formed on a portion corresponding, on the gate insulating film 104, to the semiconductor layer 34.

An interlayer insulating film 106 is made of $SiO_2$ or SiN or the like and formed over the gate electrode 32 and the gate insulating film 104. The source/drain electrode 107 has two sites. The source/drain electrode 107 at one of the sites is formed over a portion of the interlayer insulating film 106 on the left side of the gate electrode 32. A portion of the source/drain electrode 107 at this site penetrates the interlayer insulating film 106 and the gate insulating film 104 and is in contact with the semiconductor layer 34. The source/drain electrode 107 at the other site is formed over a portion of the interlayer insulating film 106 on the right side of the gate electrode 32. A portion of the source/drain electrode 107 at this site penetrates the interlayer insulating film 106 and the gate insulating film 104 and is in contact with the semiconductor layer 34.

An inorganic passivation film 108 is formed over the source/drain electrode 107 and the interlayer insulating film 106. The end, on the left side of the gate electrode 32, of the inorganic passivation film 108 is at the same position as the end of the source/drain electrode 107 at the other site. Furthermore, an organic passivation film 109 for surface flattening is formed over the interlayer insulating film 106 and the inorganic passivation film 108. A contact hole 26 is formed to penetrate the organic passivation film 109 and the inorganic passivation film 108. The pixel electrode 21 is formed over the wall surface of the contact hole 26 and the source/drain electrode 107 and over the partial surface of the organic passivation film 109 around the contact hole 26. The pixel electrode 21 is a transparent conductive film. Signal voltage is applied via the portion, over the wall surface of the contact hole 26, of the pixel electrode 21. Furthermore, an oriented film (not shown) is formed over this pixel electrode 21.

The TFT comprised in the liquid-crystal display of the present embodiment is thus constituted and can be produced, for example, as follows.

First, the SiN film 101, the $SiO_2$ film 102, the semiconductor layer 34, and the gate insulating film 104 are sequentially formed as films on the glass substrate 31. Methods previously known in the art can be used for forming these films.

Next, a layer made of MoW or the like is formed on the gate insulating film 104 by sputtering. Then, the gate electrode 32 is formed by photolithography. Using this gate electrode 32 as a mask, an $N^+$ region is formed in the semiconductor layer by ion implantation to form a source/drain region.

The interlayer insulating film 106 is formed on a gate wiring (not shown) containing the gate electrode 32. The through-hole 26 for securing electric contact is formed in the interlayer insulating film 106. Then, a laminated film made of Al—Si and MoW or the like is attached thereto by sputtering, and the source/drain electrode 107, the source wiring 23, etc., are formed by photolithography. Then, the inorganic passivation film 108 is formed using SiN for protecting the TFT.

The organic passivation film 109 for surface flattening is formed over the inorganic passivation film 108 using the radiation-sensitive composition of the present invention. Since the radiation-sensitive composition of the present invention has photosensitivity in itself, the contact hole 26 can be formed directly without using other resists. Then, ITO is formed by sputtering to form the pixel electrode 21.

An object of the organic passivation film 109 is to flatten the surface on the liquid-crystal layer side. A silica-based coating (organic insulating film) formed using the radiation-sensitive composition of the present invention can be prepared easily at a film thickness of 1 μm or larger and has excellent flattening properties. Moreover, the organic passivation film 109 in the present embodiment is also formed under the pixel electrode 21 and therefore requires high transparency. The silica-based coating can easily secure excellent transparency through UV irradiation or the like and is therefore suitable as a material for such an organic passivation film according to the present embodiment.

In the description above, the silica-based coating formed from the radiation-sensitive composition is used as the organic passivation film 109. However, the silica-based coating formed from the radiation-sensitive composition can also be used as the gate insulating film 104 or the interlayer insulating film 106.

Figure 6:
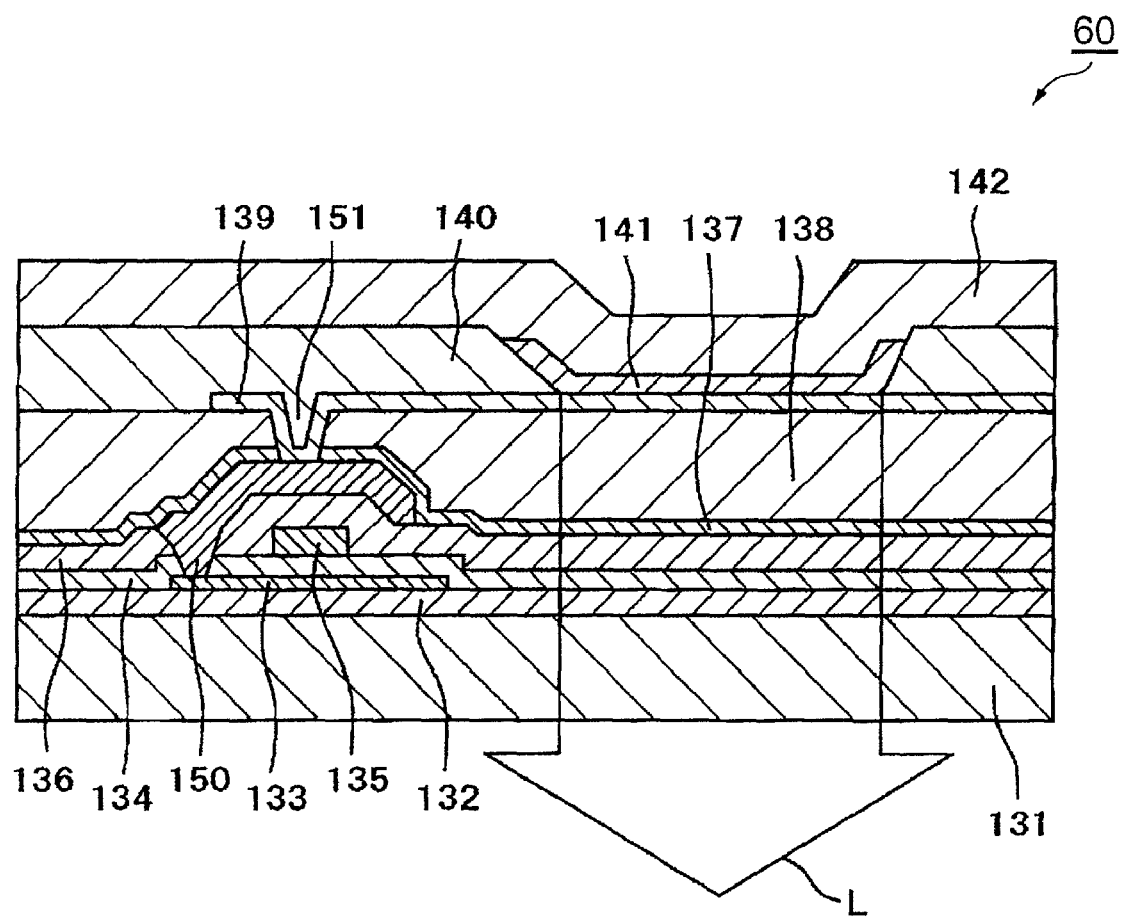
FIG. 6 is a sectional view showing one embodiment of an organic EL display.

FIG. 6 is a sectional view showing one embodiment of an organic EL display. In an organic EL display 60 shown in FIG. 6, a base coat 132 is formed on a glass substrate 131. A semiconductor layer 133 constituting TFT is formed on the base coat 132. A gate insulating film 134 is formed over the semiconductor layer 133. A gate electrode 135 is formed on the gate insulating film 134. An interlayer insulating film 136 is formed over the gate electrode 135. A source/drain (SD) wiring 137 made of the same layer as a source wiring is formed on the interlayer insulating film 136. The SD wiring layer 137 is connected to the drain portion of the semiconductor layer 133 through a contact hole 150 formed in the interlayer insulating film 136 and the gate insulating film 134. An inorganic passivation film 137 for protecting TFT is made of SiN and formed over the SD wiring 136. This inorganic passivation film 137 is sometimes omitted when an organic passivation film 138 described below is formed.

A silica-based coating (insulating film) is formed as the organic passivation film 138 for surface flattening on the inorganic passivation film 137 using the radiation-sensitive composition of the present invention. The organic passivation film 138 is formed at a thickness of 1 μm to 2 μm. The organic passivation film 138 requires forming thereon a contact hole. Since the radiation-sensitive composition of the present invention has photosensitivity in itself, the contact hole can be formed directly without using resists. When the inorganic passivation film 137 is also formed, a contact hole 151 can be formed in the inorganic passivation film 137 using the organic passivation film 138 as a mask. Moreover, the use of the radiation-sensitive composition of the present invention can permit formation of the contact hole 151 on TFT and can therefore increase the light-emitting area of the organic EL film.

An ITO film as a lower electrode 139 of an organic EL layer 141 is formed on the organic passivation film 138. In this case, the ITO film 139 serves as a positive electrode for the organic EL layer 141. After the formation of the lower electrode 139, a bank 140 for isolating each pixel is formed with an organic film. Conventionally, polyimide, an acrylic resin, or the like has been used as a material for the bank 140. A silica-based coating (organic film) formed from the radiation-sensitive composition of the present invention is also a suitable material as the bank 140. The silica-based coating for use as the bank 140 is formed on the whole surface of a screen and removed by etching except for the bank 140. Since the radiation-sensitive composition of the present invention has photosensitivity in itself, the etching can be performed without using resists.

The portion removed by etching is a portion constituting a pixel. In this portion, the organic EL layer 141 is formed by deposition. The organic EL layer 141 is formed with plural layers including a hole-injecting layer, a hole-transporting layer, a light-emitting layer, an electron-transporting layer, an electron-injecting layer, etc., from the lower electrode 139 side. A top electrode 142 is made of a metal, for example, Al or Al alloy, and formed over the organic EL layer 141. In this case, the top electrode 142 serves as a negative electrode. Light emitted by the organic EL layer 141 moves in the direction of the arrow L (to the bottom), while light moving toward the top of the screen also moves in the direction of the arrow L (to the bottom) due to reflection by the top electrode 142.

The organic passivation film 138 is used for surface flattening For this purpose, it must be formed at a thickness of 1 μm or larger. On the other hand, in a bottom emission type, light emitted by the organic EL layer 141 passes through the organic passivation film 138 and forms an image. Thus, the organic passivation film 138 must have high transmittance. A silica-based coating formed from the radiation-sensitive composition of the present invention can easily acquire high transmittance through UV irradiation or the like and is therefore suitable for an organic EL display. The organic EL layer 141 cannot be irradiated with UV light. However, this does not matter, because the organic passivation film or the bank is formed before the deposition of the organic EL layer. In the present embodiment, the silica-based coating formed from the radiation-sensitive composition of the present invention is used in both the organic passivation film and the bank. Of course, it may be used in either of them.

In the description above, the silica-based coating formed from the radiation-sensitive composition is used as the organic passivation film 138 or the bank 140. However, the silica-based coating formed from the radiation-sensitive composition can also be used as the gate insulating film 134 or the interlayer insulating film 136.

Examples

Hereinafter, specific Examples according to the present invention will be described. However, the present invention is not intended to be limited to these Examples.

Synthesis of 3-acetoxypropyltrimethoxysilane

To a 1-L four-neck flask equipped with a stirrer, a reflux condenser, a dropping funnel, and a thermometer, 500 g of toluene, 250.0 g (1.258 mol) of 3-chloropropyltrimethoxysilane, and 129.6 g (1.321 mol) of potassium acetate were added and stirred. 5.84 g (0.0181 mol) of tetra-n-butylammonium bromide was added thereto, and the mixture was reacted at 90 to 100° C. for 2 hours. Next, after cooling, formed salts were suction-filtered off to obtain a yellow solution. Toluene in the obtained solution was evaporated under reduced pressure using an evaporator. The residue was further distilled under reduced pressure to obtain 162.8 g (0.732 mol) of a clear, colorless distillate at a distillation temperature of 80 to 81° C. under a reduced pressure of 0.4 kPa. The obtained distillate was determined to have a GC purity of 99.0% as a result of GC analysis and to be 3-acetoxypropyltrimethoxysilane as a result of NMR and IR analyses.

The spectral data of the obtained compound is shown below.

Infrared absorption spectrum (IR) data:
2841, 2945 cm$^{-1}$ (—CH3), 1740 cm$^{-1}$ (—COO—), 1086 cm$^{-1}$ (Si—O) nuclear magnetic resonance (NMR) data ($^1$H-NMR solvent: CDCl$_3$): 0.644-0.686 ppm (dd, 2H, —CH$_2$—), 1.703-1.779 ppm (m, 2H, —CH$_2$—), 2.045 ppm (s, 3H, CH$_3$CO—), 3.575 ppm (s, 9H, CH$_3$O—), 4.019-4.052 ppm (t, 2H, —COO—CH$_2$—).

Synthesis of Siloxane Resin

Synthesis of siloxane resin A: 3-acetoxypropylsilsesquioxane/phenylsilsesquioxane/methylsilsesquioxane copolymer (compound represented by the formula (10) shown below; which corresponds to the compound (a));

[Chemical Formula 18]

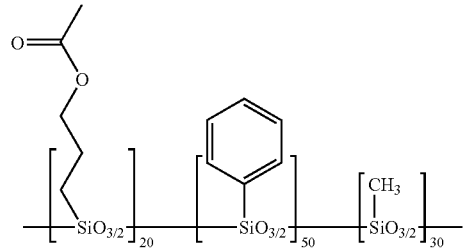

(10)

wherein 20, 50, and 30 represent molar ratios of raw materials corresponding to their respective sites.

A 500-mL four-neck flask equipped with a stirrer, a reflux condenser, a dropping funnel, and a thermometer was charged with 55.8 g of toluene and 35.7 g of water, and 3.12 g (0.03 mol) of 35% hydrochloric acid was added thereto. Next, a solution of 13.5 g (0.0605 mol) of 3-acetoxypropyltrimethoxysilane obtained by the method, 30.0 g (0.151 mol) of phenyltrimethoxysilane, and 12.4 g (0.0908 mol) of methyltrimethoxysilane in 27.9 g of toluene was added dropwise to the mixture at 20 to 30° C. After the completion of dropping, the solution was aged at the same temperature as above for 2 hours. This reaction solution was demonstrated to be free from the residual raw materials as a result of GC analysis. Next, to the reaction solution, toluene and water were added for extraction. The extract was washed with an aqueous sodium bicarbonate solution. Then, the solution was washed with water until it became neutral. The organic layer was recovered, and toluene was removed to obtain 34.6 g of the siloxane resin A of interest in a viscous liquid state. The obtained siloxane resin A was further dissolved in propylene glycol monomethyl ether acetate to obtain a siloxane resin A solution having a solid content concentration adjusted to 50% by mass. Moreover, the weight-average molecular weight of the siloxane resin A was measured by a GPC method and determined to be 1050.

Synthesis of siloxane resin B: 3-acetoxypropylsilsesquioxane/2-norbornylsilsesquioxane/methylsilsesquioxane copolymer (compound represented by the formula (5) shown below; which corresponds to the component (a));

[Chemical Formula 19]

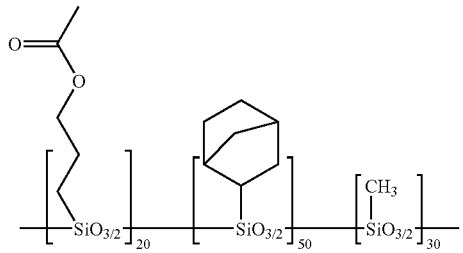

(5)

wherein 20, 50, and 30 represent molar ratios of raw materials corresponding to their respective sites.

38.7 g of the siloxane resin B of interest was obtained by the same procedures as in the method for synthesizing the siloxane resin A except that 30.0 g (0.151 mol) of phenyltrimethoxysilane was changed to 39.0 g (0.151 mol) of 2-norbornyltriethoxysilane. The obtained siloxane resin B was further dissolved in propylene glycol monomethyl ether acetate to obtain a siloxane resin B solution having a solid content concentration adjusted to 50% by mass. Moreover, the weight-average molecular weight of the obtained siloxane resin B was measured by a GPC method and determined to be 1020.

Synthesis of siloxane resin C: (5-acetoxynorbornan-2 (or -3)-yl)silsesquioxane/phenylsilsesquioxane/methylsilsesquioxane copolymer (compound represented by the formula (20) shown below; which corresponds to the compound (a));

[Chemical Formula 20]

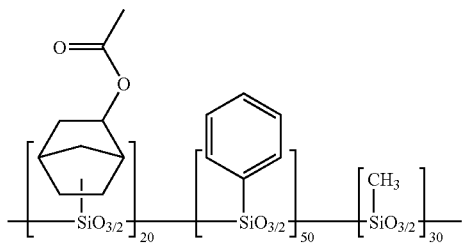

(20)

wherein 20, 50, and 30 represent molar ratios of raw materials corresponding to their respective sites.

38.7 g of the siloxane resin C of interest was obtained by the same procedures as in the method for synthesizing the siloxane resin A except that 13.5 g (0.0605 mol) of 3-acetoxypropyltrimethoxysilane was changed to 39.0 g (0.151 mol) of (5-acetoxynorbornan-2 (or -3)-yl)triethoxysilane. The obtained siloxane resin C was further dissolved in propylene glycol monomethyl ether acetate to obtain a siloxane resin C solution having a solid content concentration adjusted to 50% by mass. Moreover, the weight-average molecular weight of the siloxane resin C was measured by a GPC method and determined to be 1050.

Synthesis of siloxane resin D: 3-acetoxypropylsilsesquioxane/phenylsilsesquioxane copolymer (compound represented by the formula (6) shown below; which corresponds to the component (a));

[Chemical Formula 21]

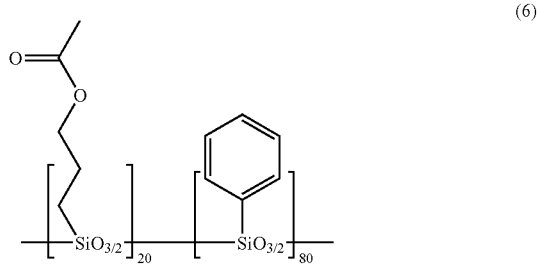

(6)

wherein 20 and 80 represent molar ratios of raw materials corresponding to their respective sites.

A 500-mL four-neck flask equipped with a stirrer, a reflux condenser, a dropping funnel, and a thermometer was charged with 38.4 g of methanol and 21.0 g of water, and 1.13 g (0.0189 mol) of acetic acid was added thereto. Next, a solution of 8.41 g (0.0378 mol) of 3-acetoxypropyltrimethoxysilane obtained by the method and 30.0 g (0.151 mol) of phenyltrimethoxysilane in 19.2 g of methanol was added dropwise to the mixture at 20 to 30° C. After the completion of dropping, the solution was aged at the same temperature as above for 2 hours. This reaction solution was demonstrated to be free from the residual raw materials as a result of GC analysis. Next, toluene was added thereto for extraction. The extract was washed with an aqueous sodium bicarbonate solution. Then, the solution was washed with water until it became neutral. The organic layer was recovered, and toluene was removed to obtain 24.6 g of the compound of interest in a viscous liquid state. The obtained compound was further dissolved in propylene glycol monomethyl ether acetate to obtain a solution having a solid content concentration adjusted to 50% by mass. The weight-average molecular weight of the compound was measured by a GPC method and determined to be 1100.

Synthesis of comparative siloxane resin A: phenylsilsesquioxane (compound represented by the formula (7) shown below);

[Chemical Formula 22]

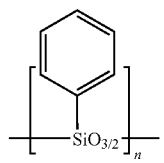

(7)

wherein n represents an integer.

A 500-mL four-neck flask equipped with a stirrer, a reflux condenser, a dropping funnel, and a thermometer was charged with 55.8 g of toluene and 35.7 g of water, and 3.12 g (0.03 mol) of 35% hydrochloric acid was added thereto. Next, a solution of 48.0 g (0.242 mol) of phenyltrimethoxysilane in 27.9 g of toluene was added dropwise to the mixture at 20 to 30° C. After the completion of dropping, the solution was aged at the same temperature as above for 2 hours. This reaction solution was demonstrated to be free from the residual raw materials as a result of GC analysis. Next, toluene and water were added thereto for extraction. The extract was washed with an aqueous sodium bicarbonate solution. Then, the solution was washed with water until it became neutral. The organic layer was recovered, and toluene was removed to obtain 34.6 g of the comparative siloxane resin A of interest in a viscous liquid state. The obtained comparative siloxane resin A was further dissolved in propylene glycol monomethyl ether acetate to obtain a comparative siloxane resin A solution having a solid content concentration adjusted to 50% by mass. Moreover, the weight-average molecular weight of the obtained comparative siloxane resin A was measured by a GPC method and determined to be 1000.

Synthesis of siloxane resin E (which corresponds to the component (d));

A 2000-mL four-neck flask equipped with a stirrer, a reflux condenser, a dropping funnel, and a thermometer was charged with a solution of 317.9 g of tetraethoxysilane and 247.9 g of methyltriethoxysilane dissolved in 1116.7 g of diethylene glycol dimethyl ether, and 167.5 g of nitric acid having a concentration adjusted to 0.644% by mass was added dropwise thereto over 30 minutes under stirring. After the completion of dropping, the solution was reacted for 3 hours. Then, formed ethanol and a portion of diethylene glycol dimethyl ether were evaporated under reduced pressure in a hot bath to obtain 740.0 g of a siloxane resin E solution having a solid content concentration adjusted to 25%. The weight-average molecular weight of the siloxane resin E was measured by a GPC method and determined to be 870.

Synthesis of Naphthoquinonediazide Sulfonic Acid Ester

Synthesis of naphthoquinonediazide sulfonic acid ester A (which corresponds to the component (c));

A 200-mL four-neck flask equipped with a stirrer, a reflux condenser, a dropping funnel, and a thermometer was charged with 100.7 g of methanol. 10.75 g of 1,2-diazonaphthoquinone-5-sulfonyl chloride, 4.05 g of triethylamine, and 0.5 g of dimethylaminopyridine were further added thereto under a room temperature (25° C.) condition and reacted under a room temperature (25° C.) condition for 4 hours. After the completion of reaction, precipitated solid contents were filtered off The filtered-off solid contents were dissolved by the addition of 300 g of methyl isobutyl ketone and then washed with 50 g of ion-exchange water three times. The solvent in the organic layer was removed under reduced pressure in a hot bath to obtain 8.2 g of the naphthoquinonediazide sulfonic acid ester A in a powdery state. This compound was dissolved in tetrahydrofuran to obtain 17.1 g of a naphthoquinonediazide sulfonic acid ester A solution having a solid content concentration adjusted to 48% by mass.

Synthesis of naphthoquinonediazide sulfonic acid ester B (which corresponds to the component (c));

A 200-mL four-neck flask equipped with a stirrer, a reflux condenser, a dropping funnel, and a thermometer was charged with 2.68 g of dipropylene glycol and 50 g of tetrahydrofuran. 10.75 g of 1,2-diazonaphthoquinone-5-sulfonyl chloride, 4.45 g of triethylamine, and 0.5 g of dimethylaminopyridine were further added thereto under a room temperature (25° C.) condition and reacted at 50° C. for 4 hours. After the completion of reaction, precipitated solid contents were filtered off, and the solvent was removed therefrom under reduced pressure in a hot bath. Then, the residue was dissolved by the addition of 50 g of methyl isobutyl ketone and then washed with 50 g of ion-exchange water twice. The solvent was removed therefrom under reduced pressure in a hot bath to obtain 10.2 g of the naphthoquinonediazide sulfonic acid ester B in an oil state. 7.3 g thereof was placed in a container equipped with a stirrer. 7.7 g of 3,4-dihydro-2H-pyrane, 50 g of propylene glycol methyl ether acetate, and 2.9 g of a 5% aqueous $HNO_3$ solution were further added thereto and reacted at room temperature (25° C.) for 72 hours. After the completion of reaction, 70 g of methyl isobutyl ketone was added thereto, and the mixture was further washed with 70 g of a 0.5% aqueous tetramethylammonium hydroxide (TMAH) solution and subsequently with 70 g of ion-exchange water twice. Then, the organic layer was separated therefrom. This solution was concentrated under reduced pressure in a hot bath to obtain 9.6 g of a naphthoquinonediazide sulfonic acid ester B solution having a solid content concentration of 48%.

Preparation of Photosensitive Resin Composition

Example 1A

To 4.2 g of the siloxane resin A solution, 3.6 g of the siloxane resin E solution and 0.44 g of the naphthoquinonediazide sulfonic acid ester A solution were added and dissolved by stirring at room temperature (25° C.) for 30 minutes to prepare a photosensitive resin composition of Example 1A.

Example 2A

To 4.2 g of the siloxane resin B solution, 3.6 g of the siloxane resin E solution and 0.44 g of the naphthoquinonediazide sulfonic acid ester A solution were added and dissolved by stirring at room temperature for 30 minutes to prepare a photosensitive resin composition of Example 2A.

Example 3A

To 4.2 g of the siloxane resin C solution, 3.6 g of the siloxane resin E solution and 0.44 g of the naphthoquinonediazide sulfonic acid ester A solution were added and dissolved by stirring at room temperature for 30 minutes to prepare a photosensitive resin composition of Example 3A.

Example 4A

To 4.2 g of the siloxane resin D solution, 3.6 g of the siloxane resin E solution and 0.44 g of the naphthoquinonediazide sulfonic acid ester A solution were added and dissolved by stirring at room temperature for 30 minutes to prepare a photosensitive resin composition of Example 4A.

Example 5A

To 4.2 g of the siloxane resin A solution, 3.6 g of the siloxane resin E solution and 0.44 g of the naphthoquinonediazide sulfonic acid ester B solution were added and dissolved by stirring at room temperature for 30 minutes to prepare a photosensitive resin composition of Example 5A.

Example 6A

To 4.2 g of the siloxane resin B solution, 3.6 g of the siloxane resin E solution and 0.44 g of the naphthoquinonediazide sulfonic acid ester B solution were added and dissolved by stirring at room temperature for 30 minutes to prepare a photosensitive resin composition of Example 6A.

Example 7A

To 4.2 g of the siloxane resin C solution, 3.6 g of the siloxane resin E solution and 0.44 g of the naphthoquinonediazide sulfonic acid ester B solution were added and dissolved by stirring at room temperature for 30 minutes to prepare a photosensitive resin composition of Example 7A.

Example 8A

To 4.2 g of the siloxane resin D solution, 3.6 g of the siloxane resin E solution and 0.44 g of the naphthoquinonediazide sulfonic acid ester B solution were added and dissolved by stirring at room temperature for 30 minutes to prepare a photosensitive resin composition of Example 8A.

Comparative Example 1A

To 4.2 g of the comparative siloxane resin A solution, 3.6 g of the siloxane resin E solution and 0.44 g of the naphthoquinonediazide sulfonic acid ester A solution were added and dissolved by stirring at room temperature for 30 minutes to prepare a photosensitive resin composition of Comparative Example 1A.

<Production of Silica-Based Coating>

The photosensitive resin compositions obtained in Examples 1A to 8A and Comparative Example 1A were separately filtered through a PTFE filter. A silicon wafer or glass substrate was spin-coated with each filtrate for 30 seconds at the number of revolutions that allowed a film thickness to be 3.0 μm after solvent removal. Then, the wafer or substrate was dried at 150° C. for 2 minutes, and the solvent was removed. The obtained applied film was exposed to light at a dose of 30 mJ/cm$^2$ using a projection exposure apparatus PLA-600F (manufactured by Canon Inc.) via a predetermined pattern mask. Subsequently, the applied film was subjected to development treatment by an agitation dipping method at 25° C. for 2 minutes using 2.38% by mass of an aqueous tetramethylammonium hydroxide solution. This film was rinsed in running water (pure water) and dried to form a pattern thereon. Subsequently, the whole surface of the pattern portion was exposed to light at a dose of 1000 mJ/cm$^2$ using a projection exposure apparatus PLA-600F (manufactured by Canon Inc.). Subsequently, the pattern was finally cured at 350° C. over 30 minutes in a quartz tube furnace having an O$_2$ concentration controlled to smaller than 1000 ppm to obtain a silica-based coating.

<Evaluation on Coating>

The silica-based coatings formed from the photosensitive resin compositions of Examples 1A to 8A and Comparative Example 1A by the method were evaluated according to methods shown below.

[Resolution Evaluation]

Resolution was evaluated based on whether a 5 μm square through-hole was made according to the pattern in the silica-based coating formed on the silicon wafer. Specifically, the silica-based coating was observed using an electron microscope S-4200 (manufactured by Hitachi Instruments Service Co., Ltd.) and evaluated according to the criteria: A: the 5 μm square through-hole was made therein; and B: the 5 μm square through-hole was not made therein.

[Transmittance Measurement]

The silica-based coating applied on the glass substrate having no absorption in the visible region was measured for its transmittance at 300 nm to 800 nm using an UV-3310 apparatus (manufactured by Hitachi, Ltd.). A value obtained at 400 nm was used as transmittance.

[Heat Resistance Evaluation]

The silica-based coating formed on the silicon wafer was evaluated according to the criteria: A: the rate of decrease of a film thickness after final curing relative to a film thickness after solvent removal is less than 10%; and B: the rate of this decrease is 10% or more. In this context, the film thickness is a film thickness that is measured using an ellipsometer L116B (manufactured by Gaertner Scientific Corp.) and, specifically, determined from a phase difference generated by the He—Ne laser irradiation of the coating.

[Crack Resistance Evaluation]

The silica-based coating formed on the silicon wafer was observed using a metallurgical microscope at a magnification of 10 to 100 times to confirm the presence or absence of a crack within the surface. The silica-based coating was evaluated according to the criteria: A: cracking is absent; and B: a crack is seen.

<Evaluation Results>

The evaluation results of the silica-based coating formed from the photosensitive resin compositions of Examples 1A to 8A and Comparative Example 1A are shown in Table 1 below.

TABLE 1

| Photosensitive resin composition | Resolution | Transmittance | Heat resistance | Crack resistance |
|---|---|---|---|---|
| Example 1A | A | 98% or more | A | A |
| Example 2A | A | 98% or more | A | A |
| Example 3A | A | 98% or more | A | A |
| Example 4A | A | 98% or more | A | A |
| Example 5A | A | 98% or more | A | A |
| Example 6A | A | 98% or more | A | A |
| Example 7A | A | 98% or more | A | A |
| Example 8A | A | 98% or more | A | A |
| Comparative Example 1A | B (light-exposed portion is unsuccessfully developed) | 98% or more | B | A |

Table 1 demonstrates that according to the photosensitive resin compositions of Examples 1A to 8A, a silica-based coating excellent in resolution, heat resistance, crack resistance, and transparency can be obtained. In these Examples, only the photosensitive resin compositions that give a silica-based coating having high transmittance are shown. However, those having low transmittance can also be provided depending on usage.

Example 1B

Synthesis Example 1 of DNQ Sulfonic Acid Ester

Synthesis of the present Example relates to the synthesis of a photosensitizer. Therefore, all procedures must be performed under shading conditions or in an environment from which UV light has been removed. Hereinafter, procedures to at least an insulating film formation step are performed in this environment.

In a container equipped with a stirrer, 300 g of tetrapropylene glycol (TEPG) and 3000 g of tetrahydrofuran were placed. 1000 g of 1,2-diazonaphthoquinone-5-sulfonyl chloride and 100 g of tributylamine were added thereto under a room temperature condition. Then, the mixture was stirred at 50° C. for 4 hours to perform reaction through which sulfonic acid ester was formed from the alcoholic hydroxyl and sulfonyl chloride groups. After reaction, precipitated solid contents were filtered off, and the solvent was removed using a rotary evaporator and replaced by ethyl acetate. Then, the residue was washed with water to obtain a compound (TEPGD) represented by the general formula (57) shown below. An infrared absorption spectrum was measured to confirm that no absorption peak of an alcoholic hydroxyl group was seen and that absorption peaks specific for diazo and sulfonic acid ester groups were present at a wavenumber of 2117 cm$^{-1}$ and at wavenumbers of 1365 cm$^{-1}$ and 1176 cm$^{-1}$, respectively.

The sulfonic acid ester compound of interest was also obtained using triethylamine, tripropylamine, pyridine, sodium hydroxide, sodium carbonate, sodium hydride, or sodium methoxide instead of tributylamine.

[Chemical Formula 23]

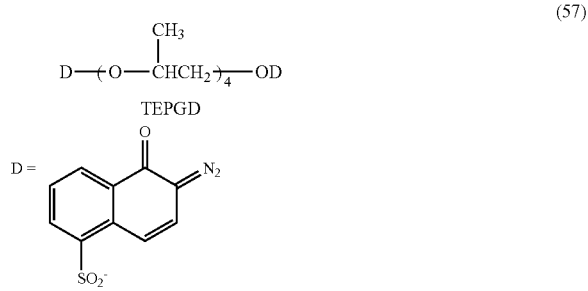

(57)

Preparation of Radiation-Sensitive Composition

In a light-tight bottle, 100 g of the compound TEPGD, 500 g of a methylsiloxane resin having a number-average molecular weight of 2500, and 5000 g of propylene glycol dimethyl ether were mixed and stirred until the solid contents were completely dissolved. Then, the solution was filtered through a 0.2-micron membrane filter to obtain a radiation-sensitive composition (A1) shown in the table of FIG. 7.

Pattern (Interlayer Insulating Film) Formation

A glass substrate was spin-coated with the radiation-sensitive composition (A1) thus prepared at a film thickness of 1.5 µm and prebaked on a hot plate at 120° C. for 5.0 minutes to form an applied coating. This applied film was exposed to light at a dose of 30 mJ/cm$^2$ using a reduced projection exposure apparatus NSR1755i7A (manufactured by Nikon Corp.; NA=0.50, λ=365 nm) via a predetermined pattern mask. Subsequently, the applied film was subjected to development treatment by an agitation dipping method at 25° C. for 2 minutes using 2.38% by weight of an aqueous tetramethylammonium hydroxide solution. This film was rinsed in running water (pure water) and dried to form a pattern thereon. Subsequently, the film was heat-treated (postbaked) in an oven at 350° C. for 60 minutes to obtain a pattern (silica-based coating as an interlayer insulating film) at a film thickness of 1.45 µm.

Presence or Absence of Scum Generation (Observation Using Electron Microscope)

The pattern thus obtained was observed using an electron microscope S-4200 (manufactured by Hitachi Instruments Service Co., Ltd.) and demonstrated to have no detectable scum.

Solvent Resistance Evaluation

A glass substrate having a pattern formed in the same way as above was dipped for 20 minutes in a dimethyl sulfoxide/N-methylpyrrolidone mixed solution (weight ratio: 70/30) temperature-controlled to 25° C. A ratio in film thickness between before and after dipping was calculated according to the equation: the ratio=(t2/T2)×100 [%] wherein the film thickness before dipping is defined as T2; and the film thickness after dipping is defined as t2. Based on this value, "solvent resistance" can be evaluated. When this value is 95 to 105%, the solvent resistance is regarded as being favorable. The result was 101%.

Heat Resistance Evaluation

From a glass substrate having a pattern formed in the same way as above, the patterned thin film was scraped off using a spatula. Subsequently, 0.5 g of this thin film piece was weighed out and heated from room temperature to 350° C. at a heating rate of 10° C./min. using Thermogravimetric Analyzer TGA-2950 model (manufactured by TA Instruments). Then, the sample was kept at 350° C. for 30 minutes. The rate of decrease of a weight after heating relative to a weight before heating was measured. Based on this rate of weight decrease, "heat resistance" can be evaluated. When this value is 3% or less of the weight before heating, the heat resistance is regarded as being favorable. The result was 0.5%.

Transparency Evaluation

A film was formed in the same way as in the interlayer insulating film formation using "Corning 1737 (manufactured by Corning Inc.)" as a glass substrate. The light transmittance of this glass substrate having an interlayer insulating film formed thereon was measured at a wavelength ranging from 380 to 800 nm using a spectrophotometer "V-550 (manufactured by JASCO Corp.)". When the transmittance per µm of a thickness after postbaking at 350° C. for 30 minutes is 95% or more, the transparency is regarded as being excellent; when this transmittance is 80% or more and less than 95%, the transparency is regarded as being favorable; and when this transmittance is less than 80%, the transparency is regarded as being poor. The result after postbaking at 350° C. for 30 minutes was 97%.

Flattening Performance Evaluation

The composition was applied at a film thickness of 1.2 µm by spin coating onto a patterned silicon wafer substrate having an aluminum pattern with 20 µm line/80 µm space and a thickness of 1 µm. Subsequently, the substrate was prebaked at 120° C. for 3 minutes and further heated at 350° C. for 60 minutes to form a substrate with a thin film (film thickness: 1.0 µm with respect to the silicon wafer substrate surface) for flattening performance evaluation. This substrate with a thin film was measured for surface irregularities using α-Step (manufactured by KLA-Tencor Corp.). Based on the maximum difference in the height of the irregularities, "flattening performance" can be evaluated. When this value is 0.2 µm or smaller, the flattening performance is regarded as being favorable. The measurement result was 0.1 µm.

Resolution Evaluation

A thin film for resolution evaluation was formed in the same way as in the paragraph "Pattern (interlayer insulating film) formation" except that a pattern mask having a pattern of a 2 µm square through-hole was used as a pattern mask used in the light exposure step. This thin film was observed using an electron microscope S-4200 (manufactured by Hitachi Instruments Service Co., Ltd.) and evaluated based on whether a 2 µm square through-hole was made therein according to the pattern. When the 2 µm square through-hole is made therein according to the pattern, the resolution is regarded as being favorable. The observation result was that the 2 µm square through-hole was made therein according to the pattern. In the table of FIG. 7, "Opening" shown in the column "Hole formation" means that the 2 µm square through-hole was made therein according to the pattern.

Relative Permittivity Measurement

An aluminum coating was formed at a thickness of 0.1 µm onto each interlayer insulating film by a vacuum deposition method. This sample was measured for relative permittivity using an LF impedance meter at a frequency of 10 kHz. When this relative permittivity is 4 or smaller, the insulating film is regarded as being favorable. The measurement result was 3.2. These evaluation results are shown in the table of FIG. 7.

Elementary Analysis on Interlayer Insulating Film

The obtained interlayer insulating film was subjected to elementary analysis. The interlayer insulating film was demonstrated to comprise silicon of 35% or higher in terms of a weight ratio and 28% or higher in terms of a molar ratio. It was also demonstrated to comprise 100 ppm sulfur.

Discussion about Siloxane Compound

In these evaluations, favorable properties were obtained using TEPGD synthesized in the present Example, even when a methylsiloxane resin having a number-average molecular weight of 1500, 5000, or 10000, HSG-R7 manufactured by Hitachi Chemical Co., Ltd., a phenylmethylsiloxane resin having a number-average molecular weight of 500, 1000, 1500, 2500, or 5000, or a phenylsiloxane resin having a number-average molecular weight of 500, 1000, 1500, 2500, or 5000 were separately used instead of the methylsiloxane resin having a number-average molecular weight of 2500.

Example 2B

Synthesis Example 2 of DNQ Sulfonic Acid Ester

In the present Example, DNQ sulfonic acid ester compounds comprising 35 alcohols other than TEPG and 1,2-diazonaphthoquinone-5-sulfonyl chloride (1DNQ5) were synthesized in the same way as in the synthesis method of Example 1B.

The alcohols separately used were 2-ethoxypropanol (2EP), 1-butanol, diethylene glycol (DEG), triethylene glycol (TREG), tetraethylene glycol (TEEG), pentaethylene glycol (PEEG), polyethylene glycol having an average molecular weight of 400 (PEG400), dipropylene glycol (DPG), tripropylene glycol (TRPG), tetrapropylene glycol (TEPG), pentapropylene glycol (PEPG), polypropylene glycol having an average molecular weight of 425 (PPG425), polypropylene glycol having an average molecular weight of 725 (PPG725), polypropylene glycol having an average molecular weight of 1000 (PPG1000), 1,4-cyclohexanediol (CyD), 1,5-pentanediol (PD), neopentyl glycol (NPG), trimethylolethane (TMM), trimethylolpropane (TMP), pentaerythritol (PET), dipentaerythritol (DPET), an ethylene glycol adduct of glycerin (EGG), a propylene glycol adduct of glycerin (PGG), 1,4-cyclohexanedimethanol (CyDM), tetrahydrofurfuryl alcohol (THFA), 1,6-hexanediol (HD), 1,7-heptanediol (HpD), 1,8-octanediol (OD), 1,9-nonanediol (ND), p-xylylene glycol (XyD), 2,2-dimethyl-1,3-propanediol (DMPD), 2,2,4-trimethyl-1,3-pentanediol (TMPD), 3,9-bis(1,1-dimethyl-2-hydroxyethyl)-2,4,8,10-tetraoxaspiro[5.5]undecane (BDTU), 2,2-diisoamyl-1,3-propanediol (DIAPP), 2,2-diisobutyl-1,3-propanediol (DIBPP), 2,2-di-n-octyl-1,3-propanediol (DOPP), 2-ethyl-2-methyl-1,3-propanediol (EMPP), or 2-methyl-2-propyl-1,3-propanediol (MPPD).

The DNQ sulfonic acid ester compound derived from each alcohol was obtained at a yield of 50 to 93%. When the polyhydric alcohol was used as a starting material, the DNQ sulfonic acid ester as a product was a mixture of: a compound (main product) in which all the alcoholic hydroxyl groups were sulfonic acid-esterified; and a compound (by-product) in which some hydroxyl groups were unreacted.

All the synthesized compounds were measured for an infrared absorption spectrum to confirm that absorption peaks specific for diazo and sulfonic acid ester groups were present at wavenumbers of 2112 to 2119 cm$^{-1}$ and at wavenumbers of 1365 cm$^{-1}$ and 1174 cm$^{-1}$, respectively.

Preparation of Radiation-Sensitive Composition and Interlayer Insulating Film Formation 10 g of the DNQ sulfonic acid ester compound synthesized in the present Example and 1000 g of a siloxane resin (HSG-R7, manufactured by Hitachi Chemical Co., Ltd.) were mixed and stirred to obtain radiation-sensitive compositions (A2 to A22). Interlayer insulating film formation and property evaluations were performed in the same way as in Example 1B. Favorable results applicable to a liquid-crystal display element were obtained. The results are shown, together with the results of Example 1B, in the tables of FIGS. 7 and 8.

Elementary Analysis on Interlayer Insulating Film

The obtained interlayer insulating film was subjected to elementary analysis. The interlayer insulating film was demonstrated to comprise silicon of 35% or higher in terms of a weight ratio and 28% or higher in terms of a molar ratio. It was also demonstrated to comprise 100 ppm sulfur.

Discussion about Siloxane Compound

In these evaluations, favorable properties were obtained using the 35 DNQ sulfonic acid ester compounds synthesized in the present Example, even when a methylsiloxane resin having a number-average molecular weight of 1000, 1500, 5000, or 10000, a phenylmethylsiloxane resin having a number-average molecular weight of 500, 1000, 1500, 2500, or 5000, or a phenylsiloxane resin having a number-average molecular weight of 500, 1000, 1500, 2500, or 5000 were separately used instead of HSG-R7 manufactured by Hitachi Chemical Co., Ltd.

Comparative Example 1B

A compound used in a radiation-sensitive composition for comparison with the present Example was synthesized as follows.

A flask equipped with a condenser and a stirrer was charged with 5 parts by weight of 2,2'-azobis(2,4-dimethylvaleronitrile) and 200 parts by weight of diethylene glycol methyl ethyl ether. Subsequently, the flask was charged with 25 parts by weight of styrene, 20 parts by weight of methacrylic acid, 45 parts by weight of glycidyl methacrylate, and 10 parts by weight of [5.2.1.02,6]decan-8-yl methacrylate (also referred to as "dicyclopentanyl methacrylate" as a trivial name in the art). After nitrogen substitution, gradual stirring was started. The temperature of the solution was raised to 70° C., and this temperature was kept for 5 hours to obtain a polymer solution. The obtained polymer solution had a solid content concentration of 30.6% by weight. This solution is referred to as a "solution (A25)". The polymer prepared here had a weight-average molecular weight of 6000.

The "solution (A25)" (corresponding to 100 parts by weight of the polymer) obtained by the synthesis of the present Comparative Example was mixed with 30 parts by weight of a condensate of 4,4'-[1-[4-[1-[4-hydroxyphenyl]-1-methylethyl]phenyl]ethylidene]bisphenol (1 mol) and 1,2-naphthoquinonediazide-5-sulfonic acid ester (2 mol). The mixture was dissolved at a solid content concentration of 30% by weight in diethylene glycol ethyl methyl ether. Then, the solution was filtered through a membrane filter of 0.2 μm in pore size to obtain a composition (A25) shown in the table of FIG. 8.

A glass substrate was spin-coated with the composition solution thus prepared at a film thickness of 1.2 μm and prebaked on a hot plate at 90° C. for 2.0 minutes to form an applied coating. This applied film was exposed to light using a reduced projection exposure apparatus NSR1755i7A (manufactured by Nikon Corp.; NA=0.50, λ=365 nm) via a predetermined pattern mask. Then, the applied film was subjected to development treatment by an agitation dipping method at 25° C. for 1 minute using 0.4% by weight of an aqueous tetramethylammonium hydroxide solution. This film was rinsed in running water (pure water) and dried to form a pattern thereon. Subsequently, the film was irradiated with a mixture of g, h, and i rays as UV light at a dose of 3000 J/m² using an aligner PLA501F (manufactured by Canon Inc.) and heat-treated (postbaked) in an oven at 220° C. for 60 minutes to form a pattern (interlayer insulating film) at a thickness of 1.0 μm.

The patterned film (interlayer insulating film) formed from the composition was evaluated for the presence or absence of scum generation, solvent resistance, heat resistance, transparency, flattening performance, resolution, and relative permittivity in the same way as in the preceding Examples. The result is shown, together with Examples, in the table of FIG. 8.

Example 3B

In the present Example, sulfonic acid ester compounds comprising the alcohols used in Examples 1B and 2B and 1,2-diazonaphthoquinone-4-sulfonyl chloride (1DNQ4) were synthesized. The sulfonic acid esters of interest were obtained through reaction in the same way as in Example 1B except that the sulfonyl chloride compound was different from that of Example 1B. The structures of these compounds were confirmed by infrared absorption spectrum measurement in the same way as in Example 1B.

Radiation-sensitive compositions were prepared in the same way as in Example 2B using the obtained sulfonic acid esters, i.e., (A31) to (A53) shown in the tables of FIGS. 8 and 9. A patterned film (interlayer insulating film) formed from each composition was evaluated for the presence or absence of scum generation, solvent resistance, heat resistance, transparency, flattening performance, resolution, and relative permittivity in the same way as in the preceding Examples. The result is shown, together with Examples, in the tables of FIGS. 8 and 9.

Example 8B

The present Example relates to the synthesis of DNQ mono- and di-esters of tetrapropylene glycol. Experimental procedures were performed in an environment from which UV light had been removed. In a container equipped with a stirrer, 250 g of tetrapropylene glycol (TEPG) and 3000 g of acetone were placed. 300 g of 1,2-diazonaphthoquinone-5-sulfonyl chloride and 100 g of tributylamine were added thereto under a room temperature condition. Then, the mixture was stirred at room temperature for 4 hours to perform reaction through which sulfonic acid ester was formed from the alcoholic hydroxyl and sulfonyl chloride groups. After reaction, the solution was concentrated to half volume. The concentrate was added into 10 L of water to form a dark red precipitate in an oil state. The precipitate in an oil state was recovered, washed with water, and then vacuum-dried to obtain a 1:1 (molar ratio) mixture (referred to as TEPG-Dm) of tetrapropylene glycol DNQ monoester TEPG-D1 (general formula (11)) and tetrapropylene glycol DNQ diester TEPG-D2 (general formula (12)). The mixing ratio was determined based on the ratio of an elution peak area using refractive index detection in reverse-phase liquid chromatography (eluent: methanol). The general formulas (11) and (12) represent typical structures. Tetrapropylene glycol is found as a mixture of several kinds of isomers. Therefore, the compound TEPG-Dm was actually obtained as a mixture with products derived from isomers represented by the general formulas (17) and (18). In this context, the compounds represented by the general formulas (17) and (18) were separately obtained as a mixture of optical isomers, although they have an asymmetric carbon atom.

[Chemical Formula 24]

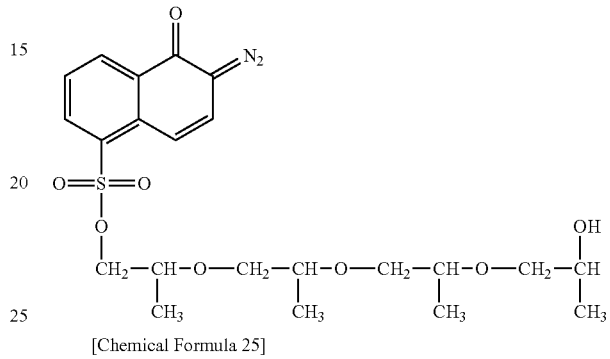

(11)

[Chemical Formula 25]

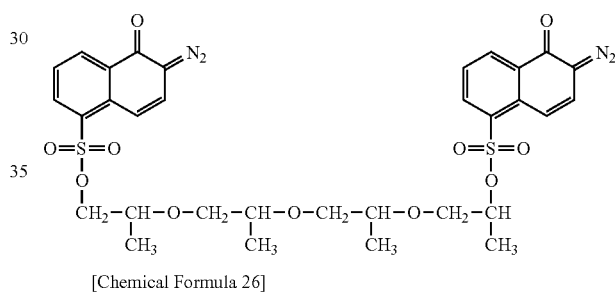

(12)

[Chemical Formula 26]

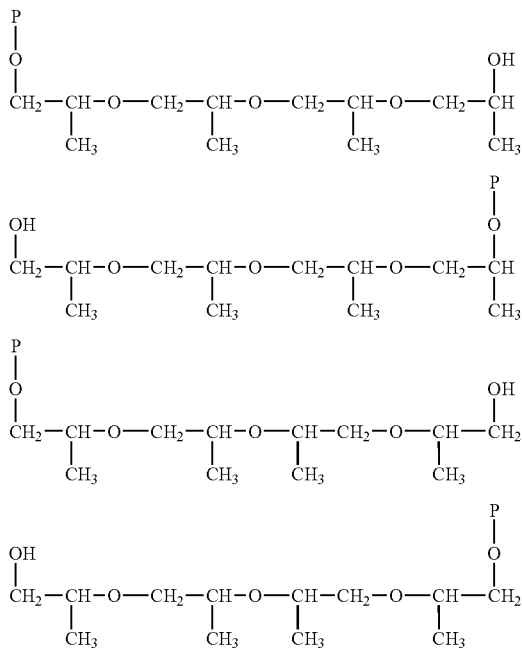

General Formula (17)

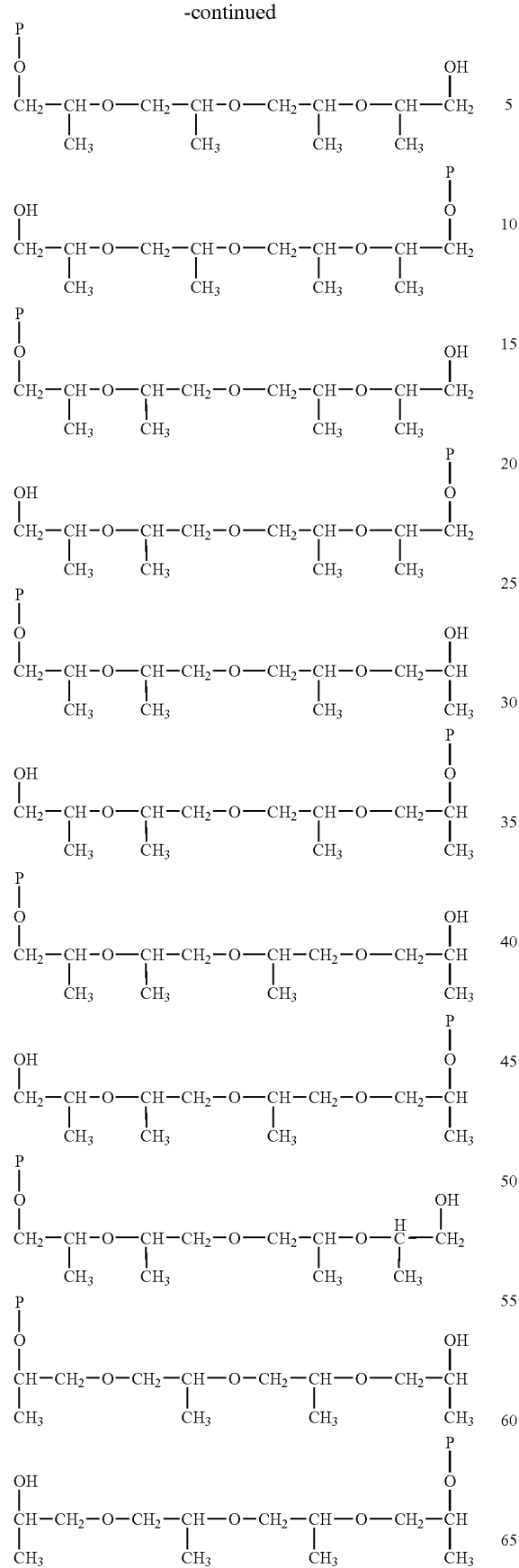
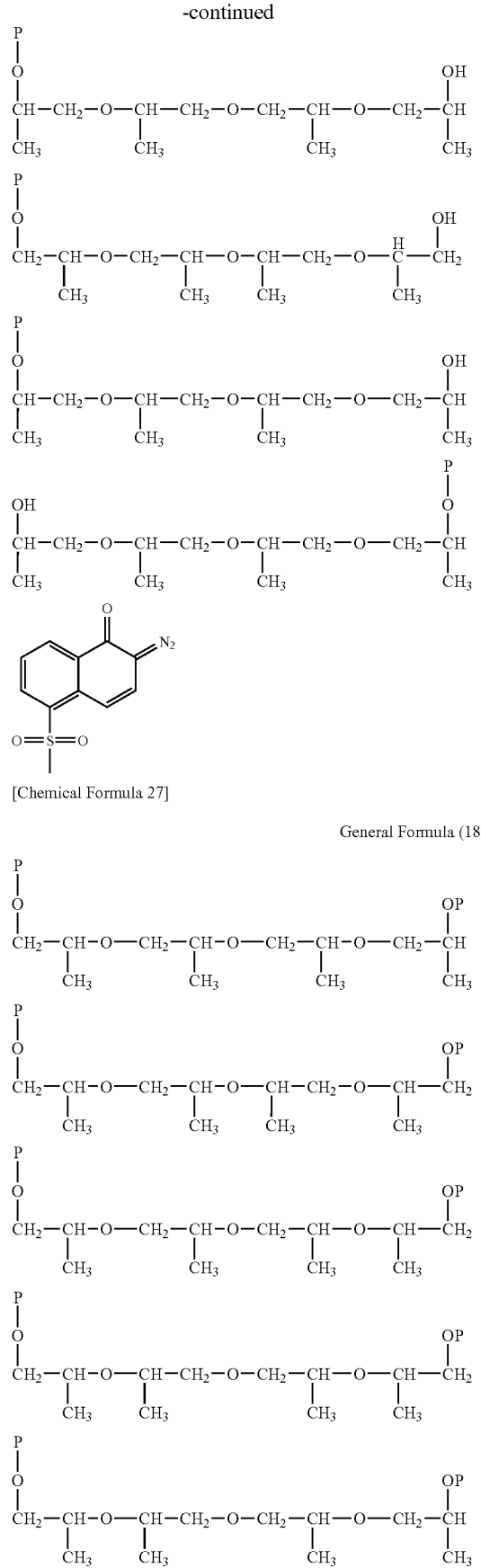

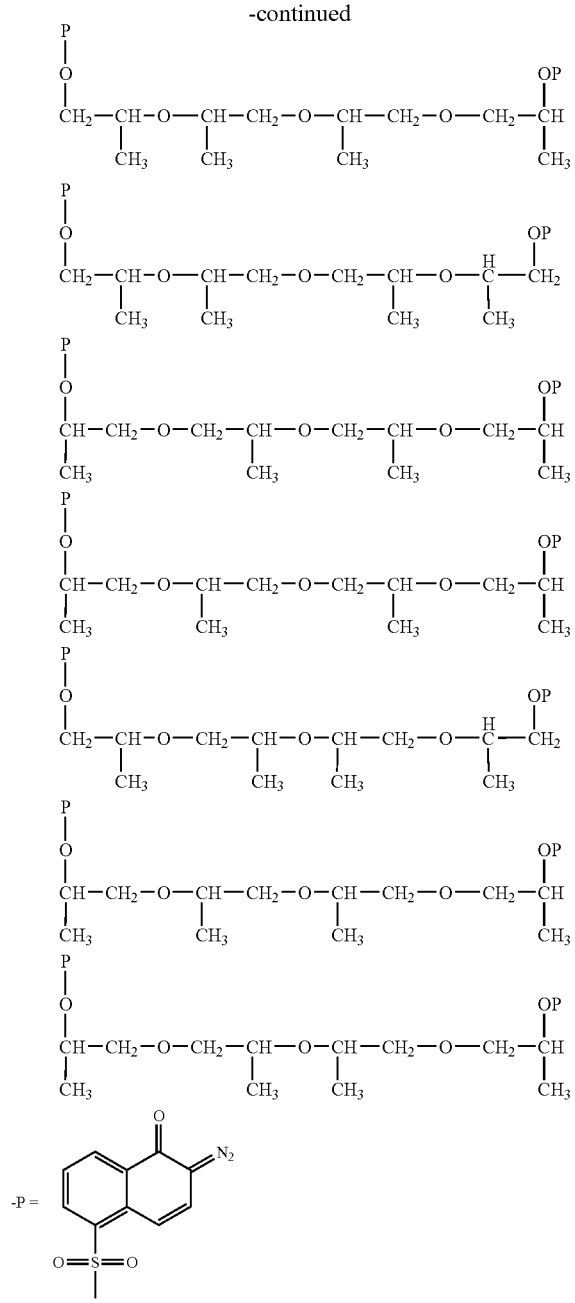

-P =

Figure 10:
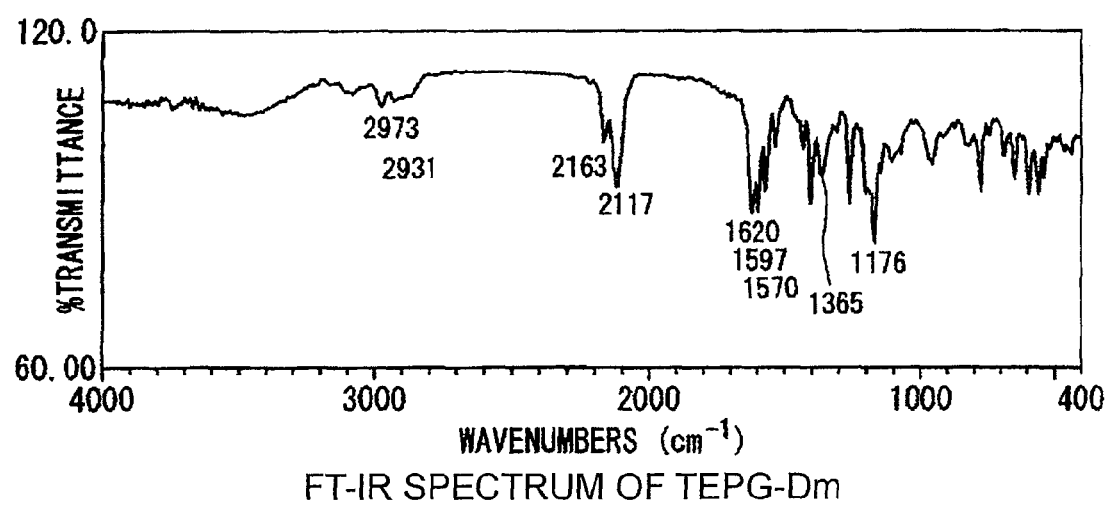
FIG. 10 is an FT-IR spectrum of TEPG-Dm.

FIG. 10 is an infrared absorption spectrum of TEPG-Dm. It was confirmed that absorption peaks specific for diazo and sulfonic acid ester groups were present at wavenumbers of 2163 cm$^{-1}$ and 2117 cm$^{-1}$ and at wavenumbers of 1365 cm$^{-1}$ and 1176 cm$^{-1}$, respectively.

Figure 13:
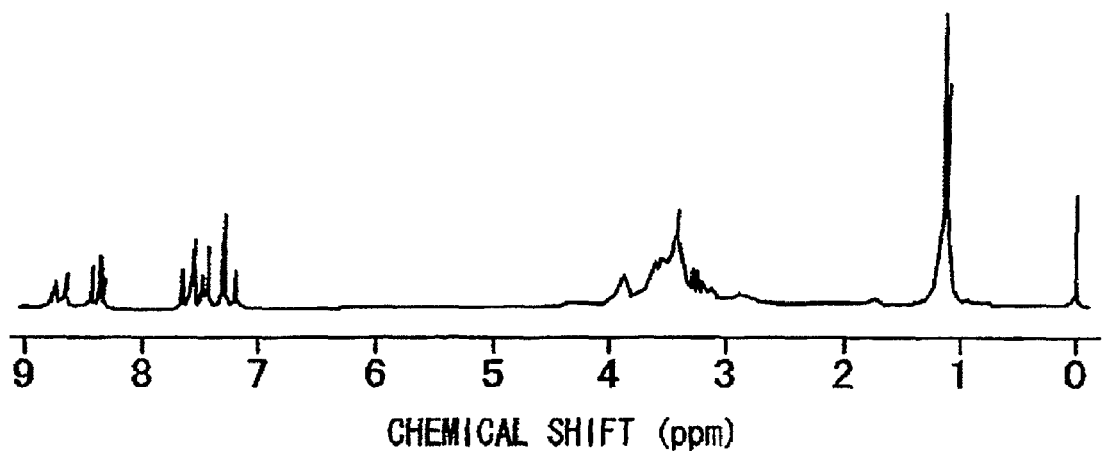
FIG. 13 is a $^1$H-NMR spectrum of TEPG-Dm.

FIG. 13 is a 1H-NMR spectrum of TEPG-Dm. The peak of a methyl group hydrogen atom (12H) was detected at 1.1 to 1.2 ppm; the peak of a hydrogen atom (12H) bonded to a carbon atom adjacent to oxygen in propylene glycol was detected at 3 to 4 ppm; and the peak of a hydrogen atom (7.5H) bonded to an aromatic ring carbon atom in DNQ was detected at 7 to 9 ppm.

Elementary analysis results of TEPG-Dm were 54.10% carbon, 5.33% hydrogen, 7.15% nitrogen, and 8.10% sulfur element in terms of a mass ratio.

The sulfonic acid ester compound of interest was also obtained, even when triethylamine, tripropylamine, pyridine, 2,6-lutidine, sodium hydroxide, sodium carbonate, sodium hydride, and sodium methoxide were separately used instead of tributylamine.

The sulfonic acid ester compound of interest was also obtained, even when ketone solvents (e.g., methyl propyl ketone and methyl isobutyl ketone), ether solvents (e.g., tetrahydrofuran and 1,4-dioxane), ester solvents (e.g., ethyl acetate), chloroform, toluene, and xylene were separately used instead of acetone.

Products arbitrarily differing in the quantitative ratio between TEPG-D1 and TEPG-D2 could be obtained by appropriately changing the quantitative ratio between 1,2-diazonaphthoquinone-5-sulfonyl chloride and amine added in reaction and the reaction time.

Example 9B

The present Example relates to the synthesis of DNQ mono- and di-esters of tripropylene glycol. Experimental procedures were performed in an environment from which UV light had been removed.

In a container equipped with a stirrer, 200 g of tripropylene glycol (TPG) and 2500 g of acetone were placed. 300 g of 1,2-diazonaphthoquinone-5-sulfonyl chloride and 80 g of tributylamine were added thereto under a room temperature condition. Then, the mixture was stirred at room temperature for 2 hours to perform reaction through which sulfonic acid ester was formed from the alcoholic hydroxyl and sulfonyl chloride groups. After reaction, the solution was concentrated to half volume. The concentrate was added into 5 L of water to form a dark red precipitate in an oil state. The precipitate in an oil state was recovered, washed with water, and then vacuum-dried to obtain a 1:1 (molar ratio) mixture (referred to as TPG-Dm) of tripropylene glycol DNQ monoester TPG-D1 (general formula (13)) and tripropylene glycol DNQ diester TPG-D2 (general formula (14)). The mixing ratio was determined based on the ratio of an elution peak area using refractive index detection in reverse-phase liquid chromatography (eluent: methanol). The general formulas (13) and (14) represent typical structures. Tripropylene glycol is found as a mixture of several kinds of isomers. Therefore, the compound TPG-Dm was actually obtained as a mixture with products derived from isomers represented by the general formula (19). In this context, the compounds represented by the general formula (19) were separately obtained as a mixture of optical isomers, although they have an asymmetric carbon atom.

[Chemical Formula 28]

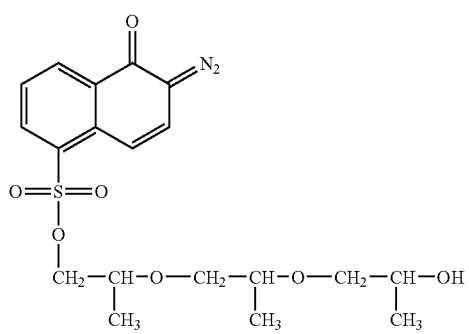

(13)

-continued

[Chemical Formula 29]

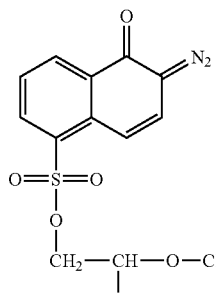

(14)

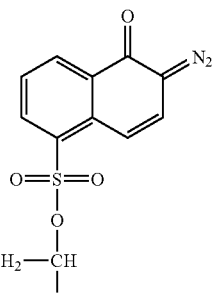

[Chemical Formula 30]

General Formula (19)

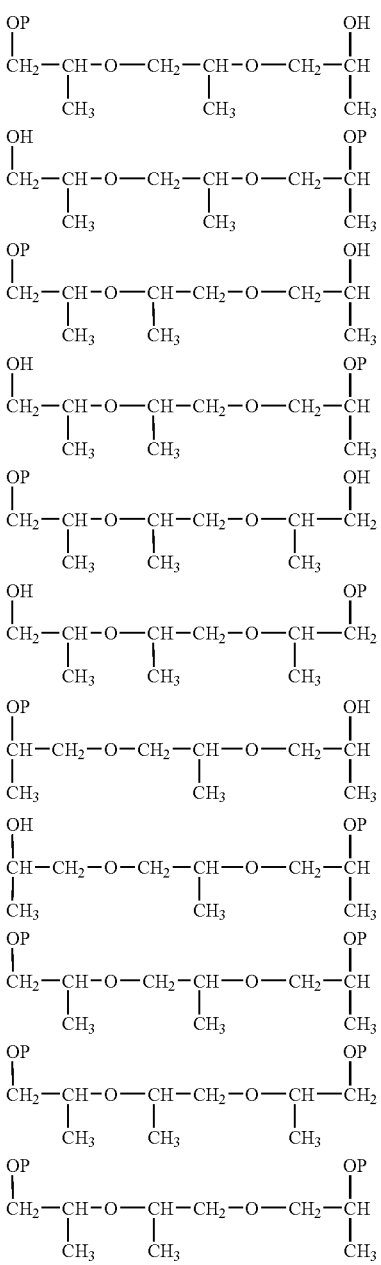

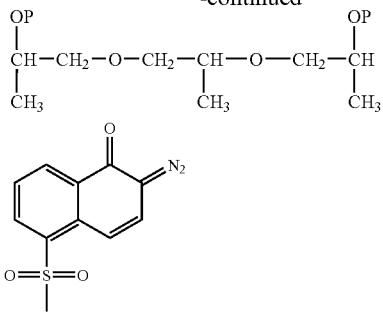

Figure 11:
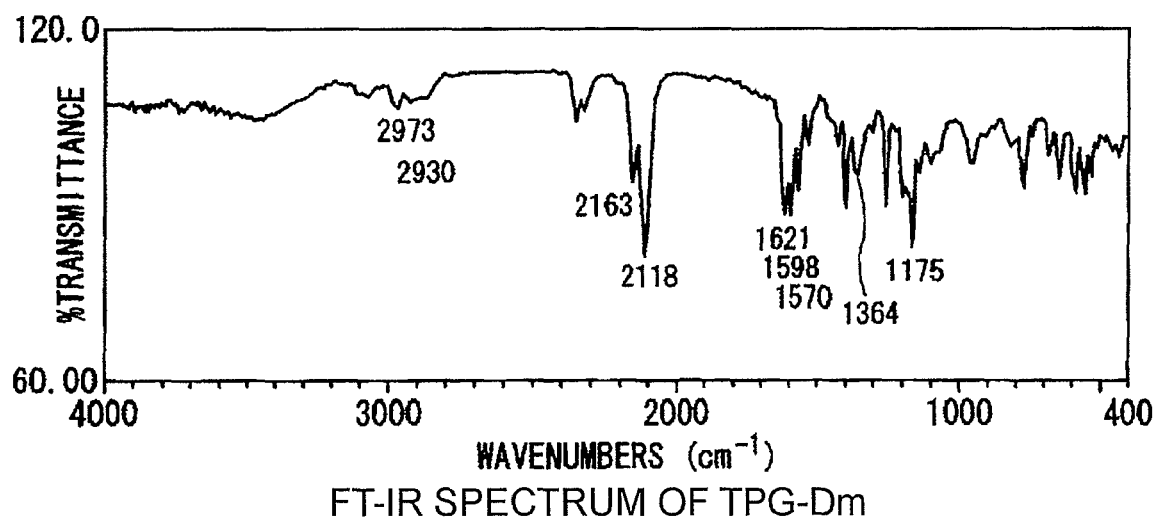
FIG. 11 is an FT-IR spectrum of TPG-Dm.

FIG. 11 is an infrared absorption spectrum of TPG-Dm. It was confirmed that absorption peaks specific for diazo and sulfonic acid ester groups were present at wavenumbers of 2163 cm$^{-1}$ and 2116 cm$^{-1}$ and at wavenumbers of 1364 cm$^{-1}$ and 1175 cm$^{-1}$, respectively.

Figure 14:
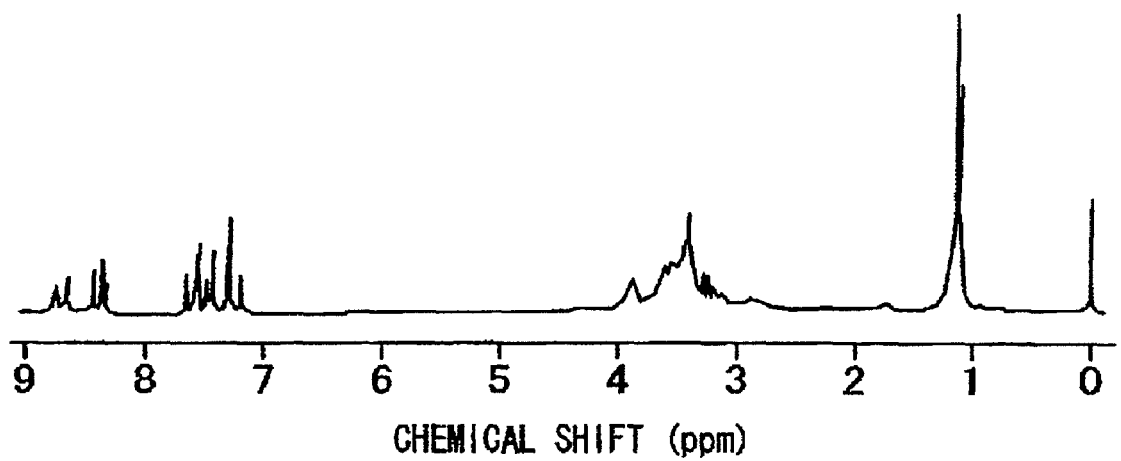
FIG. 14 is a $^1$H-NMR spectrum of TPG-Dm.

FIG. 14 is a 1H-NMR spectrum of TPG-Dm. The peak of a methyl group hydrogen atom (9H) was detected at 1.1 to 1.2 ppm; the peak of a hydrogen atom (9H) bonded to a carbon atom adjacent to oxygen in propylene glycol was detected at 3 to 4 ppm; and the peak of a hydrogen atom (7.5H) bonded to an aromatic ring carbon atom in DNQ was detected at 7 to 9 ppm.

Figure 15:
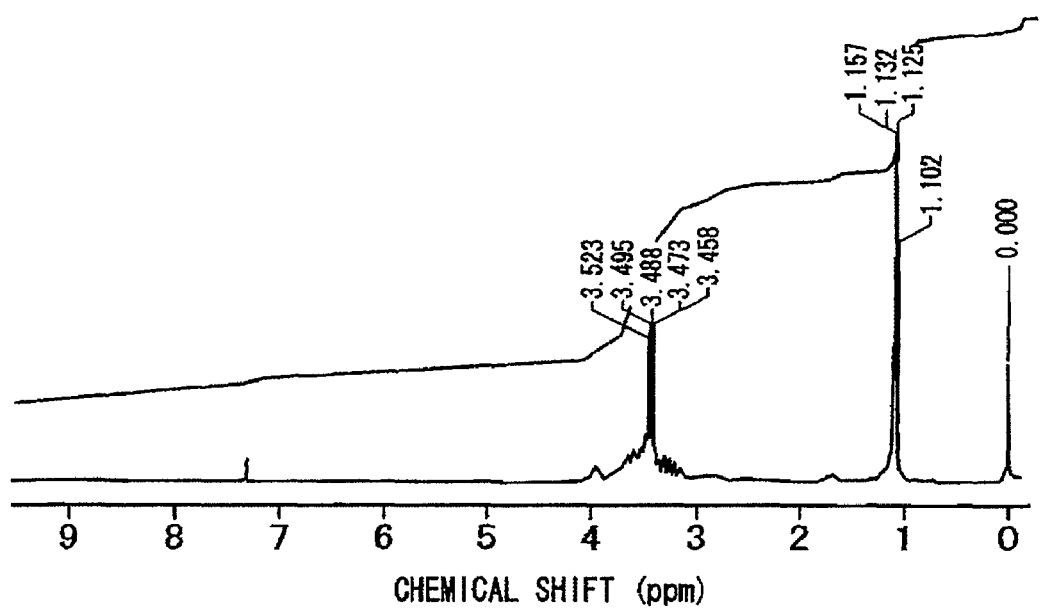
FIG. 15 is a $^1$H-NMR spectrum of TEPG-Dm.

FIG. 15 is a 1H-NMR spectrum of tripropylene glycol. The peak of a methyl group hydrogen atom (9H) was detected at 1.1 to 1.2 ppm; and the peak of a hydrogen atom (9H) bonded to a carbon atom adjacent to oxygen in propylene glycol was detected at 3 to 4 ppm.

Elementary analysis results of TPG-Dm were 53.61% carbon, 4.75% hydrogen, 7.64% nitrogen, and 8.93% sulfur element in terms of a mass ratio.

The sulfonic acid ester compound of interest was also obtained, even when triethylamine, tripropylamine, pyridine, 2,6-lutidine, sodium hydroxide, sodium carbonate, sodium hydride, and sodium methoxide were separately used instead of tributylamine.

The sulfonic acid ester compound of interest was also obtained, even when ketone solvents (e.g., methyl propyl ketone and methyl isobutyl ketone), ether solvents (e.g., tetrahydrofuran and 1,4-dioxane), ester solvents (e.g., ethyl acetate), chloroform, toluene, and xylene were separately used instead of acetone.

Products arbitrarily differing in the quantitative ratio between TPG-D 1 and TPG-D2 could be obtained by appropriately changing the quantitative ratio between 1,2-diazonaphthoquinone-5-sulfonyl chloride and amine added in reaction and the reaction time.

Example 10B

The present Example relates to the synthesis of DNQ mono- and di-esters of dipropylene glycol. Experimental procedures were performed in an environment from which UV light had been removed.

In a container equipped with a stirrer, 200 g of dipropylene glycol (DPG) and 2500 g of acetone were placed. 250 g of 1,2-diazonaphthoquinone-5-sulfonyl chloride and 75 g of tributylamine were added thereto under a room temperature condition. Then, the mixture was stirred at room temperature for 3 hours to perform reaction through which sulfonic acid ester was formed from the alcoholic hydroxyl and sulfonyl chloride groups. After reaction, the solution was concentrated to half volume. The concentrate was added into 6 L of water to form a dark red precipitate in an oil state. The precipitate in an oil state was recovered, washed with water, and then vacuum-dried to obtain a 1:1 (molar ratio) mixture (referred to as DPG-Dm) of dipropylene glycol DNQ monoester DPG-D 1 (general formula (15)) and dipropylene glycol DNQ diester DPG-D2 (general formula (16)). The mixing ratio was determined based on the ratio of an elution peak area using refractive index detection in reverse-phase liquid chromatography (eluent: methanol). The general formulas (15) and (16) represent typical structures. Dipropylene glycol is found as a mixture of several kinds of isomers. Therefore, the compound DPG-Dm was actually obtained as a mixture with products derived from isomers represented by the general formula (70). In this context, the compounds represented by the general formula (70) were separately obtained as a mixture of optical isomers, although they have an asymmetric carbon atom.

[Chemical Formula 31]

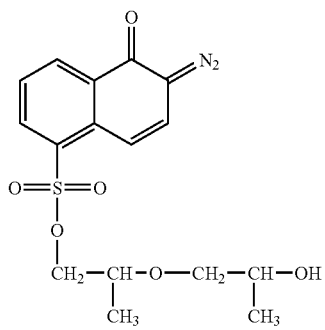

(15)

[Chemical Formula 32]

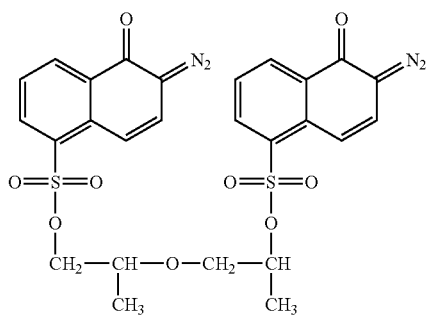

(16)

[Chemical Formula 33]

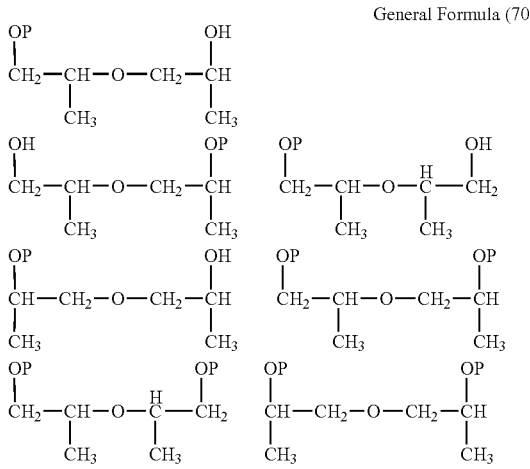

General Formula (70)

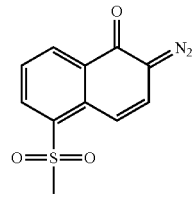

-P =

Figure 12:
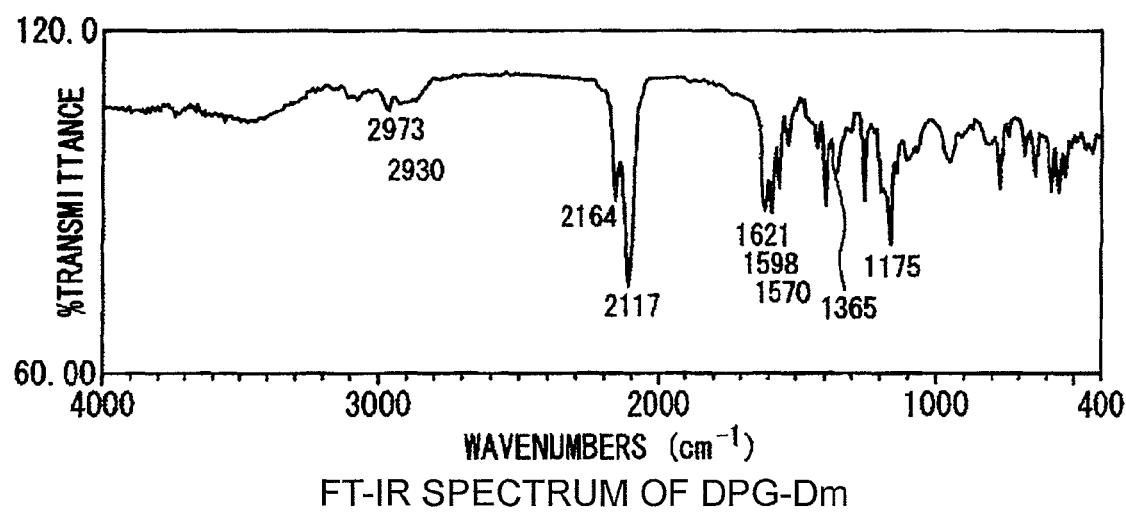
FIG. 12 is an FT-IR spectrum of DPG-Dm.

FIG. 12 is an infrared absorption spectrum of DPG-Dm. It was confirmed that absorption peaks specific for diazo and sulfonic acid ester groups were present at wavenumbers of 2164 cm$^{-1}$ and 2117 cm$^{-1}$ and at wavenumbers of 1365 cm$^{-1}$ and 1175 cm$^{-1}$, respectively.

Figure 16:
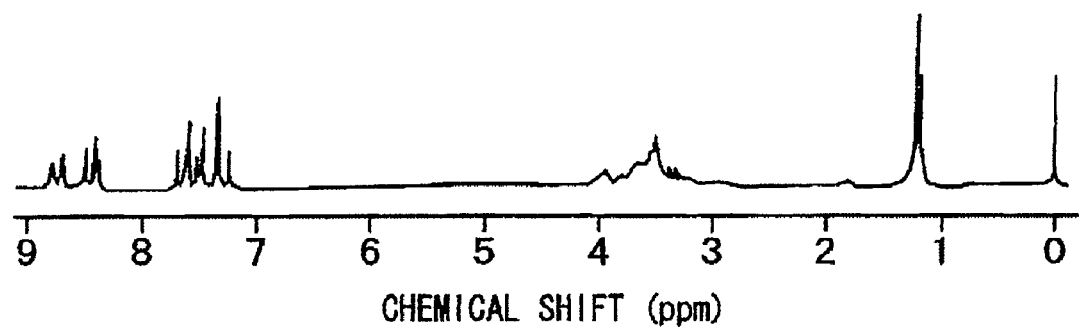
FIG. 16 is a $^1$H-NMR spectrum of DPG.

FIG. 16 is a 1H-NMR spectrum of DPG-Dm. The peak of a methyl group hydrogen atom (6H) was detected at 1.1 to 1.2 ppm; the peak of a hydrogen atom (6H) bonded to a carbon atom adjacent to oxygen in propylene glycol was detected at 3 to 4 ppm; and the peak of a hydrogen atom (7.5H) bonded to an aromatic ring carbon atom in DNQ was detected at 7 to 9 ppm.

Elementary analysis results of DPG-Dm were 52.01% carbon, 4.22% hydrogen, 8.98% nitrogen and 9.83% sulfur element in terms of a mass ratio.

The sulfonic acid ester compound of interest was also obtained, even when triethylamine, tripropylamine, pyridine, 2,6-lutidine, sodium hydroxide, sodium carbonate, sodium hydride, and sodium methoxide were separately used instead of tributylamine.

The sulfonic acid ester compound of interest was also obtained, even when ketone solvents (e.g., methyl propyl ketone and methyl isobutyl ketone), ether solvents (e.g., tetrahydrofuran and 1,4-dioxane), ester solvents (e.g., ethyl acetate), chloroform, toluene, and xylene were separately used instead of acetone.

Products arbitrarily differing in the quantitative ratio between DPG-D1 and DPG-D2 could be obtained by appropriately changing the quantitative ratio between 1,2-diazonaphthoquinone-5-sulfonyl chloride and amine added in reaction and the reaction time.

The invention claimed is:
1. A radiation-sensitive composition comprising
   a component (a): a siloxane resin obtained by hydrolyzing and condensing a silane compound comprising a compound represented by the general formula (1) shown below,
   a component (b): a solvent dissolving the component (a) therein, and
   a component (c): an ester of a quinonediazide sulfonic acid compound and a monohydric or polyhydric alcohol, wherein said monohydric or polyhydric alcohol is not a phenol;

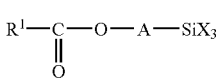

(1)

wherein R$^1$ represents linear, branched or cyclic aliphatic hydrocarbon groups having 1 to 20 carbon atoms; A represents a divalent organic group; and X represents a hydrolyzable group, wherein plural X groups in one molecule may be the same or different.

2. The radiation-sensitive composition according to claim 1, wherein the silane compound further comprises a compound represented by the general formula (2) shown below;

$$R^2SiX_3 \quad (2)$$

wherein $R^2$ represents an organic group; and X represents a hydrolyzable group, wherein plural X groups in one molecule may be the same or different.

3. The radiation-sensitive composition according to claim 1, further comprising
a component (d): a siloxane resin obtained by hydrolyzing and condensing a compound represented by the general formula (3) shown below;

$$R^3{}_nSiX_{4-n} \quad (3)$$

wherein $R^3$ represents a group comprising an atom bonded to the Si atom bonded to X, an H atom, an F atom, or an organic group having 1 to 20 carbon atoms, the atom bonded to the Si atom being selected from the group consisting of B, N, Al, P, Si, Ge, and Ti atoms; X represents a hydrolyzable group; and n represents an integer of 0 to 2, wherein plural X groups in one molecule may be the same or different, and plural $R^3$ moieties in one molecule may be the same or different when n is 2.

4. The radiation-sensitive composition according to claim 1, wherein the component (b) comprises at least one solvent selected from the group consisting of ether acetate solvent, ether solvent, ester solvent, alcohol solvent, and ketone solvent.

5. The radiation-sensitive composition according to claim 1, wherein the polyhydric alcohol is an alcohol selected from the group consisting of ethylene glycol, propylene glycol, and polymers thereof having a degree of polymerization of 2 to 10.

6. The radiation-sensitive composition according to claim 1, wherein the component (c) is 1,2-naphthoquinonediazide sulfonic acid ester.

7. The radiation-sensitive composition according to claim 1, wherein the component (c) is a sulfonic acid ester of a functional group and a monohydric or polyhydric alcohol having 3 to 20 carbon atoms, the functional group being selected from among radiation-sensitive functional groups represented by the general formula (51) shown below:

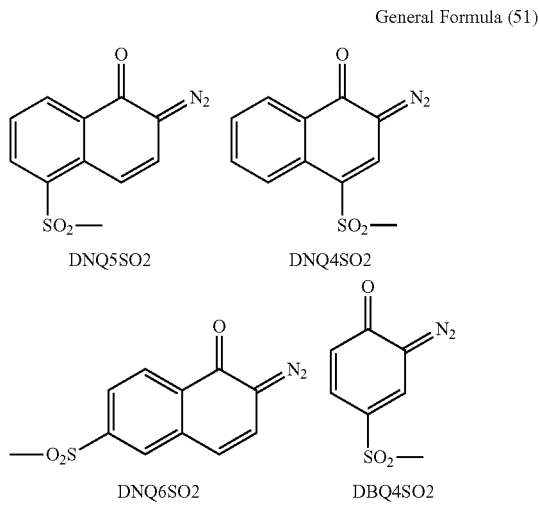

General Formula (51)

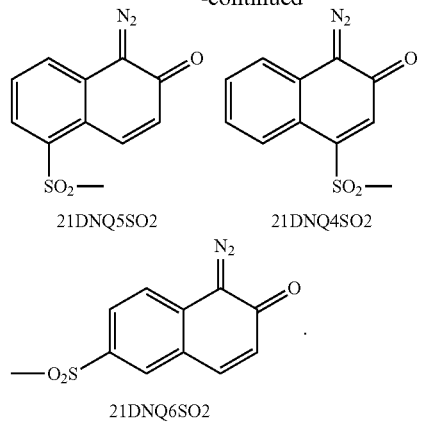

8. The radiation-sensitive composition according to claim 7, wherein the monohydric or polyhydric alcohol is a glycol compound having 3 to 20 carbon atoms.

9. The radiation-sensitive composition according to claim 7, wherein the monohydric or polyhydric alcohol is a compound selected from among compounds represented by the general formula (52) shown below:

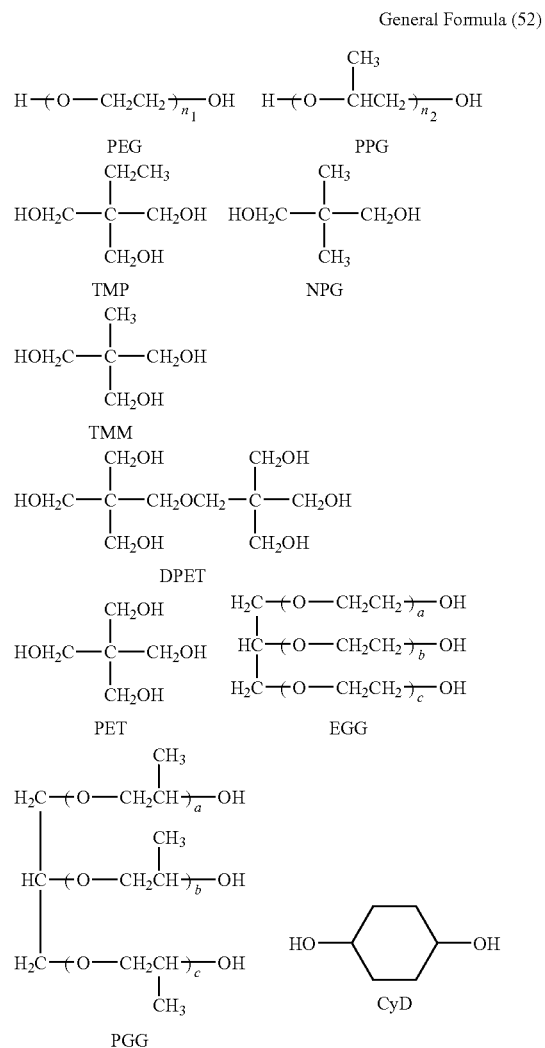

General Formula (52)

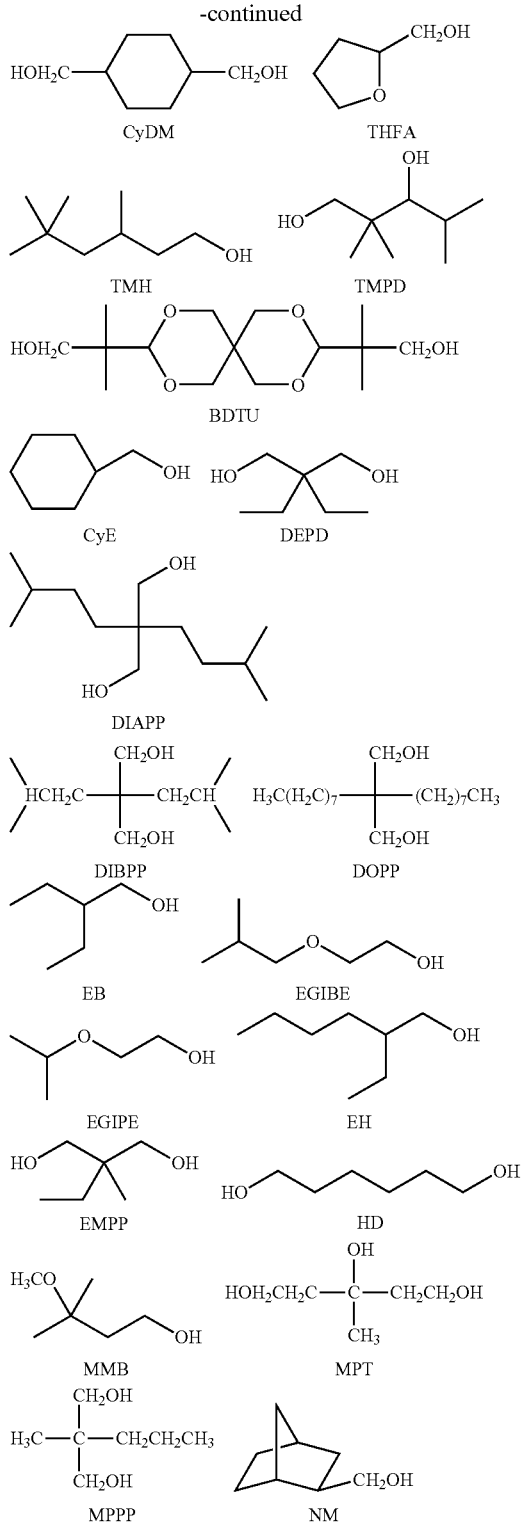

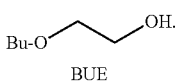

10. The radiation-sensitive composition according to claim 7, wherein the monohydric or polyhydric alcohol is an alcohol selected from the group consisting of ethylene glycol, propylene glycol, and polymers thereof having a degree of polymerization of 2 to 10.

11. A method for forming a silica-based coating, comprising:
   an application step in which a radiation-sensitive composition according to claim 1 is applied onto a substrate and dried to obtain an applied coating;
   a first light exposure step in which a predetermined portion in the applied film is exposed to light;
   a removal step in which the light-exposed predetermined portion in the applied film is removed; and
   a heating step in which the applied film from which the predetermined portion has been removed is heated.

12. The method for forming a silica-based coating according to claim 11, further comprising a second light exposure step in which the applied film from which the predetermined portion has been removed is exposed to light.

13. A silica-based coating which is obtained by a formation method according to claim 11.

14. A semiconductor device comprising: a substrate; and a silica-based coating formed by a formation method according to claim 11 on the substrate.

15. An image display comprising: a substrate; and a silica-based coating formed by a formation method according to claim 11 on the substrate.

16. A member for an electronic device comprising: a substrate; and a silica-based coating formed by a formation method according to claim 11 on the substrate.

17. The radiation-sensitive composition according to claim 1, the radiation-sensitive composition having a property that when the radiation-sensitive composition is exposed to light, a light-exposed portion can be removed during development.

18. The radiation-sensitive composition according to claim 1, the radiation-sensitive composition having a property that when the radiation-sensitive composition is exposed to light, a light-exposed portion can be dissolved in an aqueous alkali solution.

19. The radiation-sensitive composition according to claim 1, the radiation-sensitive composition having a property that when the radiation-sensitive composition is exposed to light, solubility in an aqueous alkali solution differs between a light-exposed and unexposed portions.

20. The radiation-sensitive composition according to claim 1, wherein $R^1$ represents methyl, ethyl, n-propyl, n-butyl, n-pentyl, isopropyl, isobutyl, cyclopentyl, cyclohexyl, cycloheptylene, norbornyl or adamantyl groups.

21. The radiation-sensitive composition according to claim 1, wherein $R^1$ represents a methyl group.

* * * * *